US008856578B2

(12) United States Patent
Itou et al.

(10) Patent No.: US 8,856,578 B2
(45) Date of Patent: Oct. 7, 2014

(54) INTEGRATED CIRCUIT DEVICE INCLUDING SKEW ADJUSTMENT CIRCUIT AND SKEW ADJUSTMENT METHOD

(75) Inventors: Atsushi Itou, Yokohama (JP); Susumu Kojima, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 395 days.

(21) Appl. No.: 13/179,326

(22) Filed: Jul. 8, 2011

(65) Prior Publication Data

US 2012/0044003 A1   Feb. 23, 2012

(30) Foreign Application Priority Data

Aug. 20, 2010   (JP) ................................. 2010-184523
Aug. 20, 2010   (JP) ................................. 2010-184524

(51) Int. Cl.
*H03L 7/18*        (2006.01)
*H04L 25/14*       (2006.01)
*H03L 7/081*       (2006.01)
*H03L 7/08*        (2006.01)
*H03K 5/13*        (2014.01)

(52) U.S. Cl.
CPC .............. *H03L 7/0816* (2013.01); *H03K 5/131* (2013.01); *H04L 25/14* (2013.01); *H03L 7/0805* (2013.01)
USPC .......................................... 713/503; 713/600

(58) Field of Classification Search
CPC ..... H04L 25/14; H03L 7/0805; H03L 7/0816; H03K 5/131
USPC ......................................... 713/500, 503, 600
See application file for complete search history.

(56) References Cited

U.S. PATENT DOCUMENTS 5,991,890 A  *  11/1999  Brown et al. ................. 713/503
6,335,647 B1     1/2002  Nagano
(Continued)

FOREIGN PATENT DOCUMENTS

JP  09-181593 A   7/1997
JP  11-133114 A   5/1999
(Continued)

OTHER PUBLICATIONS

Japanese Office Action mailed Dec. 17, 2013 for corresponding Japanese Application No. 2010-184524, with Partial English-language Translation.

(Continued)

*Primary Examiner* — Mark Connolly
(74) *Attorney, Agent, or Firm* — Fujitsu Patent Center

(57) ABSTRACT

A skew adjustment circuit, provided in an integrated circuit device having a plurality of signal lines transmitting a plurality of signals respectively, and a plurality of buffer circuits to which a plurality of signals transmitted through the signal lines are respectively input, has: a plurality of delay circuits, respectively provided in stages preceding the buffer circuits; a monitoring circuit monitoring changes in the signals of the plurality of signal lines; and a delay adjustment circuit, which decides delay amounts for the plurality of delay circuits based on a monitoring result output of the monitoring circuit, and sets the delay amounts in the plurality of delay circuits. The monitoring circuit detects, as the monitoring result, a number of signal changes in the signal lines in which a signal change occurs in a monitoring period, and the delay adjustment circuit decides the delay amounts based on the number of signal changes.

33 Claims, 56 Drawing Sheets

(56) References Cited

U.S. PATENT DOCUMENTS

| | | | |
|---|---|---|---|
| 6,407,583 B2 * | 6/2002 | Saito | 326/93 |
| 6,934,872 B2 * | 8/2005 | Wong et al. | 713/503 |
| 7,203,611 B2 | 4/2007 | Doi | |
| 7,668,021 B2 | 2/2010 | Yun | |
| 2003/0115493 A1 * | 6/2003 | Wong et al. | 713/322 |
| 2003/0154416 A1 * | 8/2003 | LaBerge | 713/400 |
| 2004/0107060 A1 * | 6/2004 | Wei et al. | 702/79 |

FOREIGN PATENT DOCUMENTS

| | | |
|---|---|---|
| JP | 2000-089409 A | 3/2000 |
| JP | 2002-135234 A | 5/2002 |
| JP | 2002-300021 A | 10/2002 |
| JP | 2004-334271 A | 11/2004 |
| JP | 2006-54731 A | 2/2006 |
| JP | 2007-129601 A | 5/2007 |
| JP | 2007-173893 A | 7/2007 |
| JP | 2009-10914 A | 1/2009 |
| JP | 2009-81588 A | 4/2009 |
| JP | 2010-119077 A | 5/2010 |
| WO | WO-2009/069209 A1 | 6/2009 |

OTHER PUBLICATIONS

Japanese Office Action mailed Jan. 7, 2014 for corresponding Japanese Application No. 2010-184523, with Partial English-language Translation.

* cited by examiner

FIG. 8

ROM/RAM DURING SIMULTANEOUS CHANGE MONITORING

| Address | | | Data | | | | |
|---|---|---|---|---|---|---|---|
| Gr | OPERATION STATE | | NUMBER OF CHANGES | | DELAY CIRCUIT TAP SETTING VALUES | | |
| | | | | | 31-28 | 11-8 | 7-4 | bit3-0 |
| | | | | | Data#7 TAP SETTING VALUE 0x0-0xF | ... | Data#2 TAP SETTING VALUE 0x0-0xF | Data#1 TAP SETTING VALUE 0x0-0xF | Data#0 TAP SETTING VALUE 0x0-0xF |
| xx | WHEN UNUSED | 00 | 0 to 2 | | | | |
| | Slow | 01 | 3 to 5 | | | | |
| | Typical | 10 | 6 to 8 | | | | |
| | Fast | 11 | 9 OR MORE | | | | |

FIG. 9

DELAY AMOUNT ROM/RAM

| Address | | DATA : TAP SETTING VALUES (DELAY AMOUNTS) | | | | | | |
|---|---|---|---|---|---|---|---|---|
| Gr | NUMBER OF CHANGES | Data#7 bit31-28 | ... | Data#3 bit15-12 | Data#2 bit11-8 | Data#1 bit7-4 | Data#0 bit3-0 |
| 0 | 0 to 2 | 0x0 | ... | 0x0 | 0x0 | 0x0 | 0x0 |
| 0 | 3 to 5 | 0x4 | ... | 0x4 | 0x0 | 0x4 | 0x0 |
| 0 | 6 to 8 | 0x6 | ... | 0x6 | 0x4 | 0x2 | 0x0 |
| 1 | 0 to 2 | 0x0 | ... | 0x0 | 0x0 | 0x0 | 0x0 |
| 1 | 3 to 5 | 0x4 | ... | 0x4 | 0x0 | 0x4 | 0x0 |
| 1 | 6 to 8 | 0x6 | ... | 0x6 | 0x4 | 0x2 | 0x0 |
| x | 0 to 2 | 0x0 | ... | 0x0 | 0x0 | 0x0 | 0x0 |
| x | 3 to 5 | 0x4 | ... | 0x4 | 0x0 | 0x4 | 0x0 |
| x | 6 to 8 | 0x6 | ... | 0x6 | 0x4 | 0x2 | 0x0 |

Gr: GROUP OF SIGNALS IN SIMULTANEOUS OPERATION
NUMBER OF CHANGES: NUMBER OF SIMULTANEOUS CHANGES IN GROUP
bitx: DELAY CIRCUIT TAP SETTING VALUE (DELAY AMOUNT)

FIG. 10
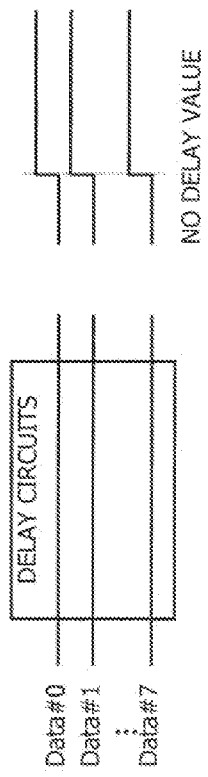
(1) WHEN NUMBER OF CHANGES IS 0-2
NO DELAY VALUE
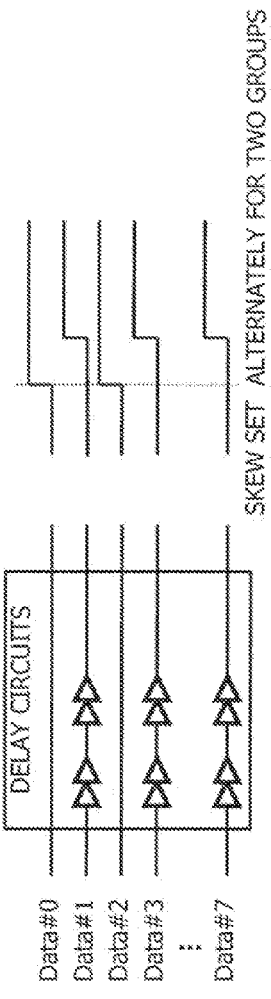
(2) WHEN NUMBER OF CHANGES IS 3-5
SKEW SET ALTERNATELY FOR TWO GROUPS
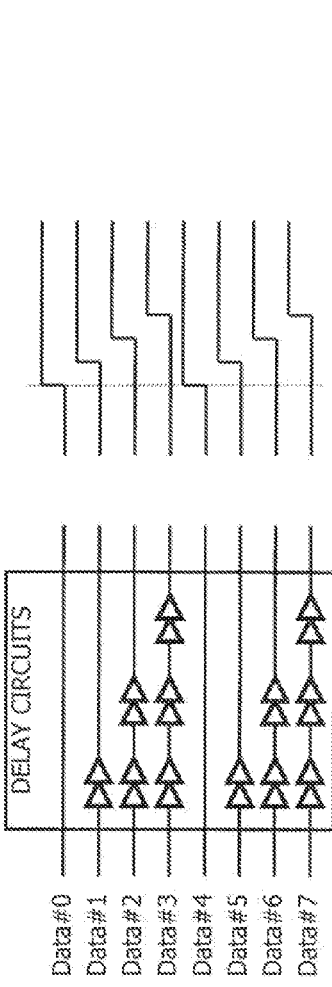
(3) WHEN NUMBER OF CHANGES IS 6-8
SKEW SET ALTERNATELY FOR FOUR GROUPS

FIG. 14

DELAY AMOUNT ROM/RAM

| Address | | | Data : TAP SETTING VALUES (DELAY AMOUNTS) | | | | |
|---|---|---|---|---|---|---|---|
| OPERATION STATE | Gr | NUMBER OF CHANGES | Data#7 bit31-28 | ... | Data#3 bit15-12 | Data#2 bit11-8 | Data#1 bit7-4 | Data#0 bit3-0 |
| Fast | x | 0 to 2 | 0x0 | ... | 0x0 | 0x0 | 0x0 | 0x0 |
| Fast | x | 3 to 5 | 0x8 | ... | 0x8 | 0x8 | 0x8 | 0x0 |
| Fast | x | 6 to 8 | 0xA | ... | 0xA | 0x8 | 0x4 | 0x0 |
| Typical | x | 0 to 2 | 0x0 | ... | 0x0 | 0x0 | 0x0 | 0x0 |
| Typical | x | 3 to 5 | 0x6 | ... | 0x6 | 0x6 | 0x6 | 0x0 |
| Typical | x | 6 to 8 | 0x9 | ... | 0x9 | 0x6 | 0x3 | 0x0 |
| Slow | x | 0 to 2 | 0x0 | ... | 0x0 | 0x0 | 0x0 | 0x0 |
| Slow | x | 3 to 5 | 0x4 | ... | 0x4 | 0x0 | 0x4 | 0x0 |
| Slow | x | 6 to 8 | 0x6 | ... | 0x6 | 0x4 | 0x2 | 0x0 |

OPERATION STATES : Fast, Typical, Slow
Gr : GROUP OF SIGNALS IN SIMULTANEOUS OPERATION
NUMBER OF CHANGES : NUMBER OF SIMULTANEOUS CHANGES IN GROUP
bitx : DELAY CIRCUIT TAP SETTING VALUE (DELAY AMOUNT)

FIG. 20

ROM/RAM DURING RISE/FALL CHANGE MONITORING

| Address | | Data | | | | | |
|---|---|---|---|---|---|---|---|
| Gr | Comparison Result | Number of Changes | DELAY CIRCUIT TAP SETTING VALUE | | | | |
| | | | 31-28 | ... | 11-8 | 7-4 | bit3-0 |
| | | | Data#7 TAP SETTING VALUE | | Data#2 TAP SETTING VALUE | Data#1 TAP SETTING VALUE | Data#0 TAP SETTING VALUE |
| xx | 00 WHEN UNUSED | 00 0 to 2 | 0x0-0xF | | 0x0-0xF | 0x0-0xF | 0x0-0xF |
| | 01 — | 01 3 to 5 | | | | | |
| | 10 Fall | 10 6 to 8 | | | | | |
| | 11 Rise | 11 9 OR MORE | | | | | |

FIG. 21

DELAY AMOUNT ROM/RAM

| Address | | | Data : TAP SETTING VALUES (DELAY AMOUNTS) | | | | | |
|---|---|---|---|---|---|---|---|---|
| Gr | COMPARISON RESULT | NUMBER OF CHANGES | Data#7 bit31-28 | ... | Data#3 bit15-12 | Data#2 bit11-8 | Data#1 bit7-4 | Data#0 bit3-0 |
| 0 | Rise | 0 to 2 | 0x0 | ... | 0x0 | 0x0 | 0x0 | 0x0 |
| 0 | Rise | 3 to 5 | 0x4 | ... | 0x4 | 0x0 | 0x4 | 0x0 |
| 0 | Rise | 6 to 8 | 0x6 | ... | 0x6 | 0x4 | 0x2 | 0x0 |
| 0 | Fall | 0 to 2 | 0x0 | ... | 0x0 | 0x0 | 0x0 | 0x0 |
| 0 | Fall | 3 to 5 | 0x4 | ... | 0x4 | 0x0 | 0x4 | 0x0 |
| 0 | Fall | 6 to 8 | 0x6 | ... | 0x6 | 0x4 | 0x2 | 0x0 |
| x | Rise | 0 to 2 | 0x0 | ... | 0x0 | 0x0 | 0x0 | 0x0 |
| x | Rise | 3 to 5 | 0x4 | ... | 0x4 | 0x0 | 0x4 | 0x0 |
| x | Rise | 6 to 8 | 0x6 | ... | 0x6 | 0x4 | 0x2 | 0x0 |
| x | Fall | 0 to 2 | 0x0 | ... | 0x0 | 0x0 | 0x0 | 0x0 |
| x | Fall | 3 to 5 | 0x4 | ... | 0x4 | 0x0 | 0x4 | 0x0 |
| x | Fall | 6 to 8 | 0x6 | ... | 0x6 | 0x4 | 0x2 | 0x0 |

Gr : GROUP OF SIGNALS IN SIMULTANEOUS OPERATION
COMPARISON RESULT : RISE/FALL CHANGE NUMBER COMPARISON RESULT (1:RISE)
NUMBER OF CHANGES : NUMBER OF SIMULTANEOUS CHANGES IN GROUP
bit x : DELAY CIRCUIT TAP SETTING VALUE (DELAY AMOUNT)

FIG. 23

DELAY AMOUNT ROM/RAM

| Address | | | | Data : TAP SETTING VALUES (DELAY AMOUNTS) | | | | | |
|---|---|---|---|---|---|---|---|---|---|
| OPERATION STATE | COMPARISON RESULT | Gr | NUMBER OF CHANGES | Data#7 bit31-28 | ... | Data#3 bit15-12 | Data#2 bit11-8 | Data#1 bit7-4 | Data#0 bit3-0 |
| Fast | Rise | x | 0 to 2 | 0x0 | ... | 0x0 | 0x0 | 0x0 | 0x0 |
| Fast | Rise | x | 3 to 5 | 0x8 | ... | 0x8 | 0x0 | 0x8 | 0x0 |
| Fast | Rise | x | 6 to 8 | 0xA | ... | 0xA | 0x8 | 0x4 | 0x0 |
| Fast | Fall | x | 0 to 2 | 0x0 | ... | 0x0 | 0x0 | 0x0 | 0x0 |
| Fast | Fall | x | 3 to 5 | 0x8 | ... | 0x8 | 0x8 | 0x8 | 0x0 |
| Fast | Fall | x | 6 to 8 | 0xA | ... | 0xA | 0x8 | 0x4 | 0x0 |
| Typical | Rise | x | 0 to 2 | 0x0 | ... | 0x0 | 0x0 | 0x0 | 0x0 |
| Typical | Rise | x | 3 to 5 | 0x6 | ... | 0x6 | 0x6 | 0x6 | 0x0 |
| Typical | Rise | x | 6 to 8 | 0x9 | ... | 0x9 | 0x6 | 0x3 | 0x0 |
| Typical | Fall | x | 0 to 2 | 0x0 | ... | 0x0 | 0x0 | 0x0 | 0x0 |
| Typical | Fall | x | 3 to 5 | 0x6 | ... | 0x6 | 0x6 | 0x6 | 0x0 |
| Typical | Fall | x | 6 to 8 | 0x9 | ... | 0x9 | 0x6 | 0x3 | 0x0 |
| Slow | Rise | x | 0 to 2 | 0x0 | ... | 0x0 | 0x0 | 0x0 | 0x0 |
| Slow | Rise | x | 3 to 5 | 0x4 | ... | 0x4 | 0x4 | 0x4 | 0x0 |
| Slow | Rise | x | 6 to 8 | 0x6 | ... | 0x6 | 0x4 | 0x2 | 0x0 |
| Slow | Fall | x | 0 to 2 | 0x0 | ... | 0x0 | 0x0 | 0x0 | 0x0 |
| Slow | Fall | x | 3 to 5 | 0x4 | ... | 0x4 | 0x4 | 0x4 | 0x0 |
| Slow | Fall | x | 6 to 8 | 0x6 | ... | 0x6 | 0x4 | 0x2 | 0x0 |

OPERATION STATE : Fast, Typical, Slow
COMPARISON RESULT : RISE/FALL CHANGE NUMBER COMPARISON RESULT (1:RISE)
Gr : GROUP OF SIGNALS IN SIMULTANEOUS OPERATION
NUMBER OF CHANGES : NUMBER OF SIMULTANEOUS CHANGES IN GROUP
bitx : DELAY CIRCUIT TAP SETTING VALUE (DELAY AMOUNT)

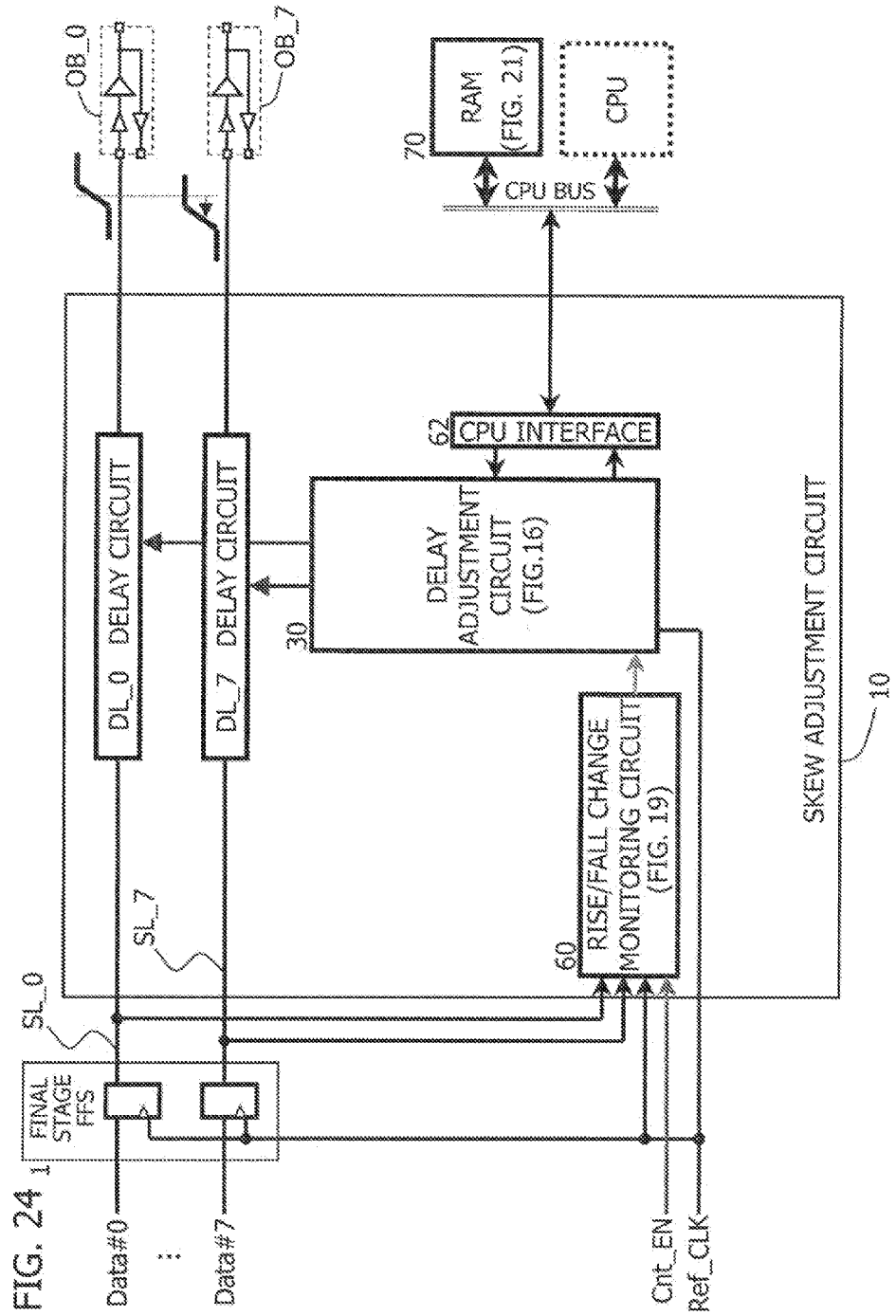

FIG. 30

45. EXAMPLE OF TARGET SKEW VALUE ROM STRUCTURE

| Address | | Data | | | | | |
|---|---|---|---|---|---|---|---|
| Gr | SIGNAL COMBINATION | bitn: n | ... | bit3: d | bit2: c | bit1: b | bit0: a |
| 0 | Data_A-Data_B | 1 | ... | 1 | 1 | 1 | 0 |
| 1 | Data_A-Data_B | 1 | ... | 1 | 1 | 0 | 0 |
| → | → | | | | | | |
| x | Data_A-Data_B | 1 | ... | 1 | 1 | 1 | 0 |

Gr: GROUP OF SIGNALS IN SIMULTANEOUS OPERATION

SIGNAL COMBINATION: COMBINATION OF MEASURED SIGNALS IN GROUP bitx(y): ALLOWED DELAY (TAP) INSERTION IN NUMBER OF "0"S

EXAMPLE OF TARGET SKEW VALUE ROM STRUCTURE

| OPERATION STATE | Address | | Data | | | | | |
|---|---|---|---|---|---|---|---|---|
| | Gr | SIGNAL COMBINATION | bitm:n | ... | bit3:d | bit2:c | bit1:b | bit0:a |
| Fast | 0 | Data_A-Data_B | 1 | | 1 | 1 | 0 | 0 |
| Fast | 1 | Data_A-Data_B | 1 | | 1 | 0 | 0 | 0 |
| ↓ | ↓ | ↓ | | | | | | |
| Fast | x | Data_A-Data_B | 1 | | 1 | 1 | 0 | 0 |
| Typical | 0 | Data_A-Data_B | 1 | | 1 | 1 | 1 | 0 |
| Typical | 1 | Data_A-Data_B | 1 | | 1 | 1 | 0 | 0 |
| ↓ | ↓ | ↓ | | | | | | |
| Typical | x | Data_A-Data_B | 1 | | 1 | 1 | 1 | 0 |
| Slow | 0 | Data_A-Data_B | 1 | | 1 | 1 | 1 | 1 |
| Slow | 1 | Data_A-Data_B | 1 | | 1 | 1 | 1 | 0 |
| ↓ | ↓ | ↓ | | | | | | |
| Slow | x | Data_A-Data_B | 1 | | 1 | 1 | 1 | 1 |

OPERATION STATE: Fast, Typical, Slow

Gr: GROUP OF SIGNALS IN SIMULTANEOUS OPERATION

SIGNAL COMBINATION: COMBINATION OF MEASURED SIGNALS IN GROUP bitx(y): ALLOWED DELAY (TAP) INSERTION IN NUMBER OF "0"S

FIG. 38

FIG. 41 EXAMPLE OF MEMORY STRUCTURE

Gr: GROUP OF SIGNALS IN SIMULTANEOUS OPERATION
JUDGMENT MODE: NUMBER OF SKEW MEASUREMENT JUDGMENTS
MEASURED SKEW: SKEW MEASUREMENT RESULT
SETTING SIGNAL: TARGET SKEW SETTING SIGNAL
bitx: DELAY (TAP) SETTING VALUE

FIG. 45        EXAMPLE OF MEMORY STRUCTURE

| Address | | | | | DATA: DELAY SETTING VALUES | | | |
|---|---|---|---|---|---|---|---|---|
| OPERATION STATE | JUDGMENT MODE | SIGNAL COMBINATION | MEASURED SKEW | SETTING SIGNAL | bit3 | bit2 | bit1 | bit0 |
| Slow | 1st | Data_A-Data_B | 1000 | Data_A | 0 | 0 | 0 | 0 |
| Slow | 1st | Data_A-Data_B | | Data_B | 0 | 0 | 0 | 1 |
| Slow | 1st | Data_A-Data_B | 1110 | Data_A | 0 | 0 | 0 | 1 |
| Slow | 1st | Data_A-Data_B | | Data_B | 0 | 0 | 0 | 0 |
| Slow | 2nd | Data_A-Data_B | 1000 | Data_A | 0 | 0 | 0 | 1 |
| Slow | 2nd | Data_A-Data_B | | Data_B | 0 | 0 | 0 | 0 |
| Slow | 2nd | Data_A-Data_B | 1111 | Data_A | 0 | 0 | 0 | 0 |
| Slow | 2nd | Data_A-Data_B | | Data_B | 0 | 0 | 1 | 0 |
| Typical | 1st | Data_A-Data_B | 1000 | Data_A | 0 | 0 | 0 | 0 |
| Typical | 1st | Data_A-Data_B | 1000 | Data_B | 0 | 0 | 1 | 1 |
| Typical | 2nd | Data_A-Data_B | 1111 | Data_A | 0 | 1 | 0 | 0 |
| Typical | 2nd | Data_A-Data_B | 1111 | Data_B | 0 | 1 | 0 | 0 |
| Fast | 1st | Data_A-Data_B | 1000 | Data_A | 0 | 0 | 0 | 0 |
| Fast | 1st | Data_A-Data_B | 1000 | Data_B | 0 | 0 | 1 | 0 |
| Fast | 2nd | Data_A-Data_B | 1111 | Data_A | 0 | 0 | 0 | 0 |
| Fast | 2nd | Data_A-Data_B | 1111 | Data_B | 0 | 1 | 1 | 0 |

OPERATION STATE: Fast, Typical, Slow
JUDGMENT MODE: NUMBER OF SKEW MEASUREMENT JUDGMENTS
SETTING SIGNAL: TARGET SKEW SETTING SIGNAL
Gr: GROUP OF SIGNALS IN SIMULTANEOUS OPERATION
MEASUREMENT RESULT: SKEW MEASUREMENT RESULT
bitx: DELAY (TAP) SETTING VALUE EXAMPLE:
FOR A "Slow" TAP SETTING,
"Typical" IS 2 TIMES GREATER,
"Fast" IS 3 TIMES GREATER, ETC.

FIG. 47

EXAMPLE OF TARGET SKEW VALUE ROM STRUCTURE

| Address | | Data | | | | | |
|---|---|---|---|---|---|---|---|
| Gr | LATEST | SIGNAL COMBINATION | bitn: n | ... | bit3: d | bit2: c | bit1: b | bit0: a |
| 0 | A | Data_A-Data_B | 1 | ... | 1 | 1 | 1 | 0 |
| 0 | A | Data_A-Data_C | 1 | ... | 1 | 1 | 0 | 0 |
| 0 | A | Data_A-Data_D | 1 | ... | 1 | 0 | 0 | 0 |
| x | A | Data_A-Data_B | 1 | ... | 1 | 1 | 0 | 0 |
| x | A | Data_A-Data_C | 1 | ... | 1 | 0 | 0 | 0 |
| x | A | Data_A-Data_D | 1 | ... | 0 | 0 | 0 | 0 |

Gr: GROUP OF SIGNALS IN SIMULTANEOUS OPERATION
SIGNAL COMBINATION: COMBINATION OF MEASURED SIGNALS IN GROUP
bitx(y): ALLOWED DELAY (TAP) INSERTION IN NUMBER OF "0"S
LATEST: SIGNAL DETECTED AS LATEST FROM MEASURED SKEW
(EARLIEST SIGNAL WITH TARGET SKEW)

FIG. 48

FROM SKEW MEASUREMENT RESULTS FOR FOUR SIGNALS AND THE JUDGMENT MODE,
THE LATEST SIGNAL CAN BE DETERMINED AS FOLLOWS

| Data_A-Data_B | Data_A-Data_C | Data_A-Data_D | NOTES |
|---|---|---|---|
| 1st A>B | 1st A>C | 1st A>D | Data_A IS LATEST (a) |
| 1st A>B | 1st A>C | 2nd D>A | Data_D IS LATEST (b) |
| 1st A>B | 2nd C>A | 1st A>D | Data_C IS LATEST |
| 1st A>B | 2nd C>A | 2nd D>A | Data_B IS EARLIEST |
| 2nd B>A | 1st A>C | 1st A>D | Data_B IS LATEST |
| 2nd B>A | 1st A>C | 2nd D>A | Data_C IS LATEST |
| 2nd B>A | 2nd C>A | 1st A>D | Data_D IS EARLIEST (d) |
| 2nd B>A | 2nd C>A | 2nd D>A | Data_A IS EARLIEST (c) |

FROM THE JUDGMENT MODE AND SKEW MEASUREMENT RESULTS, THE 24 POSSIBLE ORDERS OF 4 SIGNALS CAN BE DETERMINED. (PART OF THIS REASONING (FOR 16 CASES) IS INDICATED BELOW)

(a) 1st-1st-1st: CASE WHERE A IS LATEST
COMPARISON OF NUMBER OF "0"'S IN MEASUREMENT RESULTS AB, AC, AD

AB>AC>AD : Data_A>Data_B>Data_C>Data_D
AB>AD>AC : Data_A>Data_B>Data_D>Data_C
AC>AB>AD : Data_A>Data_C>Data_B>Data_D
AC>AD>AB : Data_A>Data_C>Data_D>Data_B
AD>AB>AC : Data_A>Data_D>Data_B>Data_C
AD>AC>AB : Data_A>Data_D>Data_C>Data_B (b) 1st-1st-2nd: CASE WHERE D IS LATEST
COMPARISON OF NUMBER OF "0"'S IN MEASUREMENT RESULTS AB, AC AB>AC : Data_D>Data_A>Data_C>Data_B
AC>AB : Data_D>Data_A>Data_B>Data_C (c) 2nd-2nd-2nd: CASE WHERE B, C, D ARE LATEST
COMPARISON OF NUMBER OF "0"'S IN MEASUREMENT RESULTS AB, AC, AD AB>AC>AD : Data_D>Data_C>Data_B>Data_A
AB>AD>AC : Data_C>Data_D>Data_B>Data_A
AC>AB>AD : Data_D>Data_B>Data_C>Data_A
AC>AD>AB : Data_B>Data_D>Data_C>Data_A
AD>AB>AC : Data_C>Data_B>Data_D>Data_A
AD>AC>AB : Data_B>Data_C>Data_D>Data_A (d) 2nd-2nd-1st: CASE WHERE C, B ARE LATEST
COMPARISON OF NUMBER OF "0"'S IN MEASUREMENT RESULTS AB, AC AB>AC : Data_C>Data_B>Data_A>Data_D
AC>AB : Data_B>Data_C>Data_A>Data_D

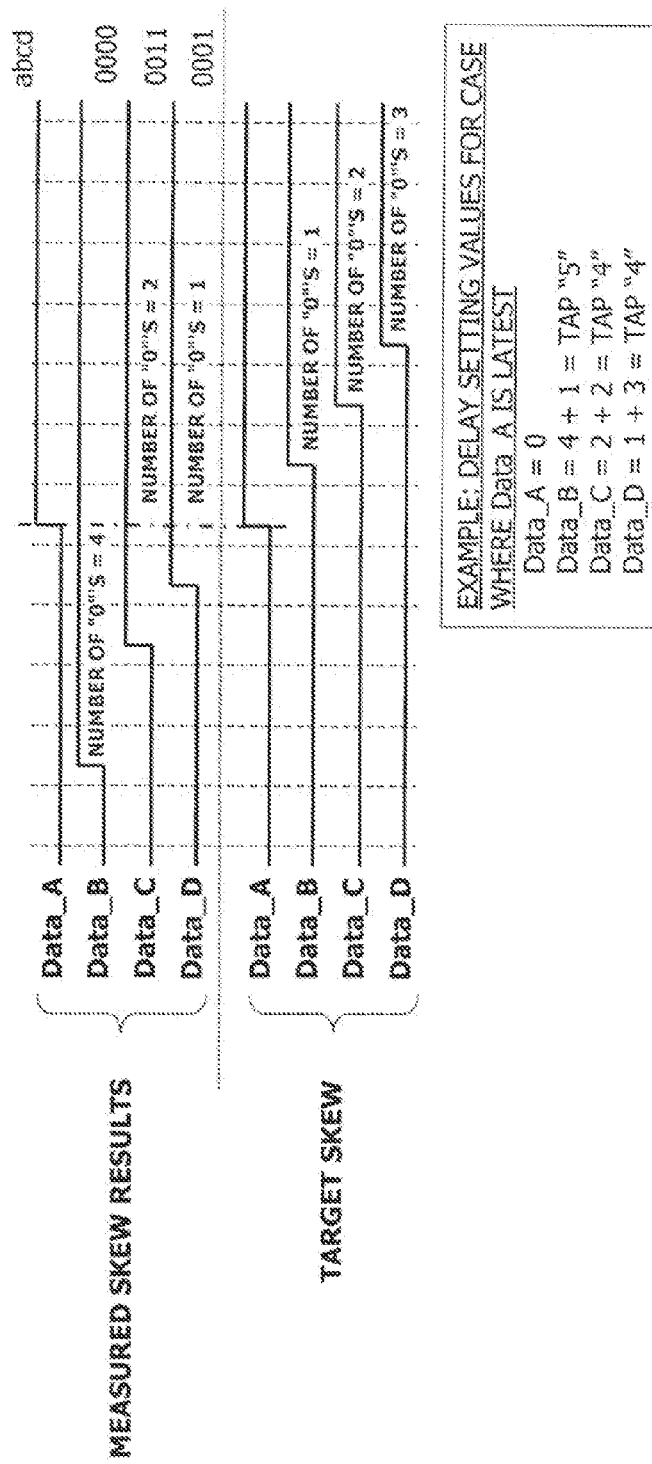

FIG. 50

(2) DELAY SETTING VALUE FOR CASE WHERE Data_B IS LATEST

Data_B = 0
Data_A = NUMBER OF "0"S IN MEASURED AB + NUMBER OF "0"S IN TARGET AB
Data_C = NUMBER OF "0"S IN MEASURED AB + NUMBER OF "0"S IN MEASURED AC + NUMBER OF "0"S IN TARGET BC
  (CASE WHERE Data_A IS LATER THAN Data_C) *APPLIED TO EXAMPLE BELOW
Data_C = NUMBER OF "0"S IN MEASURED AB − NUMBER OF "0"S IN MEASURED AC + NUMBER OF "0"S IN TARGET BC
  (CASE WHERE Data_A IS EARLIER THAN Data_C)
Data_D = NUMBER OF "0"S IN MEASURED AB + NUMBER OF "0"S IN MEASURED AD + NUMBER OF "0"S IN TARGET BD
  (CASE WHERE Data_A IS LATER THAN Data_D)
Data_D = NUMBER OF "0"S IN MEASURED AB − NUMBER OF "0"S IN MEASURED AD + NUMBER OF "0"S IN TARGET BD
  (CASE WHERE Data_A IS EARLIER THAN Data_D) *APPLIED TO EXAMPLE BELOW EXAMPLE: DELAY SETTING VALUES
FOR CASE WHERE Data_B IS LATEST Data_B = 0
Data_A = 5 + 2 = "7"
Data_C = 5 + 1 + 3 = "9"
Data_D = 5 − 2 + 1 = "4"

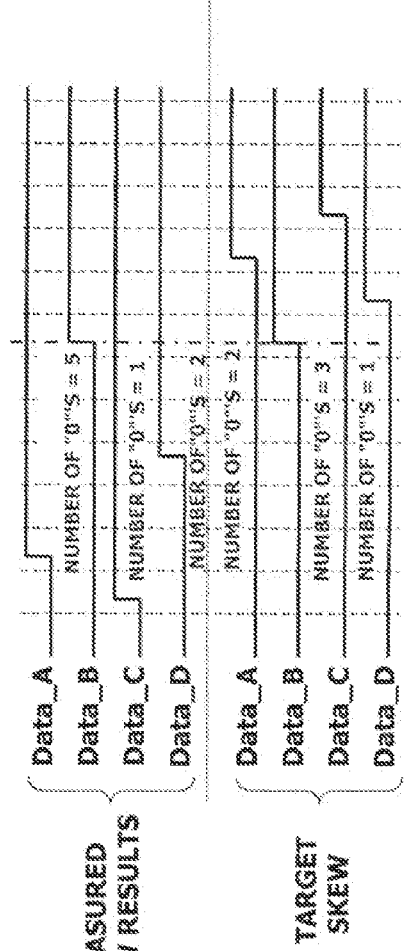

FIG. 51

(3) DELAY SETTING VALUE FOR CASE WHERE Data_C IS LATEST

Data_C = 0
Data_A = NUMBER OF "0"'S IN MEASURED AC + NUMBER OF "0"'S IN TARGET AC
Data_B = NUMBER OF "0"'S IN MEASURED AC + NUMBER OF "0"'S IN MEASURED AB + NUMBER OF "0"'S IN TARGET BC
    (CASE WHERE Data_A IS LATER THAN Data_B)
Data_B = NUMBER OF "0"'S IN MEASURED AC − NUMBER OF "0"'S IN MEASURED AB + NUMBER OF "0"'S IN TARGET BC
    (CASE WHERE Data_A IS EARLIER THAN Data_B)
Data_D = NUMBER OF "0"'S IN MEASURED AC + NUMBER OF "0"'S IN MEASURED AD + NUMBER OF "0"'S IN TARGET CD (CASE WHERE Data_A IS LATER THAN Data_D)
Data_D = NUMBER OF "0"'S IN MEASURED AC − NUMBER OF "0"'S IN MEASURED AD + NUMBER OF "0"'S IN TARGET CD
    (CASE WHERE Data_A IS EARLIER THAN Data_D)

(4) DELAY SETTING VALUE FOR CASE WHERE Data_D IS LATEST

Data_D = 0
Data_A = NUMBER OF "0"'S IN MEASURED AD + NUMBER OF "0"'S IN TARGET AD
Data_B = NUMBER OF "0"'S IN MEASURED AD + NUMBER OF "0"'S IN MEASURED AB + NUMBER OF "0"'S IN TARGET BD
    (CASE WHERE Data_A IS LATER THAN Data_B)
Data_B = NUMBER OF "0"'S IN MEASURED AD − NUMBER OF "0"'S IN MEASURED AB + NUMBER OF "0"'S IN TARGET BD
    (CASE WHERE Data_A IS EARLIER THAN Data_B)
Data_C = NUMBER OF "0"'S IN MEASURED AD + NUMBER OF "0"'S IN MEASURED AC + NUMBER OF "0"'S IN TARGET CD
    (CASE WHERE Data_A IS LATER THAN Data_C)
Data_C = NUMBER OF "0"'S IN MEASURED AD − NUMBER OF "0"'S IN MEASURED AC + NUMBER OF "0"'S IN TARGET CD
    (CASE WHERE Data_A IS EARLIER THAN Data_C)

FIG. 53

EXAMPLE OF TARGET SKEW VALUE ROM STRUCTURE

| OPERATION STATE | Address | | Data | | | | | |
|---|---|---|---|---|---|---|---|---|
| | Gr | LATEST | SIGNAL COMBINATION | bitn: n | ... | bit3: d | bit2: c | bit1: b | bit0: a |
| Fast | 0 | A | Data_A-Data_B | 1 | ... | 1 | 1 | 0 | 0 |
| Fast | 0 | A | Data_A-Data_C | 1 | ... | 1 | 0 | 0 | 0 |
| Fast | 0 | A | Data_A-Data_D | 1 | ... | 0 | 0 | 0 | 0 |
| Typical | 0 | A | Data_A-Data_B | 1 | ... | 1 | 1 | 1 | 0 |
| Typical | 0 | A | Data_A-Data_C | 1 | ... | 1 | 1 | 0 | 0 |
| Typical | 0 | A | Data_A-Data_D | 1 | ... | 1 | 0 | 0 | 0 |
| Slow | 0 | A | Data_A-Data_B | 1 | ... | 1 | 1 | 1 | 1 |
| Slow | 0 | A | Data_A-Data_C | 1 | ... | 1 | 1 | 1 | 0 |
| Slow | 0 | A | Data_A-Data_D | 1 | ... | 1 | 1 | 0 | 0 |

OPERATION DISPLAY RESULT: Fast, Typical, Slow

Gr: GROUP OF SIGNALS IN SIMULTANEOUS OPERATION

SIGNAL COMBINATION: COMBINATION OF MEASURED SIGNALS IN GROUP bit(y): ALLOWED DELAY (TAP) INSERTION IN NUMBER OF "0"S LATEST: SIGNAL DETECTED AS LATEST FROM MEASURED SKEW (EARLIEST SIGNAL WITH TARGET SKEW)

INTEGRATED CIRCUIT DEVICE INCLUDING SKEW ADJUSTMENT CIRCUIT AND SKEW ADJUSTMENT METHOD

CROSS-REFERENCE TO RELATED APPLICATIONS

This application is based upon and claims the benefit of priority of the prior Japanese Patent Application No. 2010-184523, filed on Aug. 20, 2010, and the Japanese Patent Application No. 2010-184524, filed on Aug. 20, 2010, the entire contents of which are incorporated herein by reference.

FIELD

An embodiment of this invention relates to a skew adjustment circuit and a skew adjustment method.

BACKGROUND

A large-scale integrated circuit (LSI) has an output buffer which outputs a plurality of signals to an external LSI or to other internal macros. For example, signals of a data bus with a plurality of bits are latched by a plurality of latch circuits such as flip-flops in response to a reference clock, and the latch circuit outputs are output via respective corresponding output buffers. When a plurality of signals simultaneously change from L level to H level, large currents flow in the power supply wiring of the plurality of output buffers, and power supply noise is generated. Conversely, when a plurality of signals simultaneously change from H level to L level, large currents flow in the ground wiring of the plurality of output buffers, and ground noise is generated. Such noise is called simultaneous switching noise (SSN), and becomes a large noise source when a plurality of output buffers with large driving capacity are switched simultaneously in the same direction.

Methods to suppress such simultaneous switching noise are described in Patent Documents Japanese Patent Application Laid-open No. 2007-129601, Japanese Patent Application Laid-open No. 2004-334271 and Japanese Patent Application Laid-open No. H9-181593. In all cases, an attempt is made to suppress simultaneous switching by adding a predetermined fixed delay to a plurality of signals and generating skew in the plurality of signals.

However, the output timing of a plurality of signals changes for various reasons, and in some cases it may not be possible to appropriately suppress noise due to simultaneous switching simply by adding the predetermined fixed delay.

For example, depending on the LSI operating environment, the LSI internal operating speed differs, and the timing of internal signals differs, so that using a method of inserting a fixed delay circuit for output signals, there are cases in which simultaneous switching noise cannot be appropriately reduced. Further, the AC specifications of external LSIs receiving output signals from an LSI, such as for example the input setup time, hold time and similar, differ depending on the LSI, and so there are cases in which the AC specifications cannot be satisfied by a method of inserting a fixed delay for output signals.

SUMMARY

A first aspect of a skew adjustment circuit, provided in an integrated circuit device having a plurality of signal lines, provided in an integrated circuit device, for transmitting a plurality of signals respectively, and a plurality of buffer circuits to which a plurality of signals transmitted by the plurality of signal lines are respectively input, the skew adjustment circuit has;

a plurality of delay circuits, respectively provided in stages preceding the plurality of buffer circuits;

a monitoring circuit, which monitors changes in the signals of the plurality of signal lines; and a delay adjustment circuit, which decides delay amounts for the plurality of delay circuits based on a monitoring result output of the monitoring circuit, and sets the delay amounts in the plurality of delay circuits, wherein the monitoring circuit detects, as the monitoring result, a number of signal changes which is a number of signal lines in which a signal change occurs in a monitoring period; and the delay adjustment circuit decides the delay amounts based on the number of signal changes.

A second aspect of a skew adjustment circuit is provided in an integrated circuit having first and second signal lines which transmit first and second signals respectively, and first and second buffer circuits to which the first and second signals transmitted by the first and second signal lines are respectively input, and has:

first and second delay circuits, respectively provided in stages preceding the first and second buffer circuits;

a skew measurement circuit, which measures a skew between the first and second signals; and a delay adjustment circuit, which decides delay amounts for the first and second delay circuits based on the skew measured by the skew measurement circuit, and sets the decided delay amounts in the first and second delay circuits.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 8 depicts the format of the delay amount ROM;

FIG. 9 depicts a specific example of delay amount ROM;

FIG. 10 depicts delay amounts set in delay circuits and skew;

FIG. 14 depicts a specific example of delay amount ROM;

FIG. 20 depicts the format of delay amount ROM 40;

FIG. 21 depicts a specific example of delay amount ROM 40;

FIG. 23 depicts a specific example of delay amount ROM 40;

FIG. 24 depicts a second modified example of the skew adjustment circuit in the second embodiment;

FIG. 30 depicts the structure of target skew value ROM 45;

FIG. 38 depicts a specific example of target skew value ROM;

FIG. 45 depicts a specific example of RAM 75;

FIG. 47 depicts a specific example of delay amount ROM 45;

FIG. 48 depicts a first computation 1 of the delay setting value computation circuit 381 in this embodiment;

FIG. 49 depicts a second computation 2 of the delay setting value computation circuit 381 in this embodiment;

FIG. 50 depicts a second computation 2 of the delay setting value computation circuit 381 in this embodiment;

FIG. 51 depicts a second computation 2 of the delay setting value computation circuit 381 in this embodiment;

FIG. 53 depicts a specific example of delay amount ROM 45;

DESCRIPTION OF EMBODIMENTS

Figure 1:
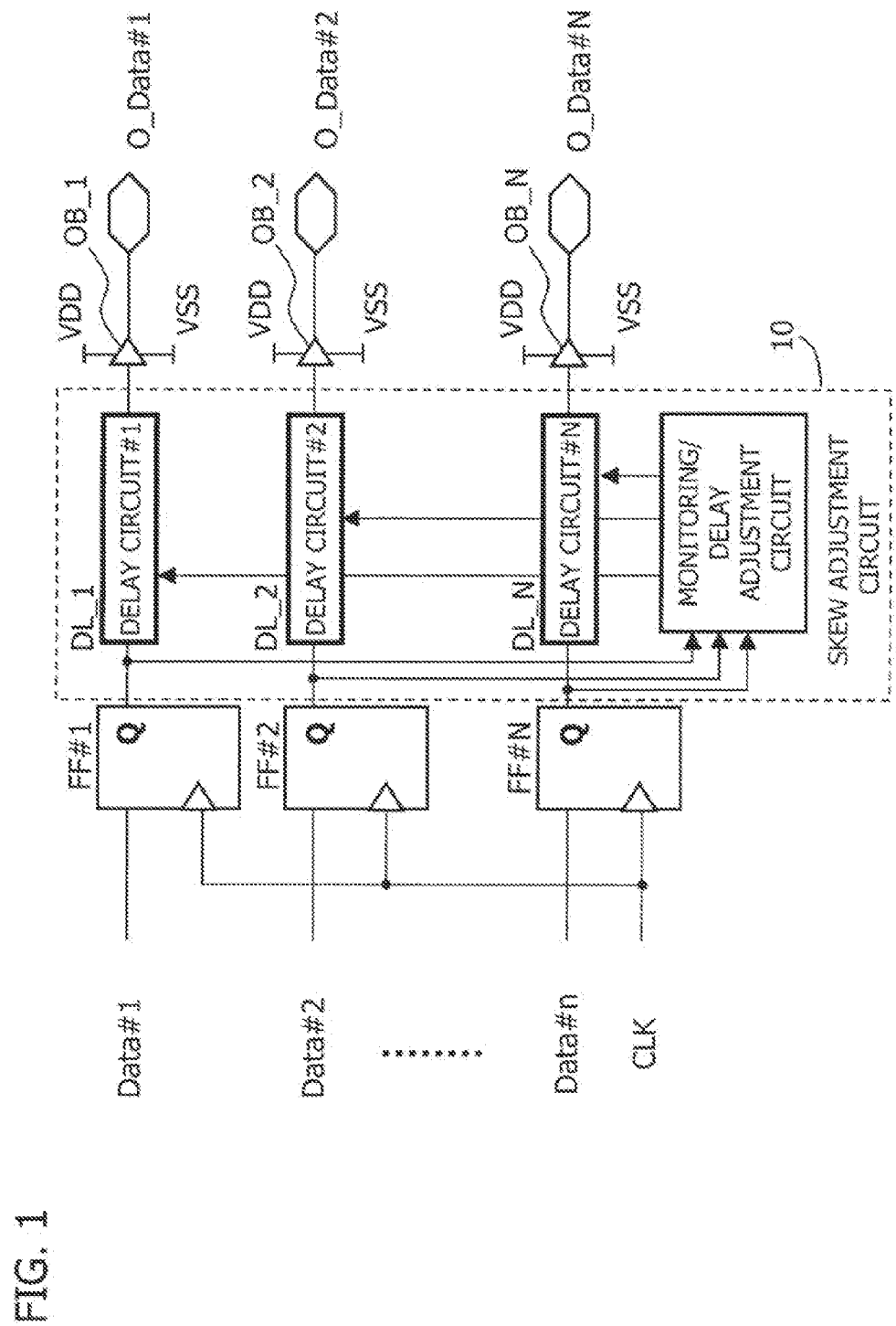
FIG. 1 depicts an integrated circuit device having the skew adjustment circuit of an embodiment.

FIG. 1 depicts an integrated circuit device having the skew adjustment circuit of an embodiment. In FIG. 1, the circuit of the output portion of the LSI is depicted. In FIG. 1, the plurality of data signals Data#1 to Data#N are latched by the plurality of flip-flops FF#1 to FF#N in response to the clock CLK. The plurality of latched data signals are output to another external LSI or to another internal macro as the output data signals O_Data#1 to O_Data#N via output buffers OB_1 to OB_N.

The data signals Data#1 to Data#N are transmitted through signal wires between the respective pluralities of flip-flops and output buffers. And, when data signals are input to the output buffers, in response to the changes in data signals from L level to H level (rise) or from H level to L level (fall), the output buffers drive the output terminals. At this time, driving current flows in the power supply VDD and ground VSS connected to the output buffers OB_1 to OB_N.

When the timing of changes in the data signals supplied to the output buffers OB_1 to OB_N coincides, driving operation is performed simultaneously for the plurality of output buffers. In this case, when data signal changes are all the same, or when the changes of many data signals are the same, a large current flows in the power supply VDD or ground VSS due to the simultaneous driving operation of the output buffers, and power supply noise or ground noise occurs.

Here, in FIG. 1 the skew adjustment circuit 10 monitors the number of changes and timing of data signals transmitted through each signal wire, and decides delay amounts for each signal wire according to the detected number of signal changes and timing. And, the delay amounts of the delay circuits DL_1 to DL_N provided immediately before the output buffers OB_1 to OB_N are set to the decided delay amounts, so that, to the extent possible, the timing of driving operations in the plurality of output buffers OB_1 to OB_N does not coincide.

Further, the skew adjustment circuit 10 monitors changes in the LSI operation states (process conditions, voltage conditions, temperature conditions), and decides optimum delay amounts according to these operation states. Further, delay amounts are selected which conform to the AC specifications, such as the setup time and similar, of other LSIs to which the output data signals O_Data#1 to O_Data#N are input. The output data signals O_Data#1 to O_Data#N are similarly made to conform to the AC specifications of other macros to which they are input.

Figure 2:
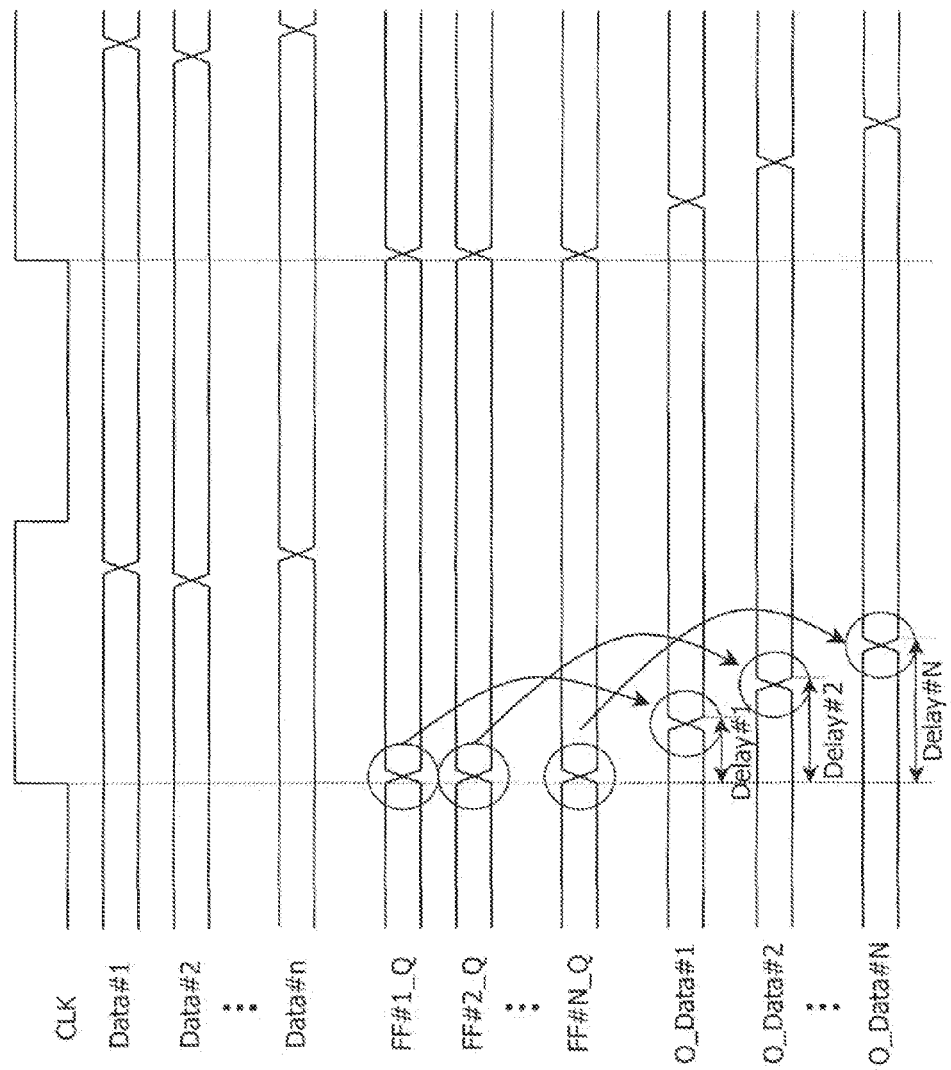
FIG. 2 is a signal waveform diagram depicting a skew adjustment in the skew adjustment circuit 10 of FIG. 1.

FIG. 2 is a signal waveform diagram depicting a skew adjustment in the skew adjustment circuit 10 of FIG. 1. In FIG. 1, in response to the clock CLK, the plurality of flip-flops FF#1 to FF#N latch the data signals Data#1 to Data#N. In the example of FIG. 2, the latch timings coincide. The skew adjustment circuit monitors changes in the outputs of the flip-flops FF#1 to FF#N, and when signal changes are detected in all or in many of the signal wires as depicted in FIG. 2, appropriately controls the delay amounts Delay#1 to Delay#N of the delay circuits, and causes an appropriate skew in the data signals FF#1_Q to FF#N_Q input to the output buffers OB_1 to OB_N.

In this way, the skew adjustment circuit 10 adjusts the delay amounts of the delay circuits provided in the signal wires, and so shifts the timing of transmitted data signals to impart appropriate skew. As a result, simultaneous switching noise due to simultaneous switching operation of output buffers is suppressed.

First Embodiment

Figure 3:
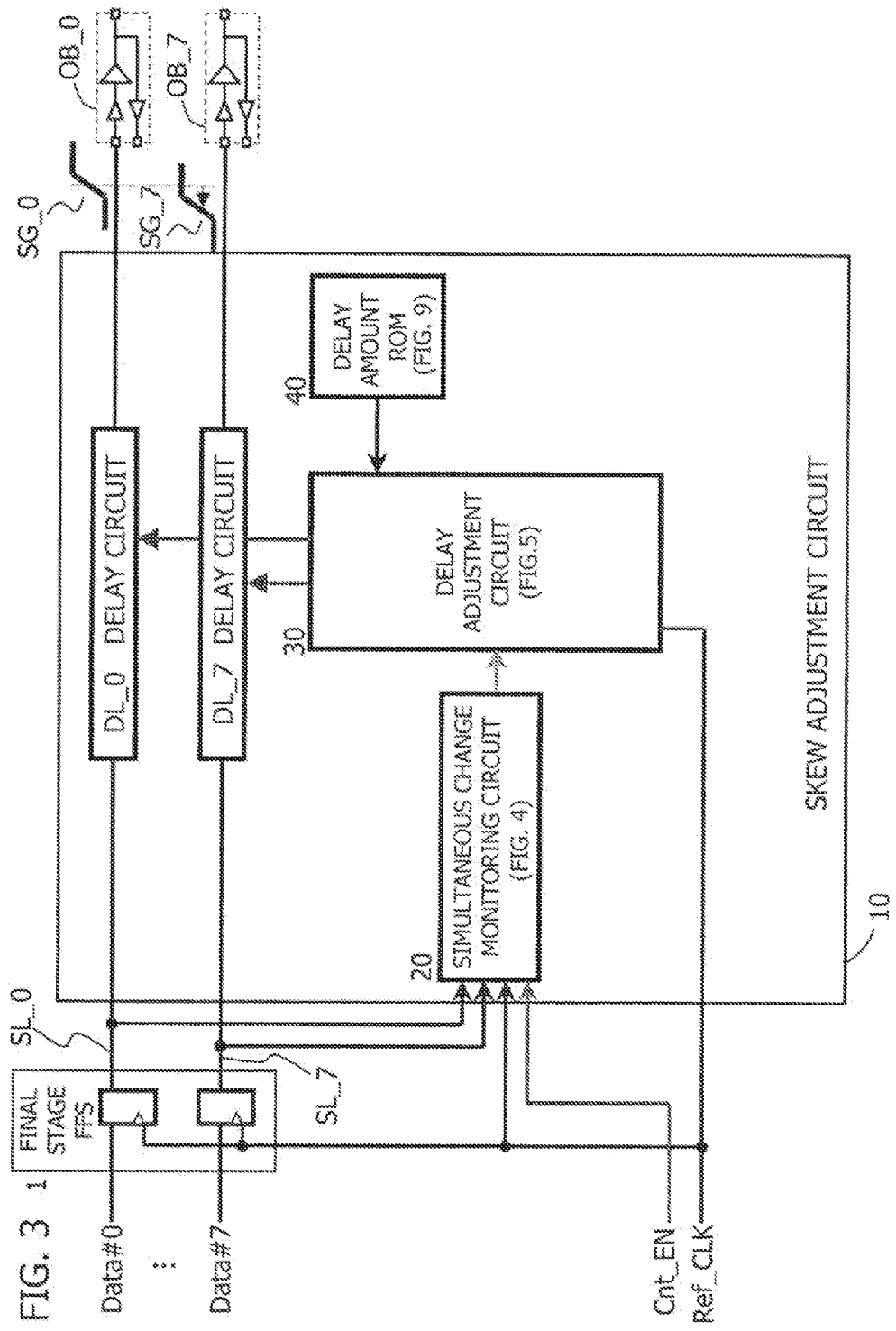
FIG. 3 depicts the skew adjustment circuit of a first embodiment.

FIG. 3 depicts the skew adjustment circuit of a first embodiment. In FIG. 3, the configuration of the output portion of an LSI is depicted. The LSI has final-stage flip-flops 1 which, in response to a reference clock Ref_CLK, latch the eight data signals Data#0 to Data#7, eight signal lines SL_0 to SL_7 connected to the output terminals of the flip-flops 1, and output buffers OB_0 to OB_7 which input the signals SG_0 to SG_7 transmitted through the respective signal lines and output the signals to another external LSI or to another internal macro. In the output buffers OB_0 to OB_7 in the figure, in addition to the buffer circuits which output signals, input buffers which input signals are also depicted. That is, OB_0 to OB_7 in the figure are input/output buffers.

The skew adjustment circuit 10 is provided with delay circuits DL_0 to DL_7 in the eight signal lines SL_0 to SL_7 immediately before the output buffers OB_0 to OB_7. As explained above, by adjusting the delay amounts of these delay circuits, an appropriate skew can be induced in the signals SG_0 to SG_7 transmitted in these signal lines SL_0 to SL_7. By this means, the switching timing in output buffers is shifted, and the occurrence of noise due to simultaneous switching is suppressed.

The skew adjustment circuit 10 has a monitoring circuit 20 which monitors whether, within a prescribed monitoring period, changes in the signals SG_0 to SG_7 transmitted through the eight signal lines from L level to H level (rise) or changes from H level to L level (fall) occur. This monitoring period is a period sufficiently short that signal changes can be regarded as simultaneous, and so signal lines in which signal level changes occur within this monitoring period are regarded as undergoing simultaneous changes. When there exist a plurality of signal lines in which signal levels change within a period sufficiently short that the changes can thus be regarded as simultaneous, such changes can cause power supply noise or ground noise due to simultaneous switching in output buffers.

The skew adjustment circuit 10 further has a delay adjustment circuit 30 which decides the delay amounts to set in the delay circuits DL_0 to DL_7 according to the number of signal lines (number of signal changes) in which signal levels have changed within a short time, as detected by the simultaneous change monitoring circuit 20. The delay adjustment circuit 30 references delay amount memory (ROM) 40, in which are stored delay amounts to induce appropriate skew between signals corresponding to the number of signal changes, decides the delay amounts, and sets the delay amounts in the delay circuits DL_0 to DL_7.

Figure 4:
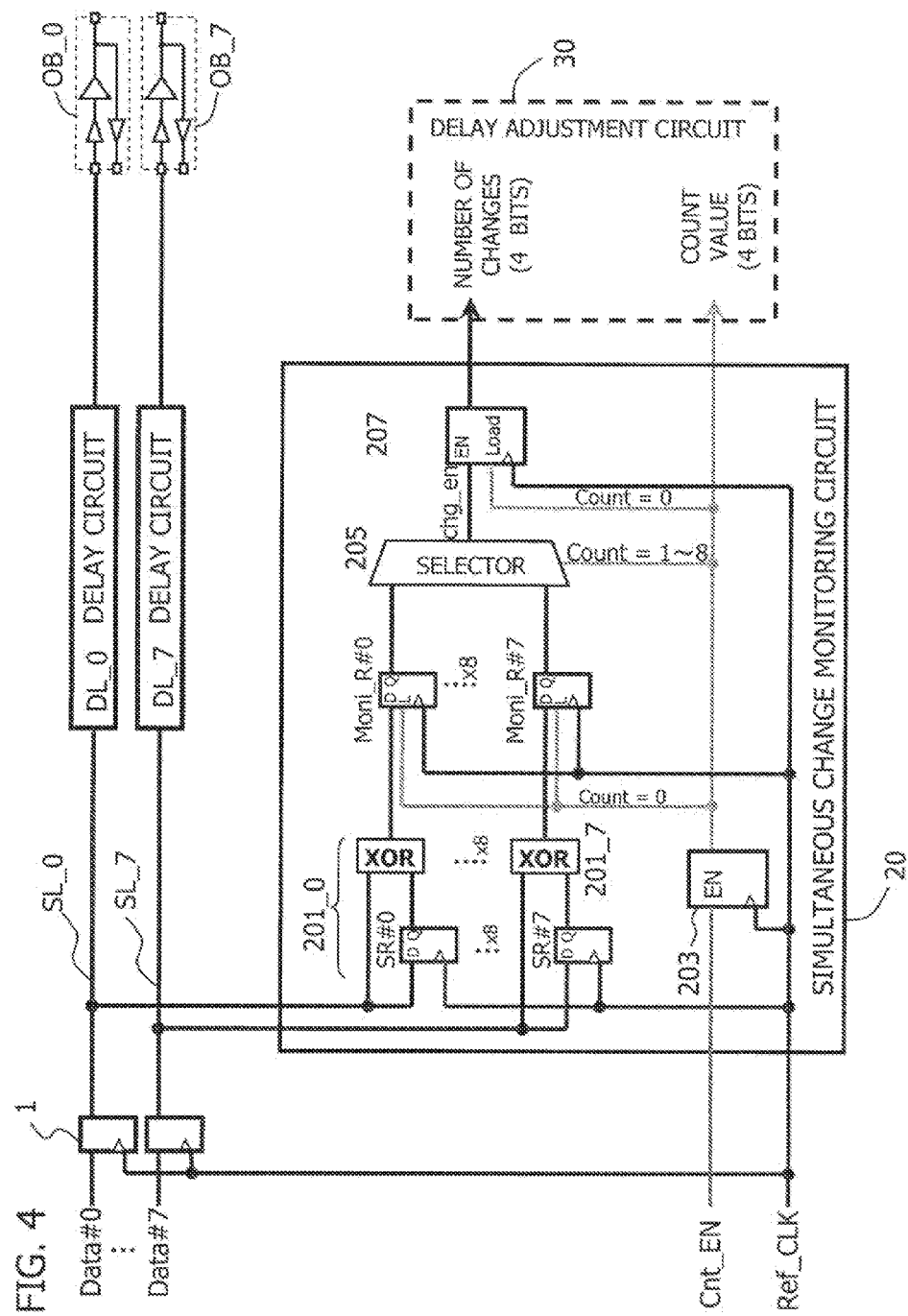
FIG. 4 depicts a simultaneous change monitoring circuit.

FIG. 4 depicts a simultaneous change monitoring circuit. The simultaneous change monitoring circuit 20 has signal change detection circuits 201_0 to 201_7 which detect changes in the signals of the eight respective signal lines SL_0 to SL_7. The signal change detection circuit 201_0 has a register SR#0 which latches the signal of the signal lines SL_0 to SL_7 in response to the reference clock Ref_CLK, and an XOR circuit which computes the exclusive logical sum of the signal of the signal line and the output of the register SR#0. When the signal of the signal line changes from L level to H level, in response to the immediately following reference clock Ref_CLK, the XOR circuit generates a detection pulse having a pulse width from the signal change until the reference clock. Similarly when the signal of the signal line changes from H level to L level, the XOR circuit generates a detection pulse.

The control enable signal Cnt_EN is generated by a circuit which is not depicted. In initialization operation of a system with a skew adjustment circuit, when the stabilized system clock is input and the stabilized internal reference clock Ref_CLK is generated, the control enable signal Cnt_EN is at H level. In response to this control enable signal Cnt_EN=H, skew adjustment operation of the skew adjustment circuit 10 begins. And in response to the control enable signal Cnt_EN=H, a timing generation counter 203 repeats an operation of incrementing a four-bit count value Count in synchronization with the reference clock. As explained below, the count value Count output by this timing generation counter 203 controls the operation timing within the skew adjustment circuit 10.

The control enable signal Cnt_EN can be configured so as to be controlled by an enable state (H level) and disable state (L level) from a higher-level system. By employing such a configuration, following initialize operation at power-on startup or similar, the skew adjustment circuit automatically performs skew adjustment, therefore, an operation of the skew adjustment circuit stops. Further, when the LSI temperature has risen the control enable signal Cnt_EN can be switched into the enable state and skew adjustment performed, and thereafter can be switched into the disable state. By operating and stopping the skew adjustment circuit in this way, excessive current consumption can be avoided.

Figure 5:
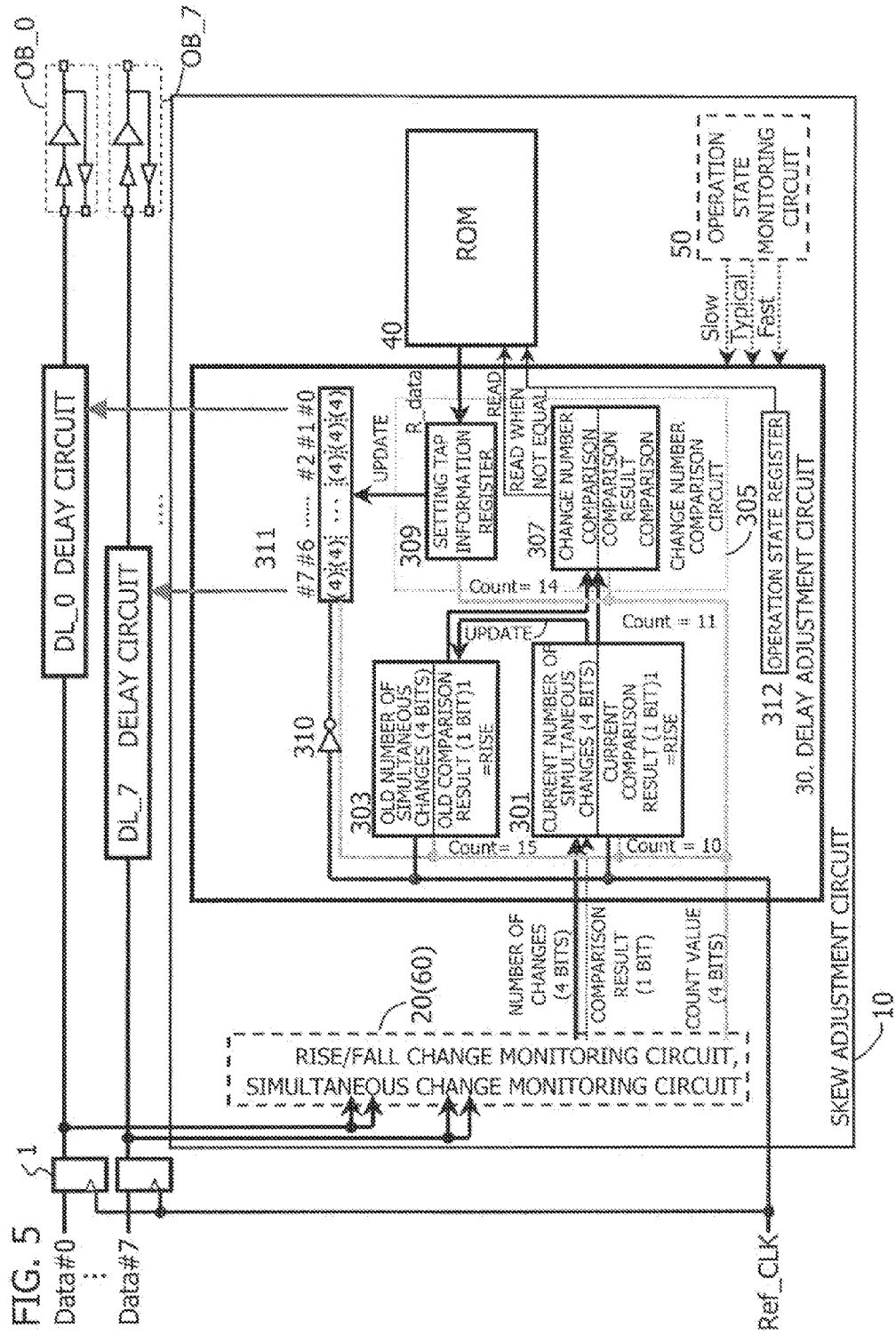
FIG. 5 depicts the delay adjustment circuit 30.
Figure 6:
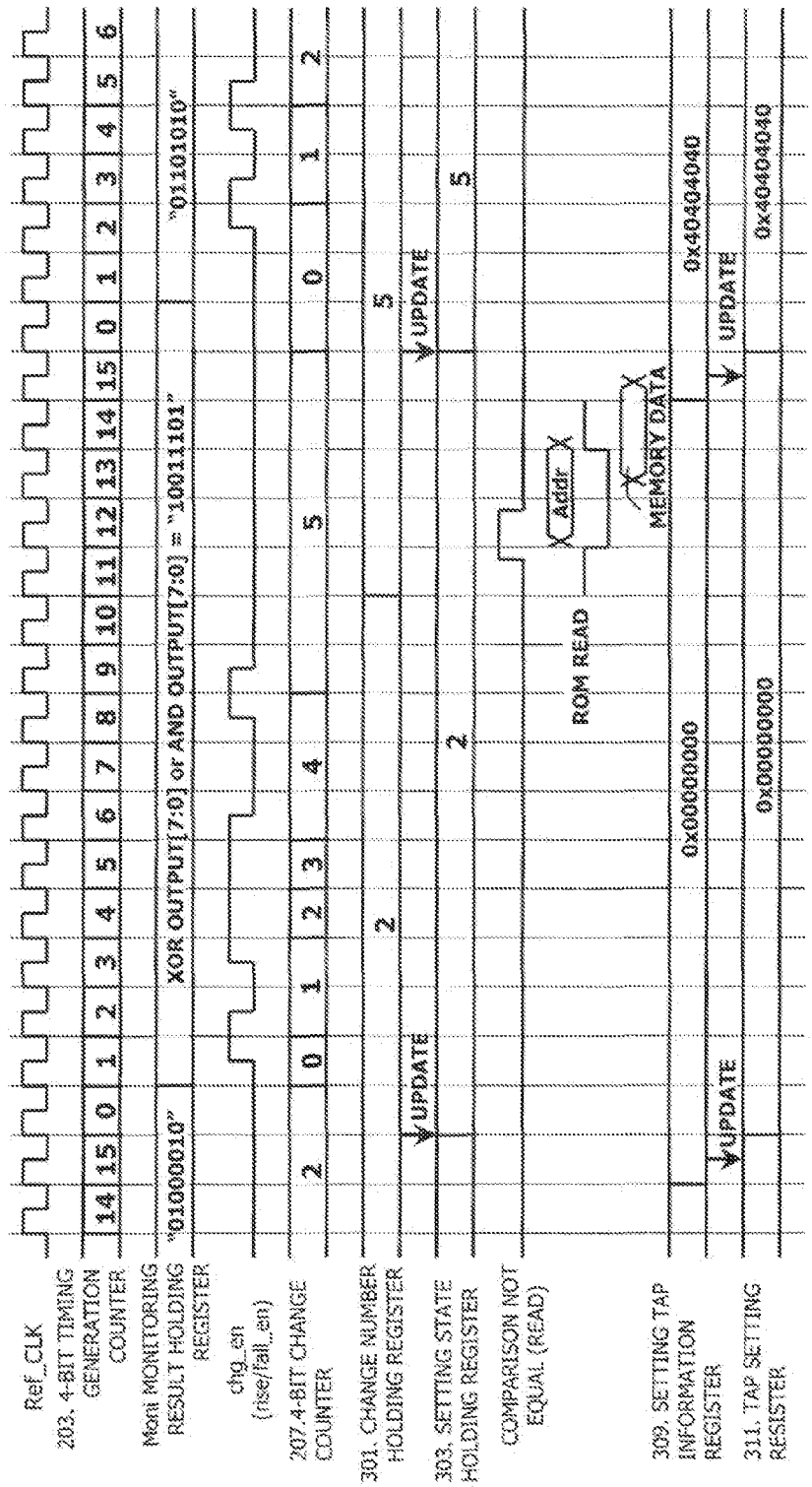
FIG. 6 is a timing chart of operation of the simultaneous change monitoring circuit 20 and the delay adjustment circuit 30, described below, in FIG. 5.

FIG. 6 is a timing chart of operation of the simultaneous change monitoring circuit 20 and the delay adjustment circuit 30, described below (FIG. 5). The configuration and operation of the simultaneous change monitoring circuit are explained referring to this timing chart.

The monitoring result holding registers Moni_R#0 to Moni_R#7 latch the signal change detection pulses of the XOR circuits when the count value Count output by the timing generation counter 203 becomes 0. And, corresponding to the timing when the count value Count becomes 1 to 8, the selector 205 selects in order the monitoring result holding registers Moni_R#0 to Moni_R#7 and performs parallel/serial conversion, and a simultaneous change counter 207 counts the change enabled signals chg_en=1 output from the selector, and outputs the counted number of changes to the delay adjustment circuit 30. This simultaneous change counter 207 is reset when the count value Count=0, and thereafter begins counting, and counts the change enabled signals chg_en=1 from the selector in response to the reference clock Ref_CLK. In FIG. 6, the count value of the change counter at the time the timing count value Count=8 is "5".

That is, in the simultaneous change monitoring circuit 20, the signal change detection circuits 201_0 to 201_7 detect signal changes occurring simultaneously in the monitoring period which is one period of the reference clock Ref_CLK, and the detected signal changes are latched by the monitoring result holding registers Moni_R#0 to Moni_R#7 with the timing of count value Count=0, and at the next count value Count=1 to 8, the counter 207 counts the signal changes. The detected signal changes are both changes from L level to H level, and changes from H level to L level. Hence the simultaneous change monitoring circuit 20 detects simultaneous changes in signals at intervals of once in 16 cycles of the reference clock Ref_CLK, and outputs the number of signal changes.

FIG. 5 depicts the delay adjustment circuit 30. The delay adjustment circuit 30 of FIG. 5 has a change number holding register 301 which latches the number of signal changes detected by the simultaneous change monitoring circuit 20 at the count value Count=10, and a setting state holding register 303 which, at count value Count=15, latches the current simultaneous change number held in the change number holding register 301 as the old simultaneous change number. In addition, the delay adjustment circuit 30 has a change number comparison circuit 305; this circuit has a change number comparator 307 which compares the old simultaneous change number of the setting state holding register 303 with the current simultaneous change number of the change number holding register 301, when the count value Count=11, and a setting tap information register 309 which latches setting tap information corresponding to delay amounts R-data read out from the delay ROM 40 at count value Count=14. Further, a tap setting register 311 which latches tap information of the setting tap information register 309 at count value Count=15 is provided; the tap values set in this tap setting register 311 are set in the delay circuits DL_0 to DL_7. The reference clock Ref_CLK is supplied to each of these registers 301, 303 and 309 and to the comparator 307, and these perform latching or comparison in synchronization with the rising edge of the clock. By means of the inverter 310, the tap setting register 311 latches the setting values of the setting tap information register 309 in synchronization with the falling edge of the reference clock Ref_CLK.

In another embodiment described below, the delay adjustment circuit 30 of FIG. 5 takes as inputs the number of changes and comparison results from a rise/fall change monitoring circuit 60, and performs prescribed delay adjustment based on the comparison results. In this embodiment, comparison results are not used.

As depicted in the timing chart of FIG. 6, operation of the delay adjustment circuit 30 of FIG. 5 is as follows. The simultaneous change monitoring circuit 20 of FIG. 4 detects the number of simultaneous changes at count value Count=8, and outputs the result to the delay adjustment circuit 30. In FIG. 6, the number of simultaneous changes is "5". And, at count value Count=10 the number of simultaneous changes is stored in the change number holding register 301 as the current number of simultaneous changes. At count value Count=11, the change number comparator 307 compares the old number of simultaneous changes ("2" in FIG. 6) held in the setting state holding register 303 and the current number of simultaneous changes ("5" in FIG. 6). When the comparison result is unequal (comparison #), a change has occurred in the number of simultaneous changes, and so the change number comparator 307 outputs a readout command Read to the delay amount ROM 40. The address of this readout operation is the data of the current number of simultaneous changes (in FIG. 6, "5"). When the comparison result is equal, reading from the ROM is not performed, and the tap values of the tap setting register 311 are not updated.

The delay amount ROM 40 stores, as tap values for the delay circuits DL_0 to DL_7, delay amount data to be added to each signal line corresponding to the number of simultaneous changes. Hence the readout data R_data read out from the delay amount ROM 40 is the tap value corresponding to the delay amount, and at count value Count=14 is stored in the setting tap information register 309. And, at count value Count=15, the old number of simultaneous changes in the setting state holding register 303 is updated by the current number of simultaneous changes, and the tap setting register 311 is updated with tap values stored in the setting tap information register 309. Updating of the tap setting register 311 is performed in response to the inversion by the inverter 310 of the falling edge of the reference clock Ref_CLK to a rising edge, and updating of the setting state holding register 303 is performed in response to the rising edge of Ref_CLK.

In this way, detection of the number of simultaneous changes, comparison of the old number of simultaneous changes with the current number of simultaneous changes, readout of a tap value from the delay ROM 40 when the comparison result is unequal, and setting in the tap setting register 311, are repeated in a cycle of 16 counts of the count value according to the 4-bit count value Count of the timing generation counter 203. Hence when the detected number of simultaneous changes has changed, delay amounts corresponding to the number of simultaneous changes are set in the delay circuits DL_0 to DL_7.

Figure 7:
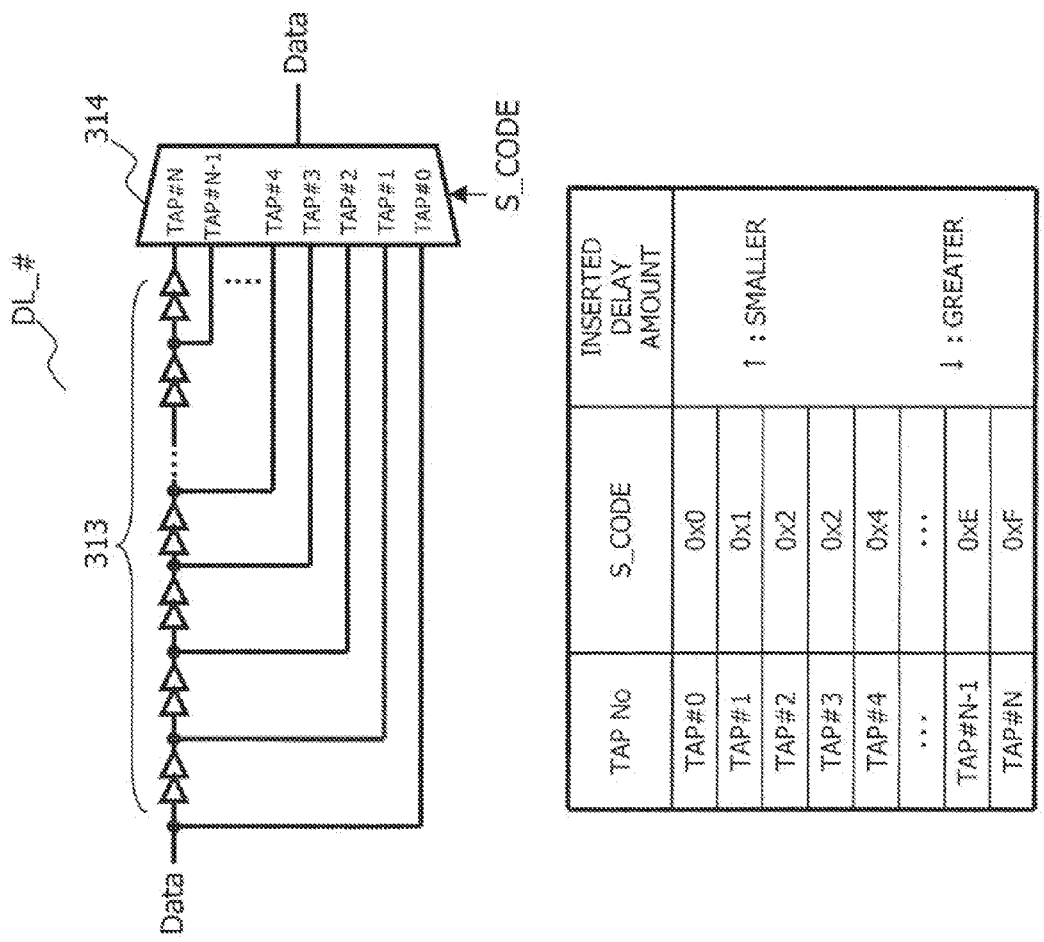
FIG. 7 depicts a delay circuit, and depicts the relation between the tap value and the delay amount thereof.

FIG. 7 depicts a delay circuit, and depicts the relation between the tap value and the delay amount thereof. The delay circuit DL_# has a buffer group 313 comprising a plurality of buffers which delay an input data signal Data, and a selector 314 which selects a plurality of nodes in the buffer group 313 based on a setting code S_CODE. In FIG. 7, a correspondence table between selector tap values and setting codes S_CODE is depicted; the smaller the setting code S_CODE, that is, the smaller the tap value, the smaller is the delay amount inserted by the delay circuit DL_#, and in the opposite case, the larger is the delay amount. Each 4-bit setting code S_CODE for the eight delay circuits DL_0 to DL_7 is set in the tap setting register 311 of FIG. 5. Hence the delay amount ROM 40 stores these setting codes S_CODE in correspondence with the number of simultaneous changes.

FIG. 8 depicts the format of the delay amount ROM. An address has the simultaneous change monitoring group Gr, the operation state, and the number of simultaneous changes; data for this address is the tap setting value for the delay circuits (the setting codes S_CODE for each of the delay circuits). The 32-bit tap setting value comprises the 4-bit setting codes to set in the delay circuits for the 8 signal lines. The format depicted here corresponds to subsequent embodiments as well; in this embodiment, the address information is only the number of simultaneous changes.

Here, a simultaneous change monitoring group is a signal group to be monitored for simultaneous changes, and in this embodiment the 8 signal lines SL_0 to SL_7 correspond to one group Gr=0. For example, when a data bus has 32 bits, the 32 signal lines are divided into four groups, each having 8 signal lines, and for the 8 signal lines of each group, the above-described number of simultaneous changes is monitored. And, delay amounts are set for the 8 signal lines of each group.

FIG. 9 depicts a specific example of delay amount ROM. In this example, an address has the group Gr=0 to x and the number of simultaneous changes (0 to 2, 3 to 5, or 6 to 8), and data is a 32-bit tap setting value (setting codes S_CODE for each of the delay circuits) corresponding to the delay amounts for each of the delay circuits.

As one example explained for the group Gr=0, when the number of simultaneous changes is 0 to 2, the tap setting values are all "0x0" (delay amounts zero). On the other hand, when the number of simultaneous changes is 3 to 5, there are two tap setting values, "0x0" and "0x4", and for the data signals Data#0 to Data#7, "0x0" (delay amount zero) is set in the delay circuits of even-numbered data signal lines, while "0x4" (delay amount 4/16) is set in the delay circuits of odd-numbered data signal lines. And, when the number of simultaneous changes is 6 to 8, there are four tap setting values, "0x0", "0x2", "0x4" and "0x6", with these four tap setting values set respectively for data signals Data#0 to Data#3 and for data signals Data#4 to Data#7. That is, the 8 signal lines are divided into 4 groups, and different delay amounts are set in the delay circuits of the signal lines for each group.

FIG. 10 depicts delay amounts set in delay circuits and skew. Delay circuits set with the tap setting values of FIG. 9 and skew-adjusted signal waveforms are depicted.

(1) When the number of simultaneous changes is 0 to 2, the delay amounts of the 8 delay circuits are set to 0. This is because the number of simultaneous changes is small, so that simultaneous switching noise can be regarded to be low, and there is little need to induce skew between signals.

(2) When the number of simultaneous changes is 3 to 5, the delay circuits for the even-numbered data signal lines are set to "0x0" (delay amount zero), and the delay circuits for the odd-numbered data signal lines are set to "0x4" (delay amount 4/16), for the data signals Data#0 to Data#7. That is, there is a comparatively large number of simultaneous changes, so that the data signal lines are divided into two groups, with delay amounts set to zero for one and to 4 for the other, to induce skew as depicted in the figure. By this means, the probability of complete coincidence of all switching operations in output buffers due to simultaneously changing signal lines can be reduced.

(3) When the number of simultaneous changes is greatest at 6 to 8, data signal lines are divided into 4 groups of two each, and the delay amounts of these groups are set to zero, 2, 4 and 6, to induce skew as depicted in the figure. When the number of simultaneous changes is large, it is desirable that the delay amounts be made different for numerous groups in this way to suppress the probability of simultaneous changes.

The delay amounts in FIG. 10 are one example; the differences in numbers of simultaneous changes may be made smaller, and different delay amounts may be set for each of the numbers of simultaneous changes. For example, when the number of simultaneous changes is 8, the delay amounts may be made different for all 8 signal lines.

As depicted in FIG. 8, FIG. 9 and FIG. 10, when in this embodiment simultaneous changes of signals in signal lines are detected, the delay amounts of the delay circuits provided in the signal lines are adjusted to appropriately adjust skew between the signals, and simultaneous switching by output buffers is suppressed. However, the delay amounts are not allowed to exceed the allowed delay amounts for conformance to the AC specifications of other LSIs and macro input circuits to which the outputs of the output buffers are supplied. Hence the delay amounts set in the delay amount ROM are set to less than the allowed delay amounts conforming to these AC specifications.

Figure 11:
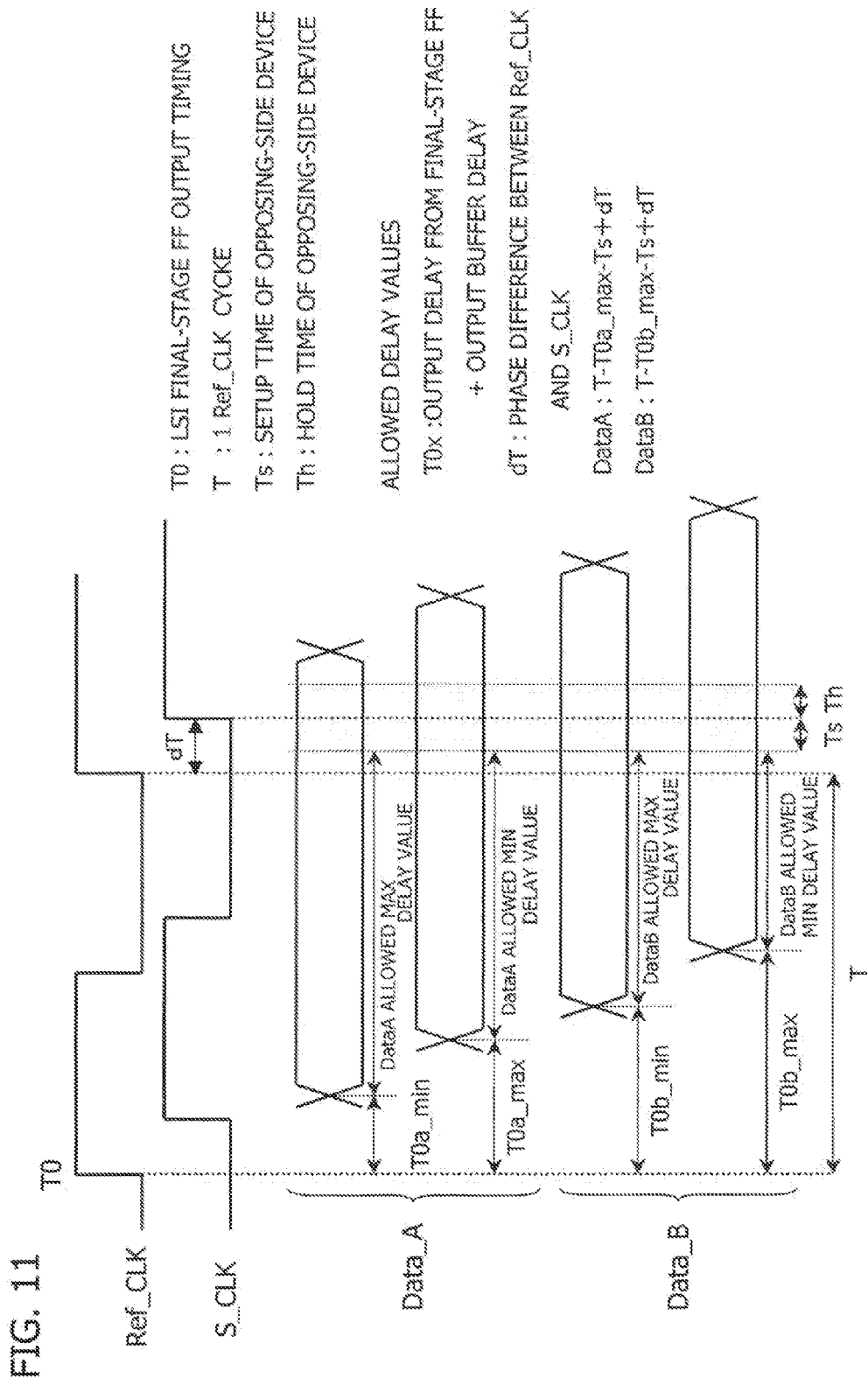
FIG. 11 explains allowed delay amounts.

FIG. 11 explains allowed delay amounts. In the figure, the internal reference clock Ref_CLK of the LSI and the system clock S_CLK for a plurality of LSIs are depicted. These clocks are synchronized and have the same period T, but as depicted in the figure, there are cases in which a prescribed phase difference dT exists between the two clocks.

In FIG. 3, the final-stage flip-flops 1 in the LSI output stage latch data signals in response to the reference clock Ref_CLK. And data signals pass through the signal lines SL and output buffers OB to be output to another later-stage LSI or macro. The input circuit of the other later-stage LSI or macro captures the input signals at the rising edge of the system clock S_CLK, but a setup time Ts and hold time Th are determined as AC specifications of the input circuit.

In FIG. 11, allowed delay values are depicted which satisfy the sum TOx of the output delay from the final-stage flip-flop and the output buffer delay, as well as the setup time Ts, for data A and data B. Due to variations arising from the process conditions, temperature conditions, power supply voltage and similar, there exist maximum and minimum values for the delay value TOx on the output side. Hence the cases in which delay values TOx are maximum and minimum for data A and B are depicted.

The allowed delay values satisfying the setup time Ts are as follows for data A and B.

$$DataA = T - Toa\_max - Ts + dT$$

$$DataB = T - Tob\_max - Ts + dT$$

The delay value TOx is greater for data B, so that the allowed delay value for data B is smaller. Hence a delay value les than the allowed delay value for data B is set in the delay amount ROM 40. As a result, skew-adjusted output signals are guaranteed to be supplied with timing satisfying the setup time Ts of the later-stage LSI or macro input circuit.

First Embodiment (2)

Figure 12:
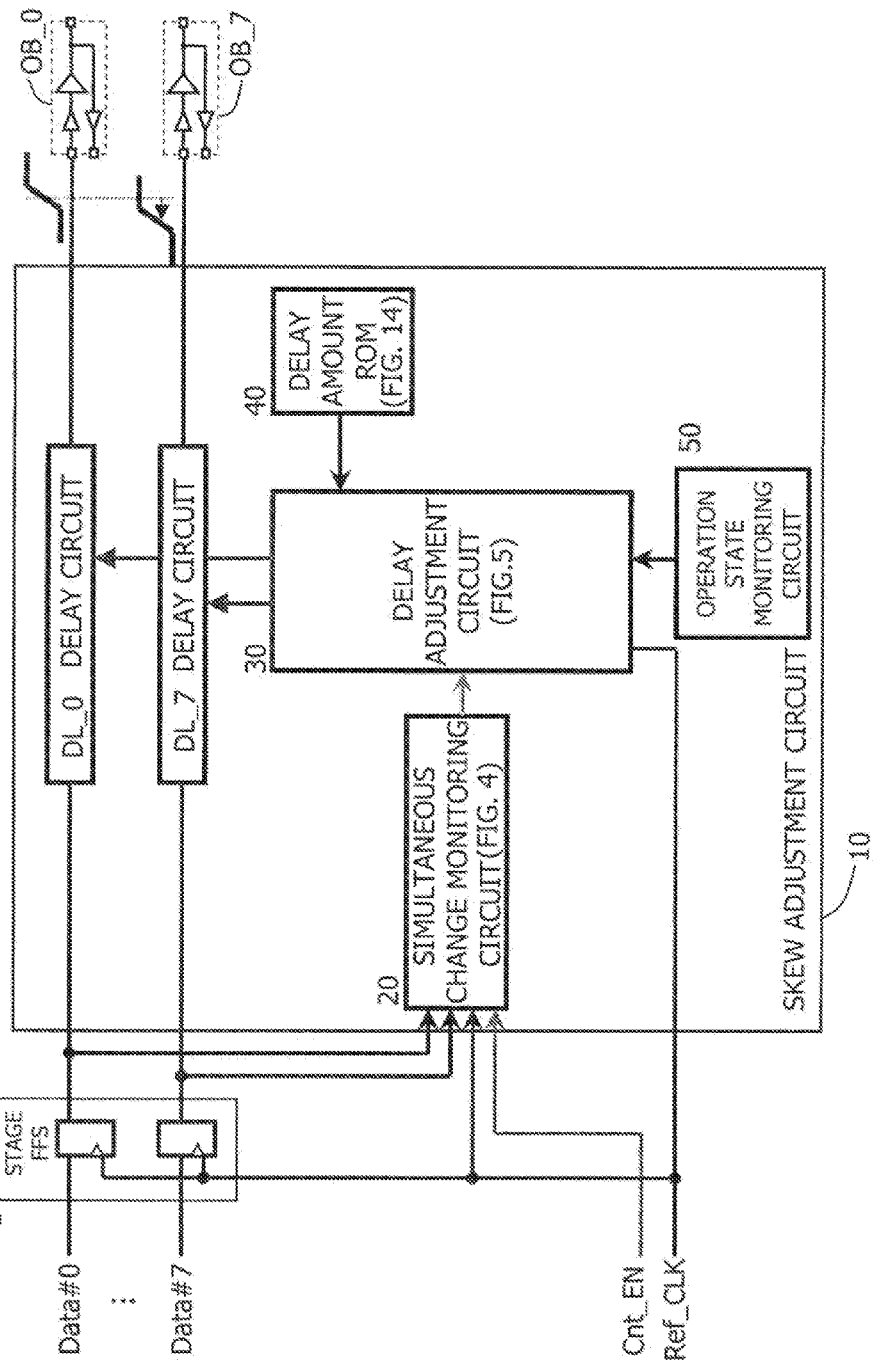
FIG. 12 depicts a modified example of the skew adjustment circuit in the first embodiment.

FIG. 12 depicts a modified example of the skew adjustment circuit in the first embodiment. Differences with the skew adjustment circuit 10 of FIG. 3 are the presence of an operation state monitoring circuit 50, and the fact that the delay amount ROM 40 stores delay amounts corresponding to the number of simultaneous changes and to the operation speed detected by the operation state monitoring circuit. The delay circuits DL_0 to DL_7 are the same as in FIG. 7, and the simultaneous change monitoring circuit 20 is the same as in FIG. 4.

In this modified example, the operation state monitoring circuit 50 monitors speed changes of gates in the LSI occurring due to operation states (variations in process conditions, temperature conditions and voltage conditions), and outputs an operation state signal Fast when the speed is fast, an operation state signal Typical when the speed is typical, and an operation state signal Slow when the speed is slow. And, corresponding to these speeds, the delay ROM 40 stores delay amounts for skew adjustment, and can set delay amounts suited to the operation state in the delay circuits.

Specifically, compared with delay amounts when the speed is typical, the delay amounts in the delay circuits DL when operation is fast are made larger, that is, the number of delay buffers is increased, and the absolute delay times, that is, the absolute skew magnitude, is made equal to the case of typical speeds. Conversely, at low operation speeds the delay amounts in the delay circuits DL are made smaller, that is, the number of delay buffers is decreased, and the absolute delay times, that is, the absolute skew magnitude is made equal to the case of typical speeds.

Causes of variation causing operation speeds to be fast or slow include, first, process conditions such as manufacturing variations with respect to target values when manufacturing a device; second, higher or lower power supply voltages; and third, higher or lower temperatures. As explained above, the delay amount of a delay circuit is a value which provides appropriate skew to reduce simultaneous switching noise, and must be set to a value less than the allowed delay amount. Hence it is desirable that the number of delay buffers of delay circuits be modified according to variations in operation speed.

Figure 13:
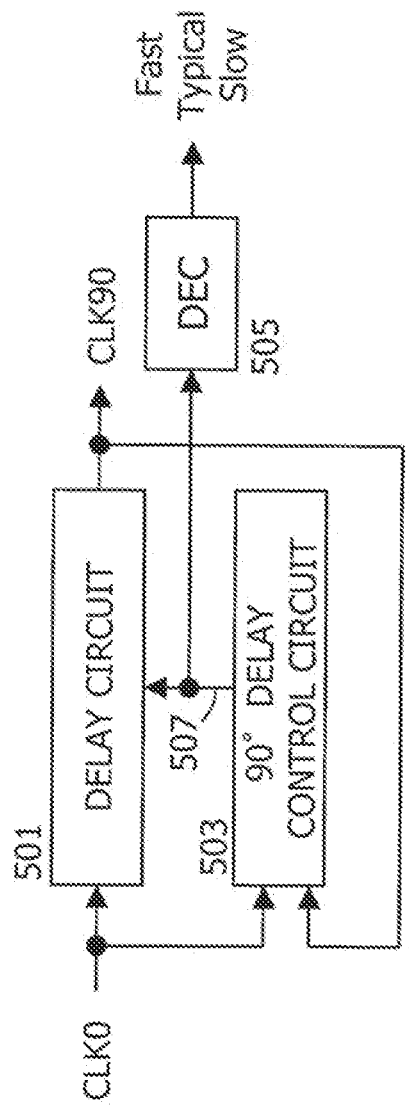
FIG. 13 depicts an example of an operation state monitoring circuit 50.

FIG. 13 depicts an example of an operation state monitoring circuit 50. The operation state monitoring circuit has a delay circuit 501 which delays a clock CLK0 with phase 0° and outputs a clock CLK90 with phase 90°, and a delay control circuit 503 which detects the phase difference between two clocks CLK0 and CLK90 and generates a delay control signal 507 for a delay circuit such that the phase difference becomes 90°. The delay circuit 501 is for example configured equivalently to the delay circuit depicted in FIG. 7. Hence the delay control signal 507 is a control signal which selects signals transmitted through numerous buffers when the LSI gate speed is fast, and which selects signals transmitted through few buffers when the speed is slow. In the example of FIG. 13, this delay control signal 507 is decoded by a decoder 505 and converted into the three operation state signals Fast, Typical and Slow.

As depicted in the delay adjustment circuit 30 of FIG. 5, in this embodiment the operation state signal output by the operation state monitoring circuit 50 is latched by the operation state register 312. The latch timing may be an appropriate timing after the control enable signal Cnt_EN has gone to H. For example, by latching at a timing count value Count=11, synchronization with the comparison operation of the simultaneous change number comparator 307 is possible. The delay adjustment circuit 30 uses an operation state signal in addition to the number of simultaneous changes as the address when referencing the delay amount ROM 40.

FIG. 14 depicts a specific example of delay amount ROM. In the case of this ROM, addresses have, in addition to the simultaneous change monitoring group Gr and number of simultaneous changes, the operation state. And, data is the 4 bits×8=32-bit tap setting values set in the eight delay circuits. Compared with the ROM of FIG. 9, the operation state is added to the addresses, and the tap setting values of FIG. 9 are stored in association with three operation states. The tap setting values associated with the number of simultaneous changes are similar to those of FIG. 9, and the delay circuits set by this means and signals to which skew is added are similar to those of FIG. 10.

However, as depicted in FIG. 14, tap setting values when the operation state is Fast are set to be larger than when the speed is Typical, and tap setting values when the speed is Slow are set to be smaller than when the speed is Typical.

By referencing this delay amount ROM 40, appropriate delay amounts corresponding to the operation state, and also corresponding to the number of simultaneous changes can be set in the delay circuits DL_0 to DL_7.

The delay amount ROM 40 may be rewritable memory. If rewritable memory is used, appropriate delay amounts can be rewritten corresponding to the LSI operating environment, such as for example the AC specifications of other LSIs to which output signals are input, and optimum skew adjustment is possible.

First Embodiment (3)

Figure 15:
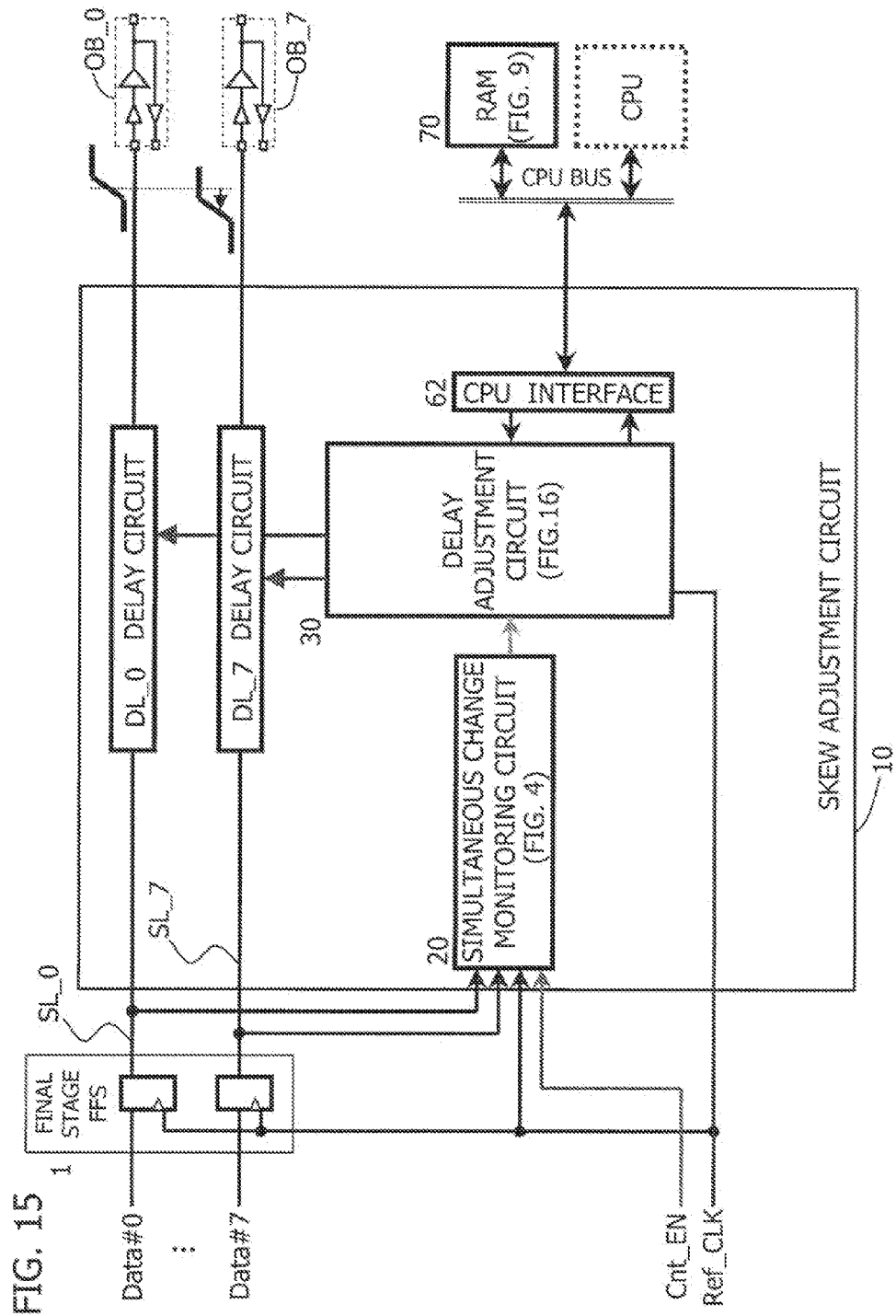
FIG. 15 depicts a second modified example of the skew adjustment circuit in the first embodiment.

FIG. 15 depicts a second modified example of the skew adjustment circuit in the first embodiment. Similarly to FIG. 3, the skew adjustment circuit 10 has a simultaneous change monitoring circuit 20, delay adjustment circuit 30, and delay circuits DL_0 to DL_7. The simultaneous change monitoring circuit 20 has the same configuration as in FIG. 4, and the delay circuits are also the same as in FIG. 7.

However, in contrast with FIG. 3, the memory in which delay amounts are stored is RAM 70 provided outside the LSI, and tap settings of delay circuits are set by an external CPU. Together with this, the delay adjustment circuit 30 of this second modified example has the configuration of FIG. 16, rather than that of FIG. 5. A CPU interface 62 is provided as an interface with an external CPU bus, and interface operations between the delay adjustment circuit 30 and the CPU are performed.

The CPU downloads appropriate optimum delay amounts from RAM 70. By thus making delay amounts in RAM 70 rewritable, delay amounts can be set dynamically to for example conform to the AC specifications of other LSIs and other macros to which signals output from output buffers are to be input.

Further, the RAM 70 and CPU may be provided in common within the LSI. That is, when the LSI is a system LSI, a CPU and RAM are provided within the LSI, and these may be used.

Figure 16:
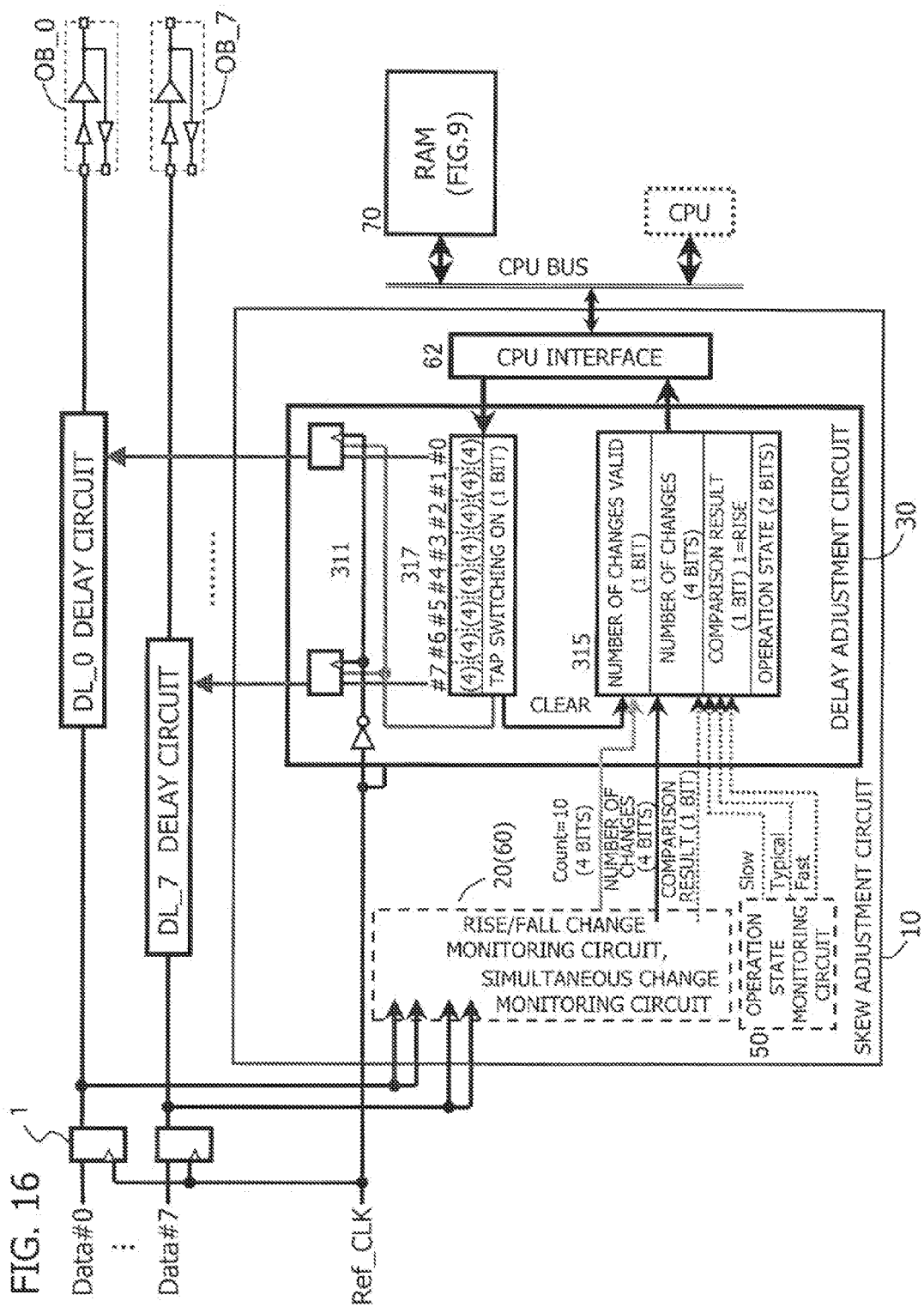
FIG. 16 depicts the delay adjustment circuit of the second modified example.

FIG. 16 depicts the delay adjustment circuit of the second modified example. The delay adjustment circuit 30 has a simultaneous change number register 315 which latches 4-bit change number data output from the simultaneous change monitoring circuit 20 with the timing of the timing count value Count=10, a delay setting register 317 which stores tap values corresponding to delay amounts from RAM 70 via the CPU interface 62, and a tap setting register 311 which stores tap values stored in the delay setting register 317 in response to the inverter 310 (falling edge of the reference clock Ref_CLK). The configuration of the simultaneous change monitoring circuit 20 is the same as in FIG. 4.

The simultaneous change monitoring circuit 20, is as explained in FIG. 4 and FIG. 6, outputs the number of simultaneous changes at timing count value Count=8. The change number register 315 within the delay adjustment circuit 30 of FIG. 16 captures change number data at timing count value Count=10, and upon capture a change number valid bit is set to valid "1".

The CPU periodically checks this change number valid bit via the CPU interface 62, and when this valid bit becomes valid "1", reads out the change number data from the change number register 315. The CPU uses this change number data as an address to read out the tap value (32 bits of setting codes S_CODE for the delay circuits) corresponding to delay amounts stored in delay amount RAM 70, writes this to the delay setting register 317 via the CPU interface 62, and when writing ends, sets a tap switching on bit in the delay setting register to valid "1".

When this tap switching on bit becomes valid "1", the tap setting register 311 latches the setting codes of the delay setting register 317 in response to the falling edge of the reference clock Ref_CLK, and completes setting of the delay amounts of the delay circuits DL_0 to DL_7. Together with this, when the tap switching on bit becomes valid "1", the change number valid bit of the change number register 315 is cleared to "0". Further, when delay amount settings are completed the tap switching on bit is also cleared to "0". Thereafter, so long as this valid bit is cleared to "0", the CPU does not read out tap setting values from memory and make settings.

An example of the configuration of RAM 70 is the same as in FIG. 9. That is, an address has a simultaneous change monitoring group Gr and number of simultaneous changes, and the tap value (32 bits of setting codes S_CODE for the delay circuits) corresponding to this is stored as data.

In this way, RAM 70 is memory controlled by the CPU, and data for delay amounts conforming to the AC specifications of other LSIs or other macros to which output signals from output buffers are supplied is downloaded as appropriate by the CPU. Hence the timing of setting of tap values in delay circuits corresponding to the number of simultaneous changes is controlled by the CPU rather than by the timing count value Count.

First Embodiment (4)

Figure 17:
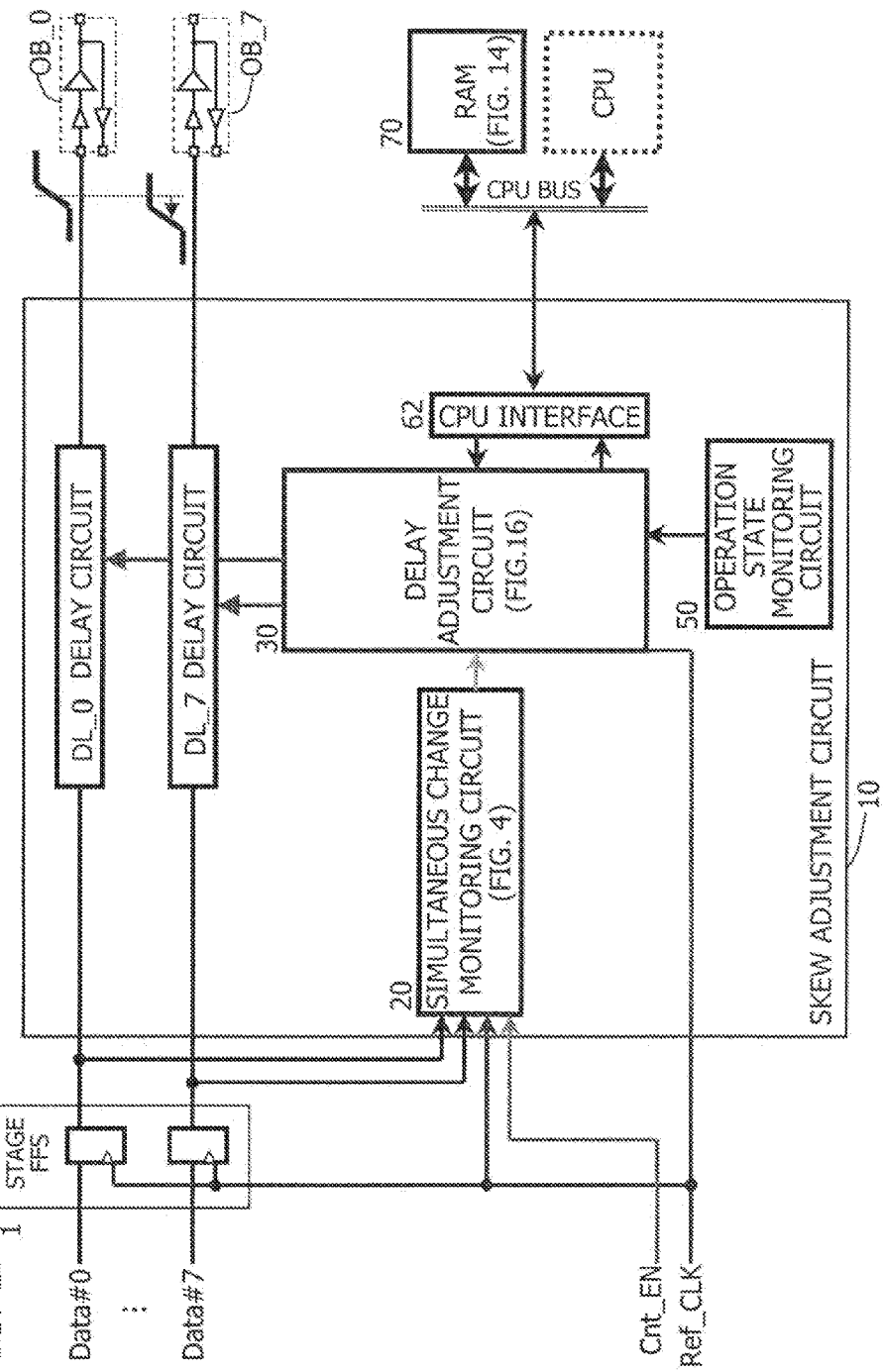
FIG. 17 depicts a third modified example of the skew adjustment circuit in the first embodiment.

FIG. 17 depicts a third modified example of the skew adjustment circuit in the first embodiment. This third modified example differs from the second modified example of FIG. 15 in that the skew adjustment circuit 10 has an operation state monitoring circuit 50. The simultaneous change monitoring circuit 20 is the same as in FIG. 4, and the delay circuits DL_0 to DL_7 are the same as in FIG. 7.

The delay adjustment circuit 30 is as depicted in FIG. 16, and differs from the second modified example in that the operation state signal from the operation state monitoring circuit 50 is latched by the change number register 315 at timing count value Count=10. And, when the change number valid bit becomes valid "1", the CPU uses the number of simultaneous changes and the operation state signal as an address to read out the tap value for delay amounts in delay amount RAM 70, and sets this in the delay setting register 317. Thereafter operation is the same as in the second modified example.

An example of the configuration of delay amount RAM 70 is the same as in FIG. 14; addresses have operation state data in addition to the simultaneous change monitoring group Gr and number of simultaneous changes. Hence separate delay amounts are stored corresponding to three operation states.

As explained above, in the first embodiment the skew adjustment circuit monitors the number of simultaneous changes within a monitoring period of for example 8 signal lines in which the number of simultaneous changes is to be monitored, and the larger the number of simultaneous changes, the larger the number of groups into which the 8 signal lines are divided, with different delay amounts set for each. By this means, simultaneous switching noise due to simultaneous changes can be suppressed.

Second Embodiment

In the first embodiment, the number of simultaneous changes was monitored regardless of whether the signal changes in the plurality of signal lines were rises or falls, and delay amounts were imparted to signal lines according to the number of changes. However, even when changes occur simultaneously, power supply noise occurs for rising signal levels, and ground noise occurs for falling signal levels. Hence even when signal changes occur simultaneously in all 8 signal lines, when there is 1 rise and 6 falls, it is ground noise, for which the number of changes causing simultaneous switching noise is greater, that is a problem, and so it is sufficient to perform skew adjustment for the 6 signal lines in which falls occur. Further, there are cases in which an LSI is resistant to power supply noise, and cases in which an LSI is resistant to ground noise. Hence there are cases in which it is desirable to appropriately select delay amounts according to whether simultaneous changes are rising-side or falling-side changes, and according to the resistance thereto.

In the second embodiment, the skew adjustment circuit has a rise/fall change monitoring circuit, the number of simultaneous rising changes and the number of simultaneous falling changes are detected, and the optimum delay amounts are decided according to the detection results.

Figure 18:
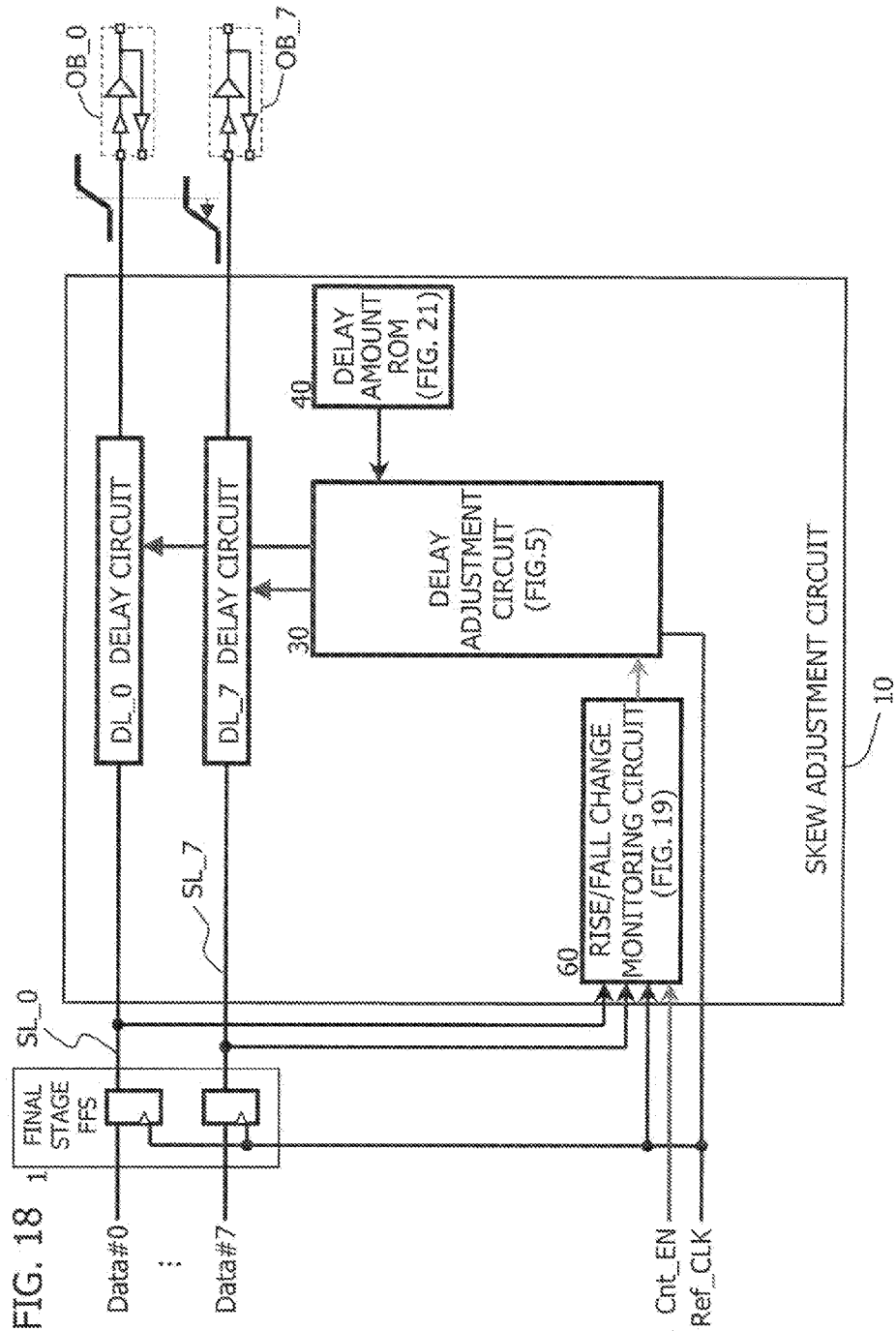
FIG. 18 is the skew adjustment circuit in a second embodiment.

FIG. 18 is the skew adjustment circuit in the second embodiment. The skew adjustment circuit 10 has a rise/fall change monitoring circuit 60, a delay adjustment circuit 30, and delay amount ROM 40. Further, the skew adjustment circuit 10 has delay circuits DL_0 to DL_7 for each of the plurality of signal lines SL_0 to SL_7, and the delay amounts are set by the delay adjustment circuit 30.

The rise/fall change monitoring circuit 60 monitors simultaneous rising changes and falling changes in the 8 signal lines SL_0 to SL_7, takes the greater of the number of rising and number of falling changes to be the number of simultaneous changes, and supplies this together with rising or falling data to the delay adjustment circuit 30. And, the delay adjustment circuit 30 uses this number of simultaneous changes and the rising or falling data as an address to read out the tap value (setting codes) corresponding to delay amounts from the delay amount ROM 40, and sets the tap value as delay amounts for the delay circuits.

Figure 19:
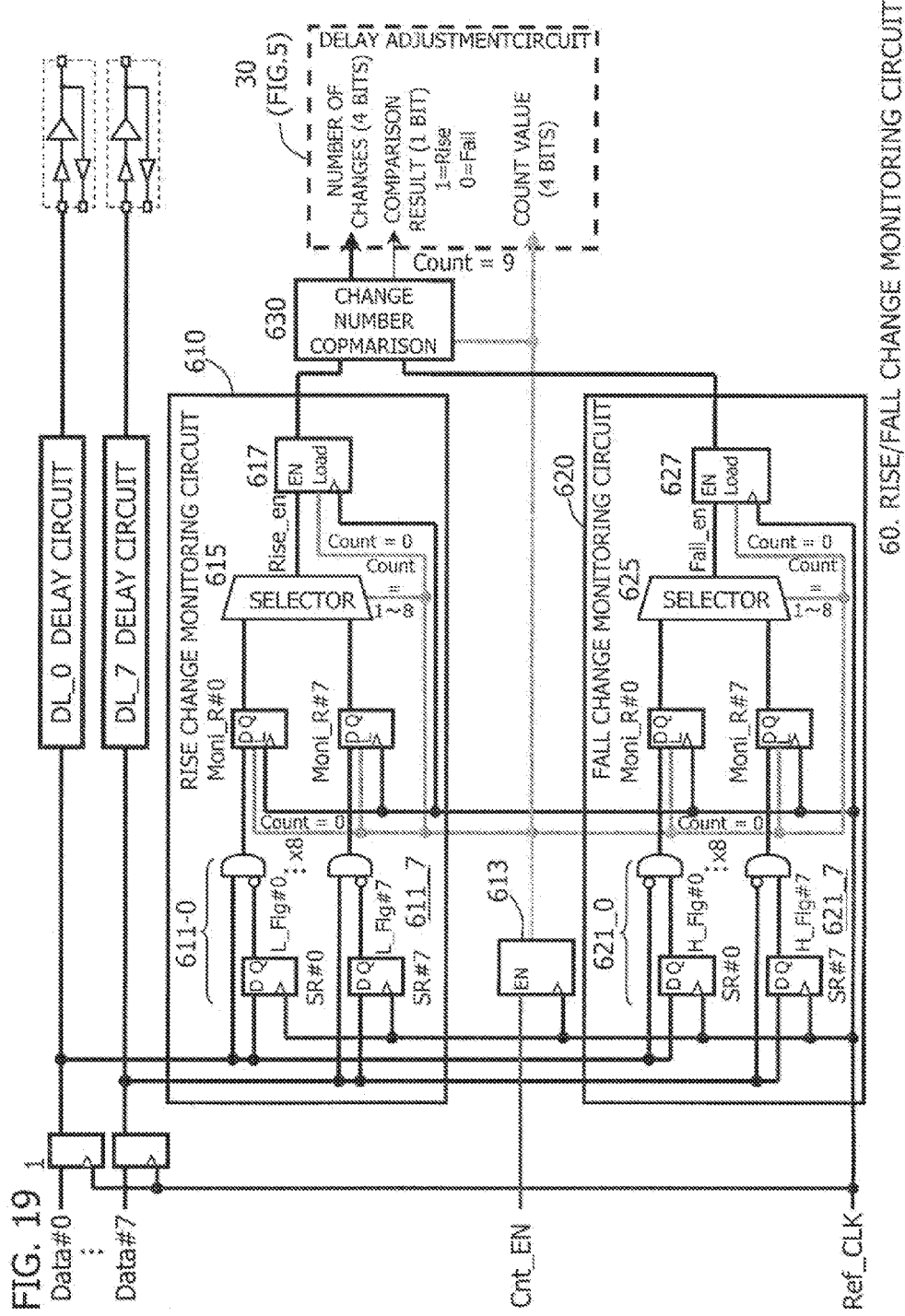
FIG. 19 depicts the rise/fall change monitoring circuit 60.

FIG. 19 depicts the rise/fall change monitoring circuit 60. The rising change monitoring circuit 610 detects rising changes occurring in the 8 signal lines during the monitoring period corresponding to one period of the reference clock, and counts the number thereof. To this end, each of the 8 signal lines SL_0 to SL_7 has a rising change detection circuit 611_0 to 611_7.

The rising change detection circuit 611_0 has a register SR#0 which latches the signal of the signal line in response to the reference clock Ref_CLK, and an AND gate which computes the AND value of the signal line signal and the inverted output of the register SR#0. When the signals of the signal lines SL_0 to SL_7 change from L level to H level, in response to the subsequent reference clock Ref_CLK, the AND gate generates a rise detection pulse having a pulse width from the signal change until the reference clock.

The monitoring result holding registers Moni_R#0 to Moni_R#7 latch the detection pulse of the AND gate when the count value Count output by the timing generation counter 613 becomes 0. And the selector 615 selects in order the monitoring result holding registers Moni_R#0 to Moni_R#7 corresponding to the timing of the count value Count from 1 to 8, and a rising change counter 617 counts the rising enable signals Rise_en=1 output by the selector, and outputs the counted number of changes to the change number comparator 620. This rising change counter 617 is reset when the count value Count=0, and thereafter begins counting, and counts rising enable signals Rise_en=1 in response to the reference clock Ref_CLK.

On the other hand, the falling change monitoring circuit 620 detects falling changes occurring in the 8 signal lines during a monitoring period, and counts the number of changes. To this end, each of the 8 signal lines SL_0 to SL_7 has a falling change detection circuit 621_0 to 621_7.

The falling change detection circuit 621_0 has a register SR#0 which latches the signal of the signal line in response to the reference clock Ref_CLK, and an AND gate which computes the AND value of the inverted signal line signal and the non-inverted output of the register SR#0. When the signals of the signal lines SL_0 to SL_7 change from H level to L level, in response to the subsequent reference clock Ref_CLK, the AND gate generates a fall detection pulse having a pulse width from the AND gate signal change until the reference clock.

The remaining configuration is similar to that of the rising change monitoring circuit 610; the monitoring result holding registers Moni_R#0 to #7 latch the falling change at the count value Count=0, the selector 625 performs parallel/serial conversion at the count values Count=1 to 8, and the falling change counter 627 counts.

The change number comparator 630 compares the number of rising changes and the number of falling changes with the timing of count value Count=9, and outputs the greater number of changes, and a comparison result indicating which is greater, to the delay adjustment circuit 30.

In this way, the rise/fall change monitoring circuit 60 detects the number of rising changes and the number of falling changes in the 8 signal lines once in 16 cycles of the count value Count generated by the timing generation counter 613, and outputs the greater number of changes and the comparison result indicating whether there were more rising or falling changes.

The delay adjustment circuit 30 of FIG. 18 is depicted in FIG. 5. In FIG. 5, the number of changes and comparison result of the rise/fall change monitoring circuit 60 are supplied to the delay adjustment circuit 30, and these are held by the change number holding register 301 with the timing of count value Count=10. Thereafter the comparison operation of the change number comparator 307, readout from the delay ROM 40, setting of readout data in the setting tap information register 309, and update of the tap setting register 311, are the same as in the operations of FIG. 5.

FIG. 20 depicts the format of delay amount ROM 40. In addition to the group Gr for simultaneous change monitoring and the number of changes, the address in delay amount ROM has the comparison result (rise or fall). And, tap setting values (32-bit setting codes) for delay circuits corresponding to these addresses are stored as data. That is, tap setting values are stored in the delay amount ROM according to the number of simultaneous changes, and according to whether the simultaneous changing signals are rising (Rise) or falling (Fall).

FIG. 21 depicts a specific example of delay amount ROM 40. As can be understood upon comparison with the specific example of delay amount ROM depicted in FIG. 9, the ROM in FIG. 21 stores tap setting values (32-bit setting codes) corresponding to cases in which the comparison result is rising changes (Rise) and falling changes (Fall), in addition to the group Gr for simultaneous change monitoring and the number of simultaneous changes, as the address. According to the data examples in FIG. 21, the same tap setting values are used for rising (Rise) and falling (Fall) changes, but the tap setting value may for example be set to larger delay amounts for rising changes.

Delay amounts corresponding to the number of simultaneous changes stored in this delay amount ROM 40 are the same as in FIG. 9, and delay amounts are set so as to induce skew as depicted in FIG. 10 according to the number of simultaneous changes which are either rising or falling changes, whichever is more numerous. That is, appropriate delay amounts can be set corresponding to rising and to falling changes. Further, delay amounts are set to less than the allowed delay amounts depicted in FIG. 11.

Hence the delay adjustment circuit 30 uses as an address the group Gr, number of simultaneous changes, and comparison result to read a tap setting value for the delay circuits from the delay amount ROM 40, and sets the value in the setting tap information register 309. Ad with the timing of the count value Count=15, the set tap value is used to update the tap setting register 311 in synchronization with the falling edge of the reference clock Ref_CLK.

In the second embodiment, in contrast with the first embodiment, delay amounts are set in delay circuits according to the number of simultaneous rising or falling changes. Hence the number of detected simultaneous changes is smaller than when the number of simultaneous changes is the number of both rising and falling changes. Thus it is sufficient to perform the minimum necessary skew adjustment corresponding to this number of simultaneous changes. Further, optimum delay amounts can be set according to both rising changes and falling changes.

Second Embodiment (2)

Figure 22:
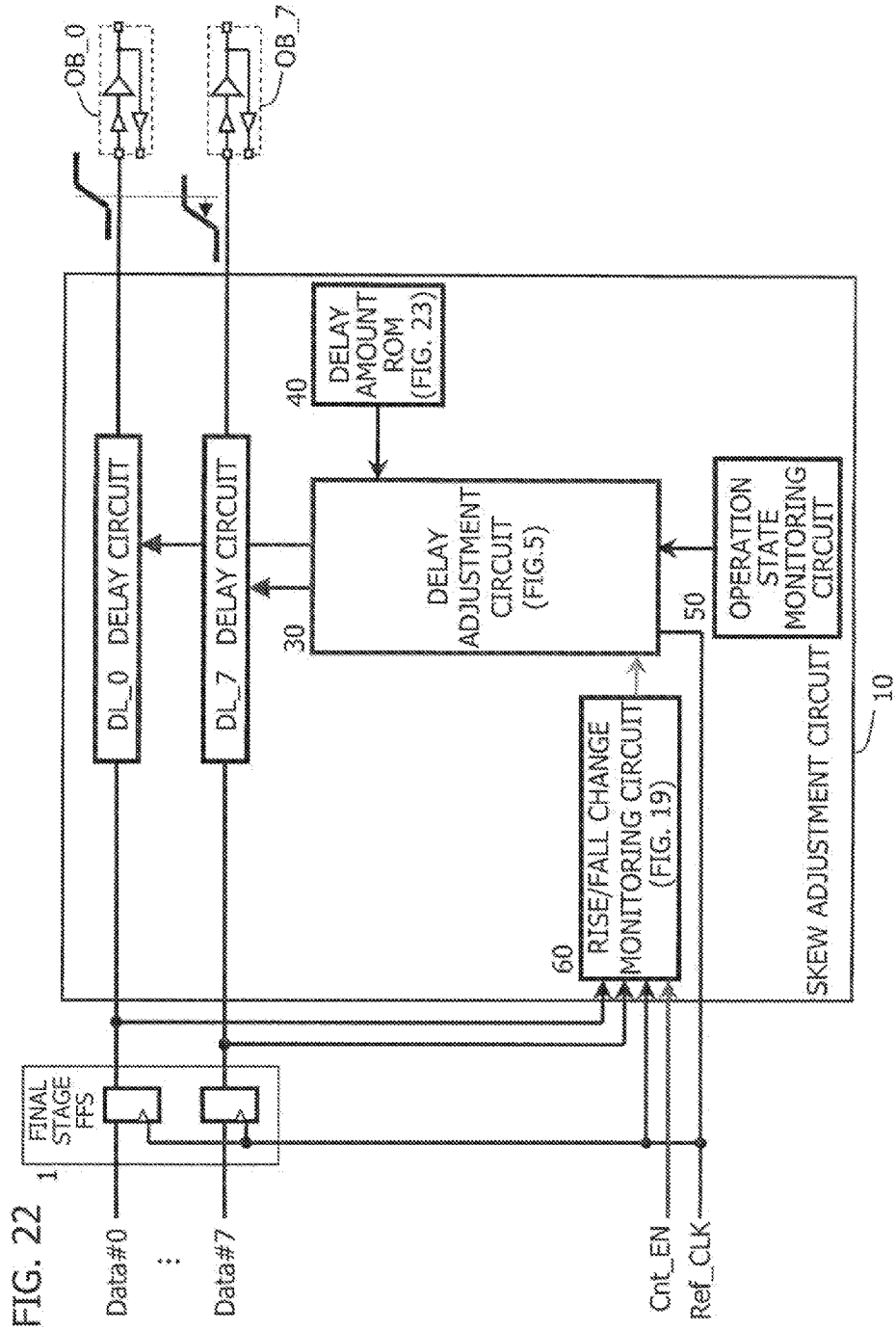
FIG. 22 depicts a first modified example of the skew adjustment circuit in the second embodiment.

FIG. 22 depicts a first modified example of the skew adjustment circuit in the second embodiment. This skew adjustment circuit 10 has, in addition to the configuration of FIG. 18, an operation state monitoring circuit 50. And, the rise/fall change monitoring circuit 60 is the circuit depicted in FIG. 19, and the delay adjustment circuit 30 is the circuit depicted in FIG. 5. The operation state monitoring circuit 50 is the circuit depicted in FIG. 13.

FIG. 23 depicts a specific example of delay amount ROM 40. This delay amount ROM 40 differs from FIG. 21 in that an operation state signal output by the operation state monitoring circuit 50 is included in the address. Otherwise the configuration is the same as in FIG. 21. The tap setting values when the operation state signal is Fast is a value enabling larger delay amount settings; conversely, the tap setting value when the operation state signal is Slow is a value enabling smaller delay amount settings. Setting of delay amounts for these operation state signals is the same as the delay amounts for the ROM of FIG. 14.

Further, in the example of FIG. 23 the delay amounts corresponding to Rise and Fall are the same, but it is preferable that these delay amounts be made different according to the LSI characteristics.

Second Embodiment (3)

FIG. 24 depicts a second modified example of the skew adjustment circuit in the second embodiment. This skew adjustment circuit 10 sets delay amounts by referencing the delay amount RAM 70 of an external LSI. And, a CPU external to the LSI reads out delay amounts from the delay amount RAM 70 and sets tap setting values for the delay circuits. Further, the CPU appropriately downloads and stores in RAM 70 delay amounts corresponding to the AC specifications of the other LSI or other macro within the LSI to which output signals from the output buffers are to be input.

And, the rise/fall change monitoring circuit 60 is the circuit depicted in FIG. 19, and the delay adjustment circuit 30 is the circuit depicted in FIG. 16. Further, a specific example of the delay amount RAM 70 is the same as the specific example of FIG. 21.

Tap setting operations for delay circuits by the CPU for the delay adjustment circuit 30 are as explained in FIG. 16.

Second Embodiment (4)

Figure 25:
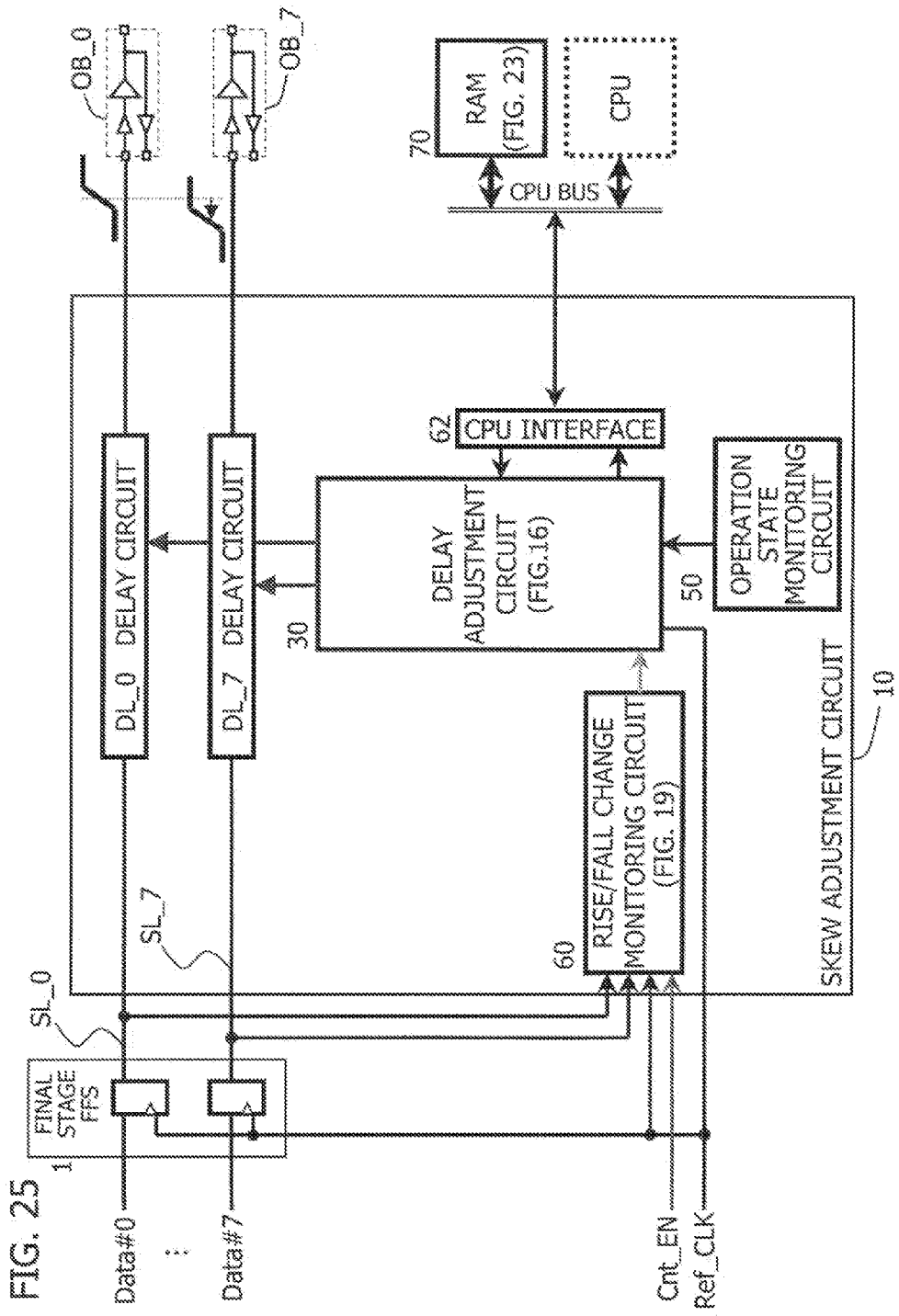
FIG. 25 depicts a third modified example of the skew adjustment circuit in the second embodiment.

FIG. 25 depicts a third modified example of the skew adjustment circuit in the second embodiment. This skew adjustment circuit 10 has, in addition to the configuration of FIG. 24, an operation state monitoring circuit 50. And, the rise/fall change monitoring circuit 60 is the circuit depicted in FIG. 19, the delay adjustment circuit 30 is the circuit depicted in FIG. 16, and a specific example of the delay amount RAM 70 is the same as FIG. 23. Further, the operation state monitoring circuit 50 is the circuit depicted in FIG. 13.

As explained above, by means of the skew adjustment circuit of the second embodiment, the number of simultaneous changes of signals in signal lines is divided into rising and falling changes, which are monitored, and delay amounts are set according to information on the greater number of simultaneous changes. Hence more appropriate delay amounts can be set based on more precise monitoring results. Further appropriate delay amounts can be set for both rising changes and for falling changes.

Third Embodiment

Figure 26:
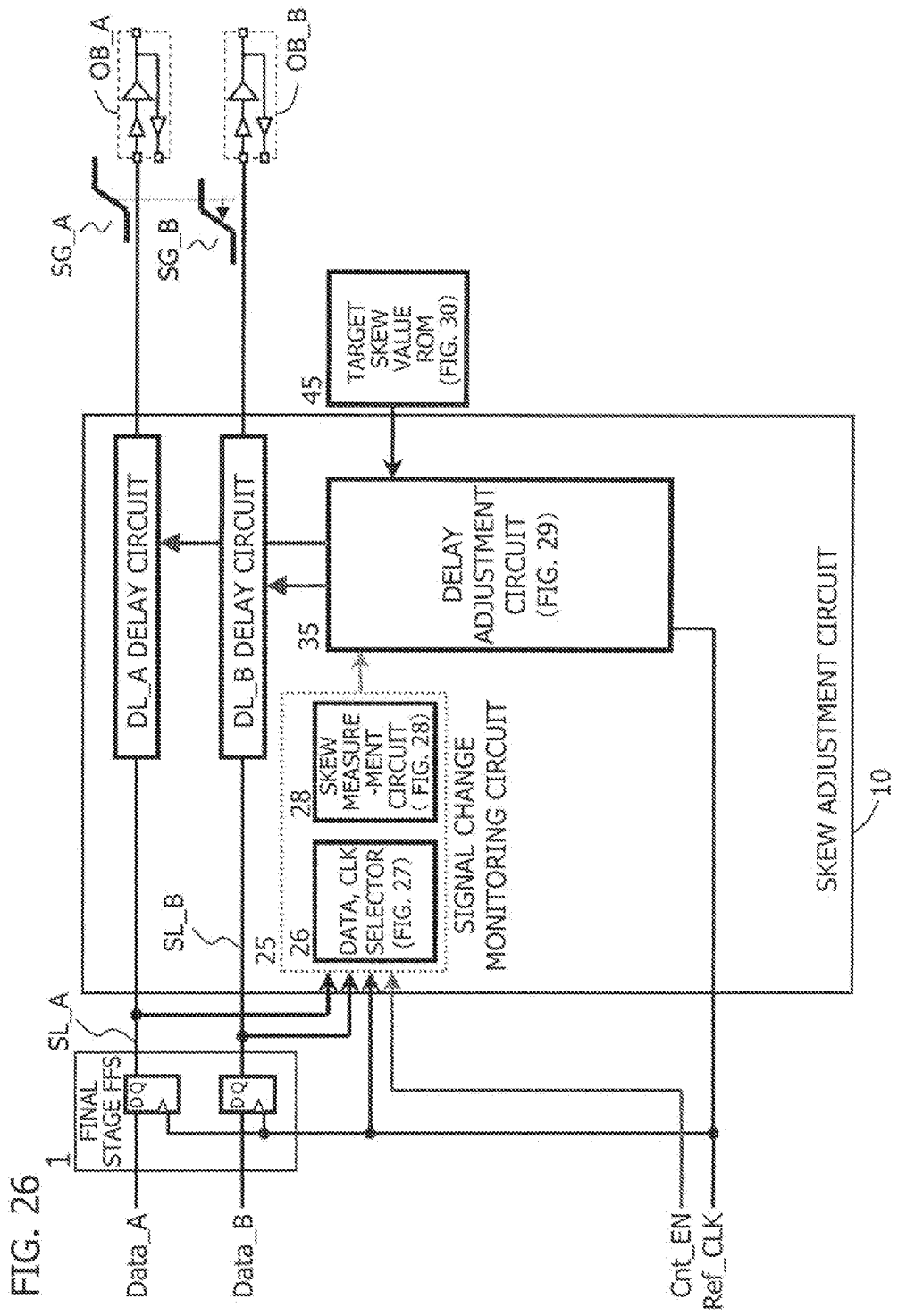
FIG. 26 depicts the skew adjustment circuit of a third embodiment.

FIG. 26 depicts the skew adjustment circuit of a third embodiment. FIG. 26 depicts the configuration of the LSI output portion, which has a final-stage flip-flop 1 which latches two data signals Data_A and Data_B in respect to the reference clock Ref_CLK, two signal lines SL_A and SL_B each connected to the output terminal Q of the flip-flop 1, and output buffers OB_A and OB_B which inputs the signals SG_A and SG_B transmitted in the respective signal lines and outputs the signals to another external LSI or to another macro within the LSI. In the figure, in addition to the buffer circuits which output signals in the output buffers OB_A and OB_B, input buffers which input signals are also depicted. That is, OB_A and OB_B depicted in the figure are input/output buffers.

In the skew adjustment circuit 10, delay circuits DL_A and DL_B are provided immediately before the output buffers OB_A and OB_B of two signal lines SL_A and SL_B. As explained above, by adjusting the delay amounts of these delay circuits, an appropriate skew is induced in the signals SG_A and SG_B transmitted in the signal lines SL_A and SL_B. By this means, the switching timing in the output buffers is shifted, and the occurrence of noise due to simultaneous switching is suppressed.

The control enable signal Cnt_EN is generated by a circuit not depicted, and in initialization operation of the system of the skew adjustment circuit, when a stable system clock is input and a stable internal reference clock Ref_CLK is generated, the control enable signal Cnt_EN goes to H level. In response to this control enable signal Cnt_EN=H, skew adjustment operation by the skew adjustment circuit 10 is begun.

The control enable signal Cnt_EN can be configured so as to be controlled from a higher-level system to assume an enabled state (H level) and a disable state (L level). By means of such a configuration, the skew adjustment circuit is caused to operate automatically at the time of power-on startup or at similar times after initialization, to perform skew adjustment, after which operation of the skew adjustment circuit can be stopped. Further, when the LSI temperature has risen the control enable signal Cnt_EN can be put into the enabled state to perform skew adjustment, and can then be put into the disabled state. By controlling the operation and halting of the skew adjustment circuit in this way, wasteful current consumption would be avoided.

The skew adjustment circuit 10 has a signal change monitoring circuit 25 which monitors skew between signals in level changes from L level to H level (rises) and level changes from H level to L level (falls) in the signals SG_A and SG_B transmitted through two signal lines. When the skew between the signals is small or is zero, power supply noise or ground noise due to simultaneous switching in output buffers may result.

The signal change monitoring circuit 25 has a selector 26 which selects either the data or the clock of the first and second signals SG_A and SG_B transmitted through the first and second signal lines SL_A and SL_B, and a skew measurement circuit 28 which measures the skew between the data and clock output by the selector 26. The skew measurement circuit 28, described below, is premised on the assumption that the clock is earlier than the data when measuring skew. Hence the skew measurement circuit 28 measures skew assuming that the one of the first and second signals is data, and the other is the clock, and when some skew is detected, in addition to the skew value the earlier among the first and second signals is also detected. The skew measurement circuit measures skew assuming that one of the first and second signals is the data and the other is the clock, and when skew is not detected, causes the selector to output the one of the first and second signals as the clock and the other as the data, and again measures the skew.

The skew adjustment circuit 10 further has a delay adjustment circuit 35, and the delay adjustment circuit 35 decides the delay amounts of the first and second delay circuits DL_A and DL_B based on the skew (measured skew) between the first and second signals measured by the skew measurement circuit 28, and sets the delay amounts thus decided in the first and second delay circuits DL_A and DL_B. The delay adjustment circuit 35 in the third embodiment references the ROM 45 storing target skews for the first and second signals SG_A and SG_B transmitted by the signal lines SL_A and SL_B for skew adjustment, and decides the delay amounts of the delay circuits DL_A and DL_B as the difference between the read-out target skew and the skew measured by the skew measurement circuit 28, and sets the delay amounts decided in these delay circuits.

Figure 56:
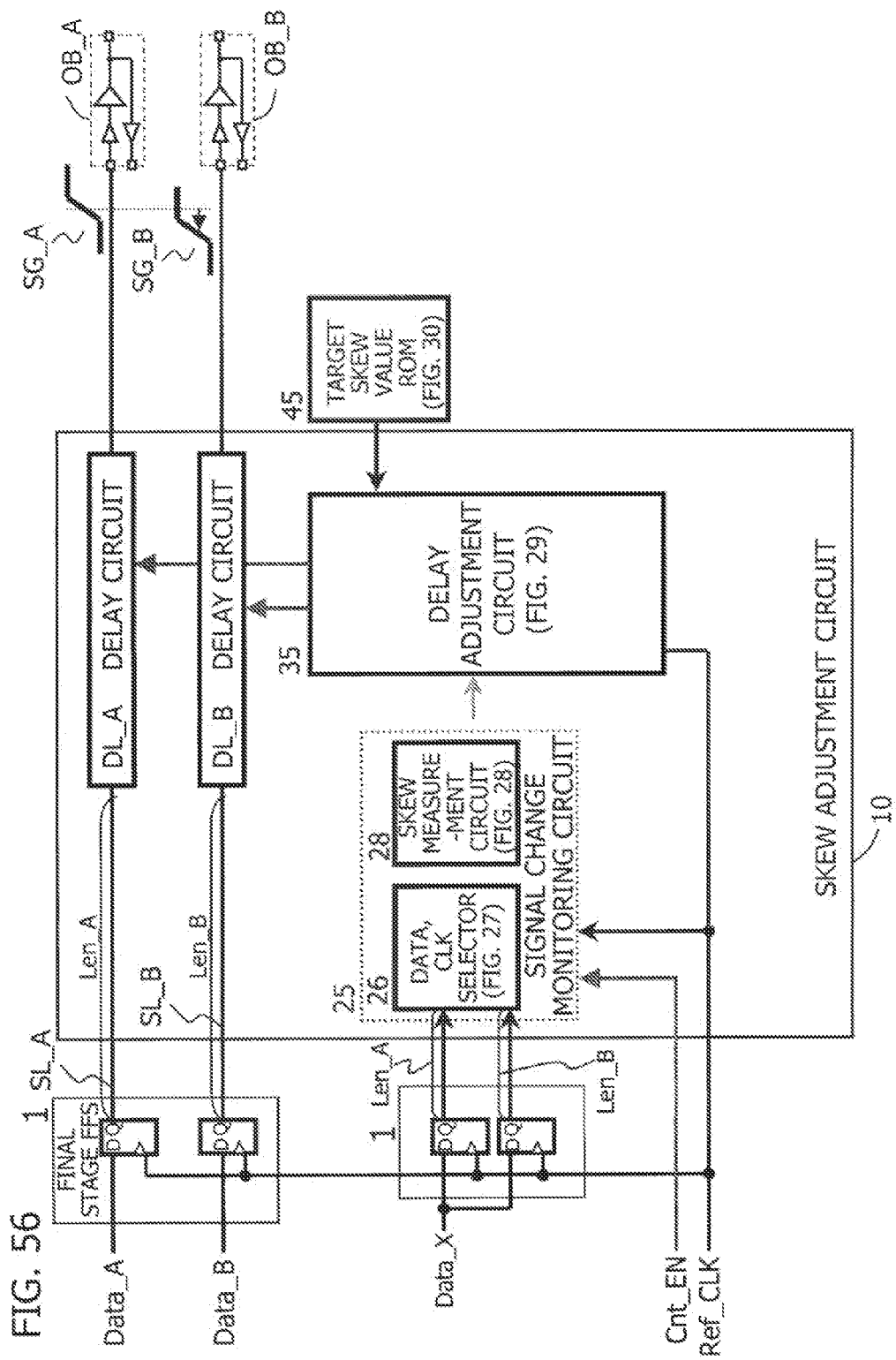
FIG. 56 depicts a modified example of the skew adjustment circuit of FIG. 26.

FIG. 56 depicts a modified example of the skew adjustment circuit of FIG. 26. In this modified example, similarly to data Data_A and Data_B, data Data_X is capture by the final-stage flip-flop 1 in synchronization with the reference clock Ref_CLK, and is transmitted in a signal line having the same length as the signal lines SL_A and SL_B of data Data_A and Data_B, for input to the signal change monitoring circuit 25. The timing of reference clock Ref_CLK for capturing data Data_X and the signal line from the final-stage flip-flop 1 to the signal change monitoring circuit 25 differ, but skew equivalent to that of data Data_A and Data_B can be measured. The precision of the skew measured in this way is inferior to that of FIG. 26, but data Data_X is latched by two flip-flops, and so in the signal change monitoring circuit 25, the two signals are input on the same rising edge having skew. Hence skew measurement is easier than when using data Data_A and Data_B.

Figure 27:
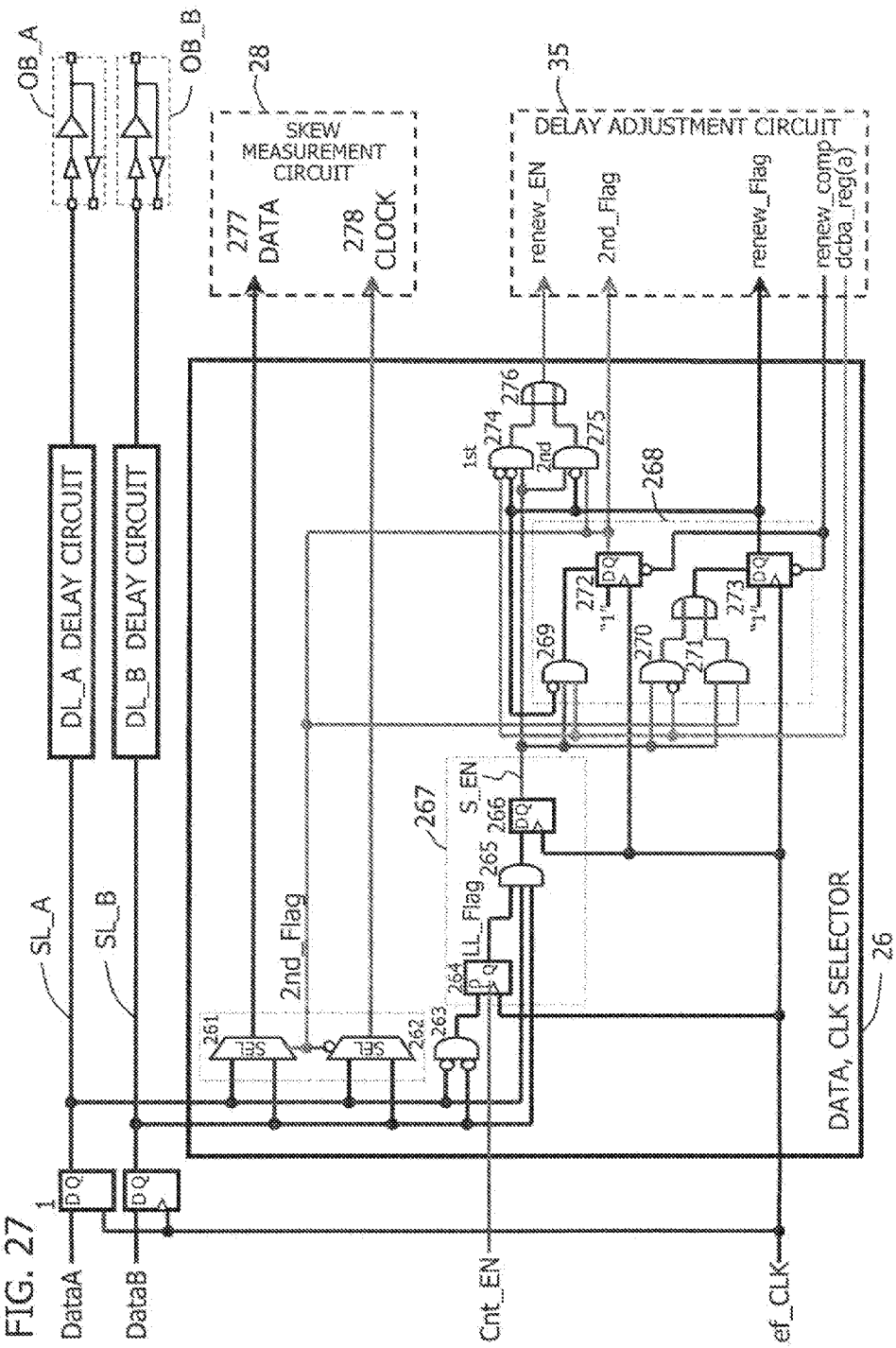
FIG. 27 depicts the selector 26 within the signal change monitoring circuit 25.

FIG. 27 depicts the selector 26 within the signal change monitoring circuit 25. The selector 26 selects one of the pair of signals SL_A, SL_B for skew adjustment as data and selects the other as a clock, and outputs these to the skew measurement circuit 28. When the skew measurement circuit 28 cannot appropriately detect skew, because the data is earlier than the clock or for some other reason, the selector 26 interchanges the signals of the signal lines SL_A, SL_B, selecting the one as the clock and the other as data, and outputs these to the skew measurement circuit 28. In this case, a second flag 2nd_Flag indicating that interchange has been performed is set to "1", to notify the skew measurement circuit 28. By this means the skew measurement circuit 28, by referencing the second flag 2nd_Flag, can judge which of the first and second signals SG_A, SG_B is output as data and which as the clock.

The selector 26 has selectors 261, 262 which select one of the signals SG_A, SG_B of the signal lines SL_A, SL_B as data 277 and which select the other as the clock 278 based on the second flag 2nd_Flag. And, the selector 26 has an AND gate 263 which detects when the signals SG_A, SG_B are both "0" (L level), and a simultaneous rise detection circuit 267 which, in response to the reference clock Ref_CLK after the control enable signal Cnt_EN has gone to "1" (H level), detects when both the signals SG_A, SG_B rise, and sets a simultaneous rise detection signal S_EN to "1". Also provided are a flag generation circuit 268 which generates the second flag 2nd_Flag and a renew flag renew_Flag, and AND gates 274, 275 and an OR gate 276 which generate a renew enable signal renew_EN based on the simultaneous rise detection signal S_EN at the time of the first skew measurement and at the time of the second skew measurement. Further, a skew measurement result dcba_reg(a) and an update complete signal renew_comp are supplied from the delay adjustment circuit 35, and based on these signals a control signal renew_EN, 2nd_Flag, and renew_Flag are generated corresponding to the first skew measurement and second skew measurement. Specific operation of these is explained in detail below.

Figure 28:
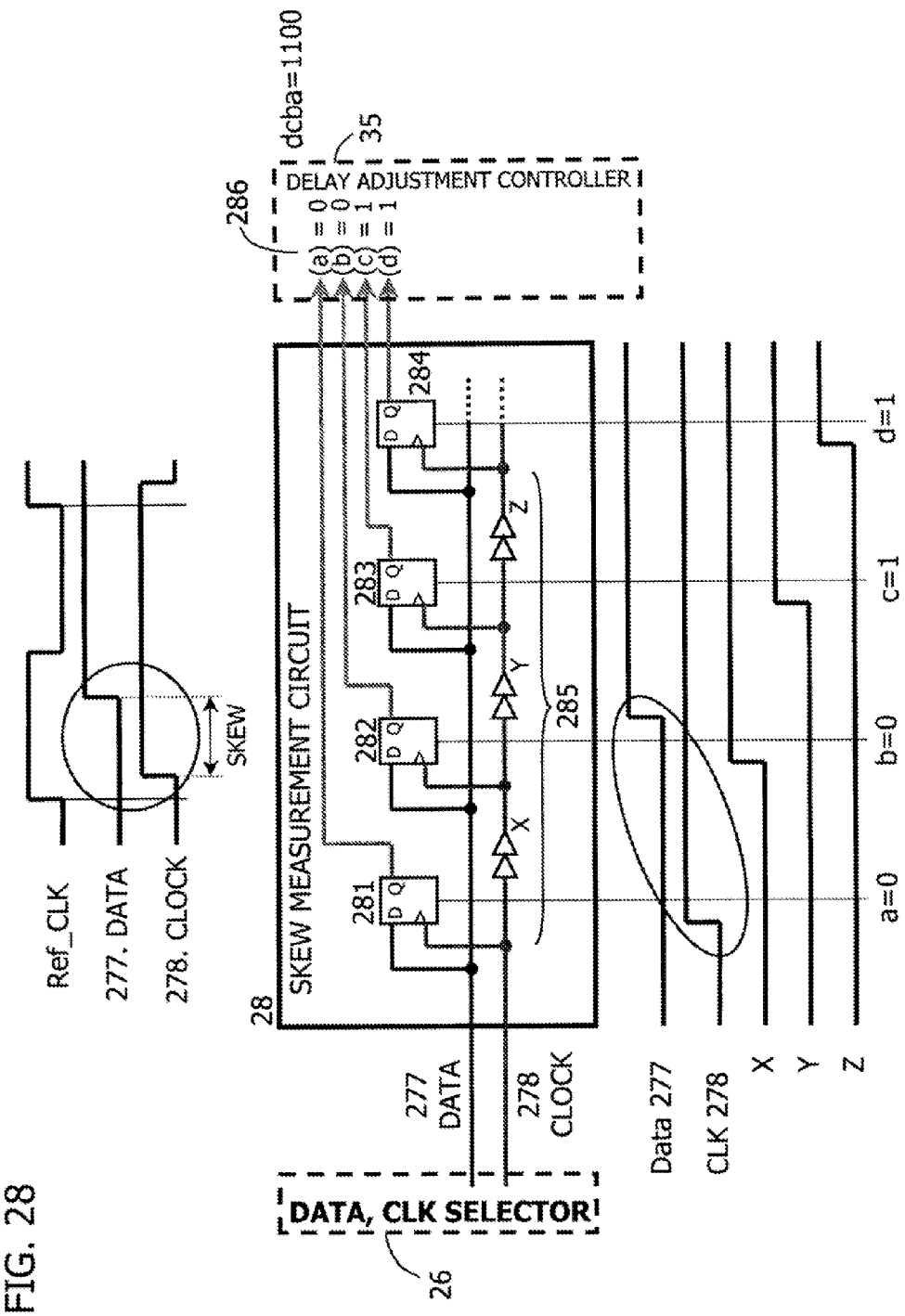
FIG. 28 depicts the skew measurement circuit 28 within the signal change monitoring circuit 25.

FIG. 28 depicts the skew measurement circuit 28 within the signal change monitoring circuit 25. As depicted in the upper portion of FIG. 28, the skew measurement circuit 28 measures the skew between the two signals with the premise that the clock 278 has earlier timing than the data 277.

FIG. 28 depicts the skew measurement circuit 28, and the lower portion of FIG. 28 depicts signal waveforms illustrating circuit operation. The skew measurement circuit 28 has a plurality of latch circuits 281 to 284 which take as input the data 277 at the respective data input terminals D, and a clock supply circuit 285 which delays the clock 278 and inputs the clock to the clock terminals of the latch circuits. The clock supply circuit 285 has a plurality of buffers, and the signals X, Y, Z at nodes are input to the clock terminals of the latch circuits 282, 283, 284.

As depicted in FIG. 28, the skew between the clock 278 and data 277, which are one or the other of the two signals SG_A and SG_B, is output as measured skew data 286 (dcba) output by data outputs Q of the latch circuits 281 to 284. In the example of FIG. 28, the measured skew data dcba=1100. This measured skew data dcba indicates larger skew values for a greater number of zeros. Hence when the measured skew data dcba=1100, the skew value is smaller than when dcba=1000. The fact that the magnitude relation between measured skew data dcba is the opposite of the magnitude relation between skew values is born in mind when considering the delay adjustment circuit, described below.

Figure 29:
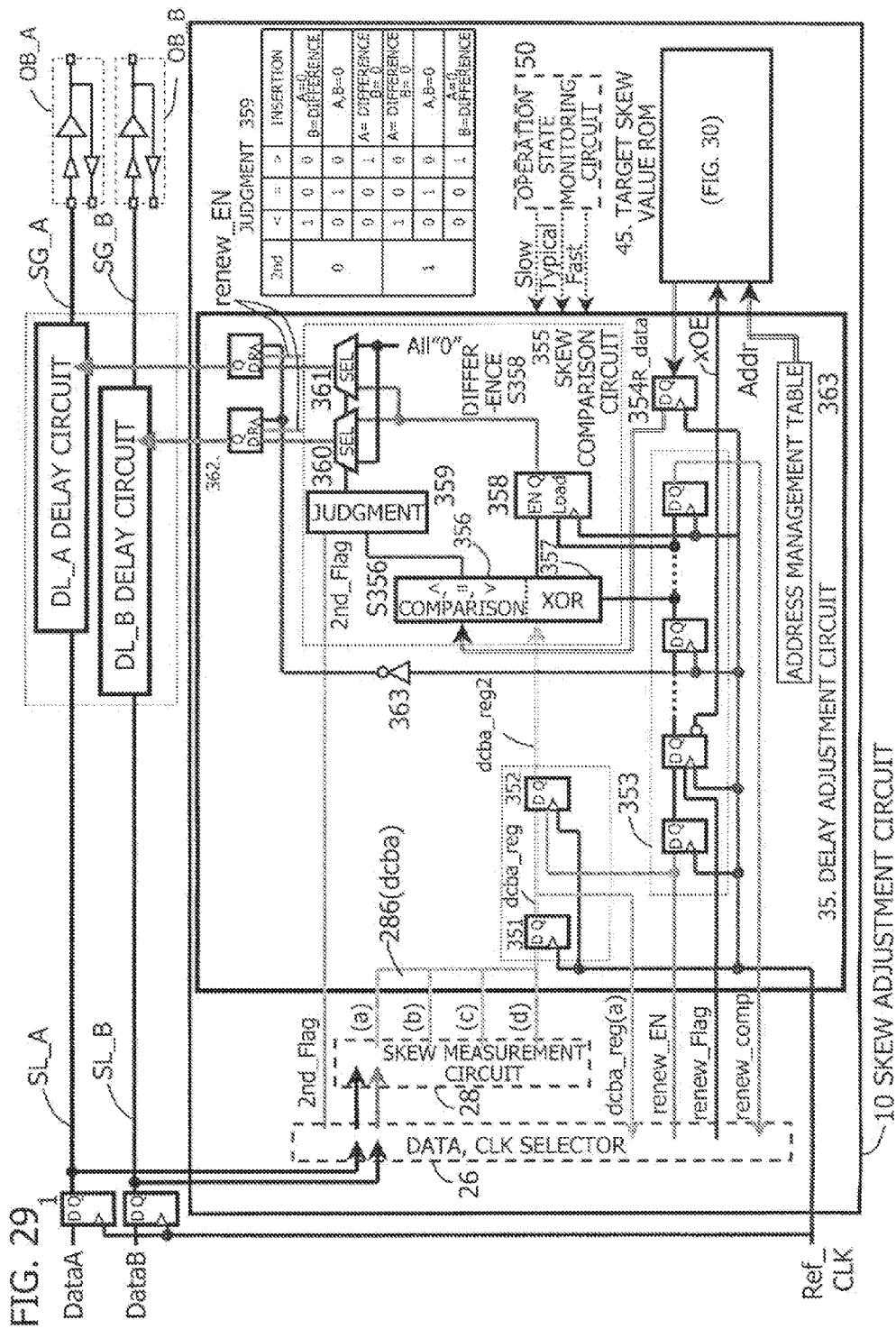
FIG. 29 depicts the delay adjustment circuit 35 within the skew adjustment circuit 10.

FIG. 29 depicts the delay adjustment circuit 35 within the skew adjustment circuit 10. Provided are measured skew holding registers 351 and 352 which hold measured skew data dcba; a skew comparison circuit 355 which compares a target skew value read out from target skew value storage ROM 45 and the measured skew value of the measured skew holding register 352, and detects the difference therebetween; and a delay setting register 362 which sets the detected difference as a delay. Based on the delay amount set in this delay setting register 362, the delay circuits DL_A, DL_B delay both the signals SG_A, SG_B and induce an appropriate skew. Further, the delay adjustment circuit 35 has a timing generation circuit 353 which generates a timing signal in response to the renew enable signal renew_EN, an address management table 363 which manages addresses in the target skew value ROM 45, and a latch circuit 354 which latches read-out data R_data. Further, difference detection within the skew comparison circuit 355 is performed by an exclusive logical sum circuit 357 and a difference counter 358.

FIG. 30 depicts the structure of target skew value ROM 45. Addresses are the signal group Gr for skew adjustment, which is a group of signals in simultaneous operation, and signal pair combinations; data corresponding the address is a target skew value. Target skew values have a format similar to that of measured skew data, and is data n-dcba in the format output by the skew measurement circuit of FIG. 28. Hence similarly to the measured skew values and measured skew data dcba, the magnitude relations of target skew values and target skew data n-dcba in ROM are opposite.

Figure 31:
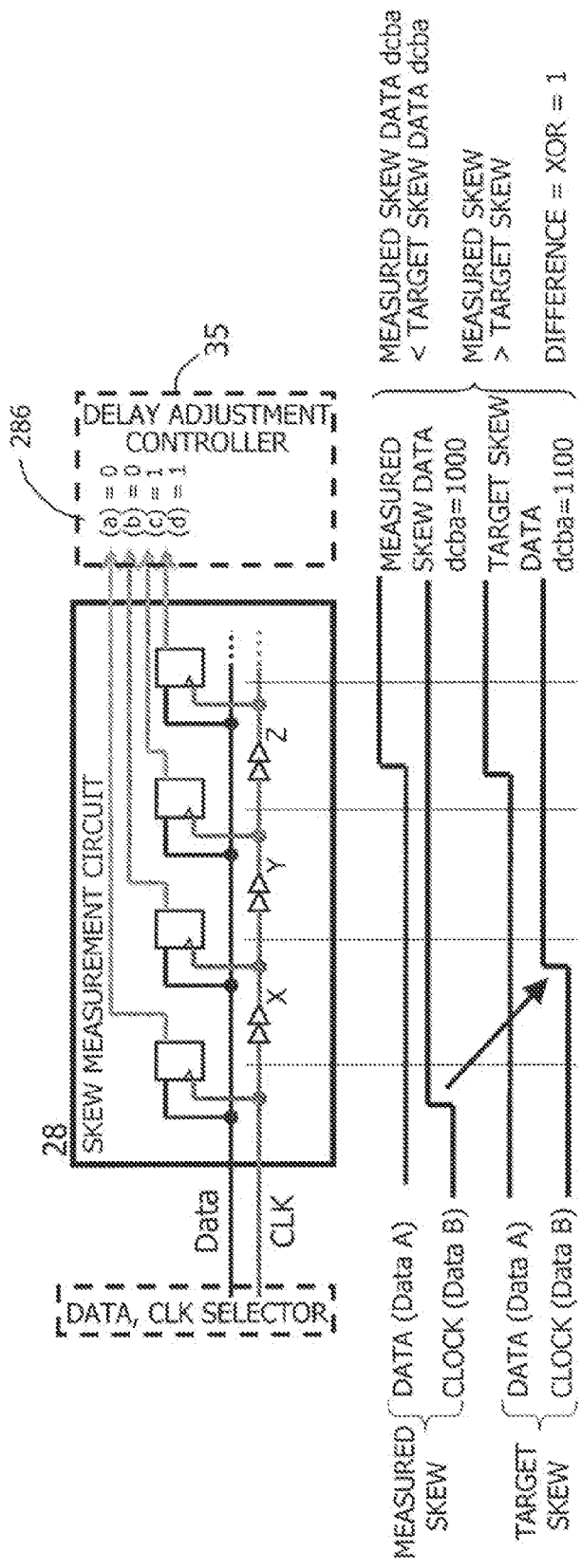
FIG. 31 depicts the relation between measured skew data and target skew data in this embodiment.

FIG. 31 depicts the relation between measured skew data and target skew data in this embodiment. As explained above, the magnitude relation of values of measured skew data dcba output by the skew measurement circuit 28 is opposite that of measured skew values. Similarly, the values of target skew data dcba output from ROM 45 has a magnitude relation opposite that of target skew values. In the example depicted in FIG. 31, for measured skew data dcba=1000, the target skew data dcba=1100. As can be understood from the waveforms in FIG. 31, target skew is smaller than the measured skew. However, in a comparison of data items, measured skew data dcba=1000<target skew data dcba=1100.

Figure 32:
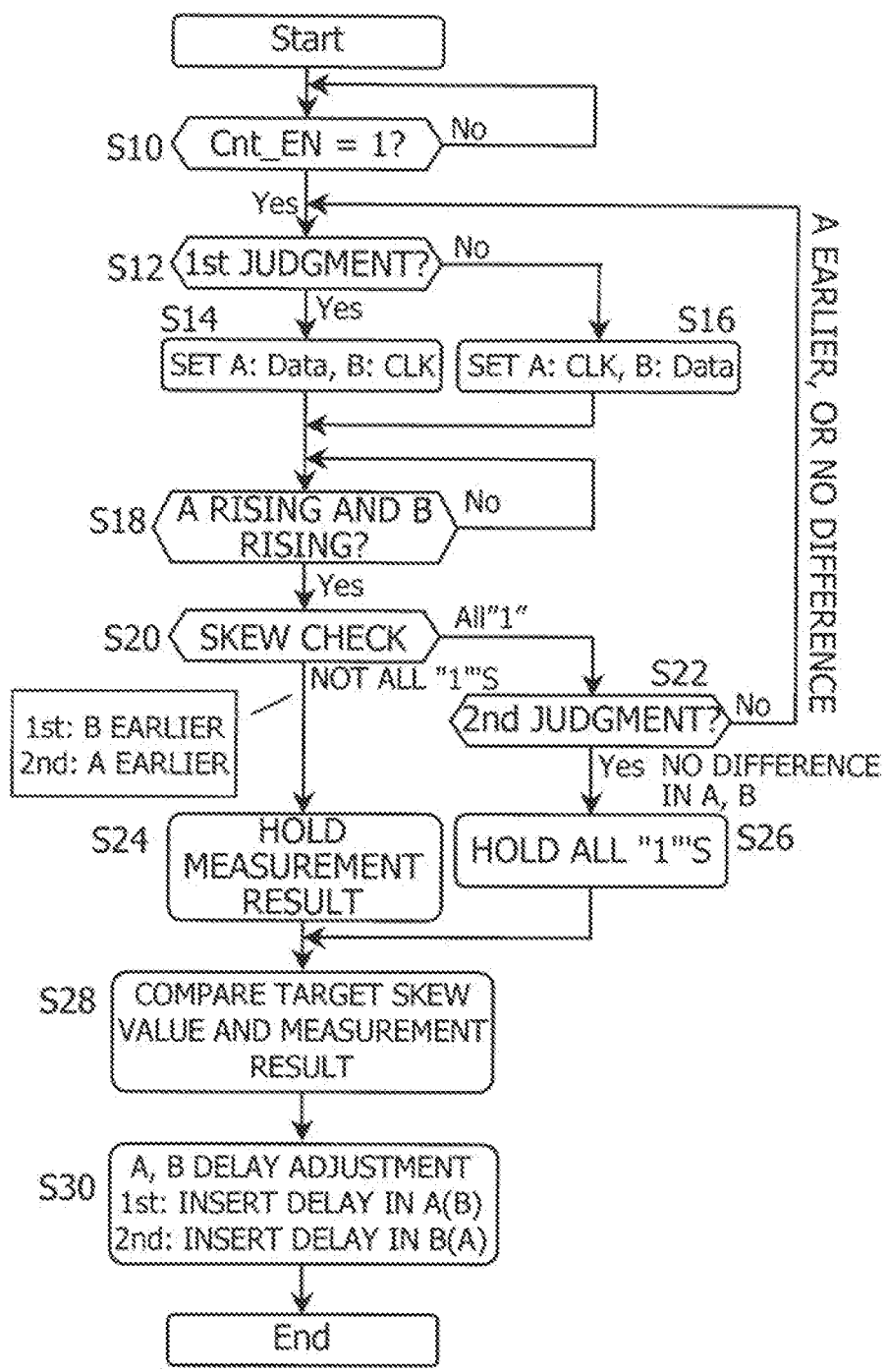
FIG. 32 is an operation flowchart of a skew adjustment circuit.

FIG. 32 is an operation flowchart of a skew adjustment circuit. The skew adjustment operation of FIG. 27 to FIG. 29 is explained in summary according to this operation flowchart. First, in initialization of the system of the skew adjustment circuit, when a stable system clock is input and a stable internal reference clock Ref_CLK is generated, the control enable signal Cnt_EN goes to H level (S10). In response to this control enable signal Cnt_EN=H, skew adjustment operation of the skew adjustment circuit 10 is begun.

According to whether skew measurement is being performed the first time, if the performance is the first time, the selector 26 sets the signal SG_A to the data and the signal SG_B to the clock (S14). And if the performance is the second time, the signal SG_A is set to the clock and the signal SG_B to the data (S16). Specifically, if the performance is the first time, then the second flag 2nd_Flag=0, and the selectors 261 and 262 of FIG. 27 select the signal SG_A as data 277 and the signal SG_B as the clock 278. If the performance is the second time, the second flag 2nd_Flag=1, and the opposite of the above selections are made.

When the simultaneous rise detection circuit 267 detects rising changes in the signals SG_A and SG_B, the simultaneous rise detection signal S_EN is set to "1" (S18). That is, the AND gate 263 detects the L level of both signals SG_A and SG_B, the latch circuit 264 latches this in response to the reference clock Ref_CLK, and thereafter when the AND gate 265 detects the H levels of both signals SG_A and SG_B, the latch circuit 266 latches this in response to the next reference clock Ref_CLK, and the simultaneous rise detection signal becomes S_EN=1.

When the previous skew adjustment is completed, the update complete signal renew_comp=1, provided to FF 272 and 273, causes resetting of the second flag to 2nd_Flag=0 and of the renew flag to renew_Flag=0. And, when skew measurement is performed the first time, if the lowermost data dcba_reg(a) of the data dcba_reg held by the measured skew holding register 351 storing measured skew data dcba already measured by the skew measurement circuit 28 is dcba_reg(a)=0, then the AND gate 274, in response to S_EN=1, sets the renew enable signal to renew_EN=1. Or, if skew measurement is performed the second time, the AND gate 275 sets the renew enable signal to renew_EN=1 in response to S_EN=1, regardless of the held data dcba_reg(a).

Returning to FIG. 32, when the measured skew data detected by the skew measurement circuit 28 is dcba=1111 (S20), processing proceeds to the second skew measurement (S22). When the measured skew data in the first measurement is dcba≠1111, or if the measurement is the second skew measurement, the measured skew data dcba is held by the measured skew holding register 352 in response to a renew enable signal renew_EN=1.

In the first and second skew measurements, when the renew enable signal becomes renew_EN=1, the delay adjustment circuit 35 of FIG. 29 begins operation, and the skew comparison circuit 355 compares the target skew value read out from ROM 45 with the measured skew value being held, and computes the difference (S28). And, a judgment unit 359 within the skew comparison circuit 355 generates selection signals for the selectors 360 and 361 based on the second flag 2nd_Flag and the comparison result S356. Or, the XOR gate 357 and difference counter 358 count the difference in the number of "0"s in the measured skew data and the target skew data, and determine the difference. The difference S358 is set as the tap value corresponding to the delay amounts of delay circuits in the delay setting register 362, via the selectors 360 and 361 (S30).

The delay setting register 362 is set in response to the renew enable signal renew_EN=1, and the difference value is set with the timing of a phase of 180° of the reference clock Ref_CLK, which is output by the inverter 363.

FIG. 29 depicts the logic table for the judgment unit 359. By this means, during the first skew measurement (2nd_Flag=0), the case of the measured skew data dcba<target skew data dcba, that is, the case of the measured skew>target skew, is the case of FIG. 31; and the difference is set as the delay amount for the signal SG_B which is earlier, while a delay amount of zero is set for the signal SG_A, which is later. When the inequality is opposite, the opposite of the above is performed, with a delay amount of zero set for the signal SG_B which is earlier, and the difference amount set as the delay amount for the signal SG_A which is later. In the second skew measurement (2nd_Flag=1), the signals SG_A and SG_B are in the opposite relation.

Figure 33:
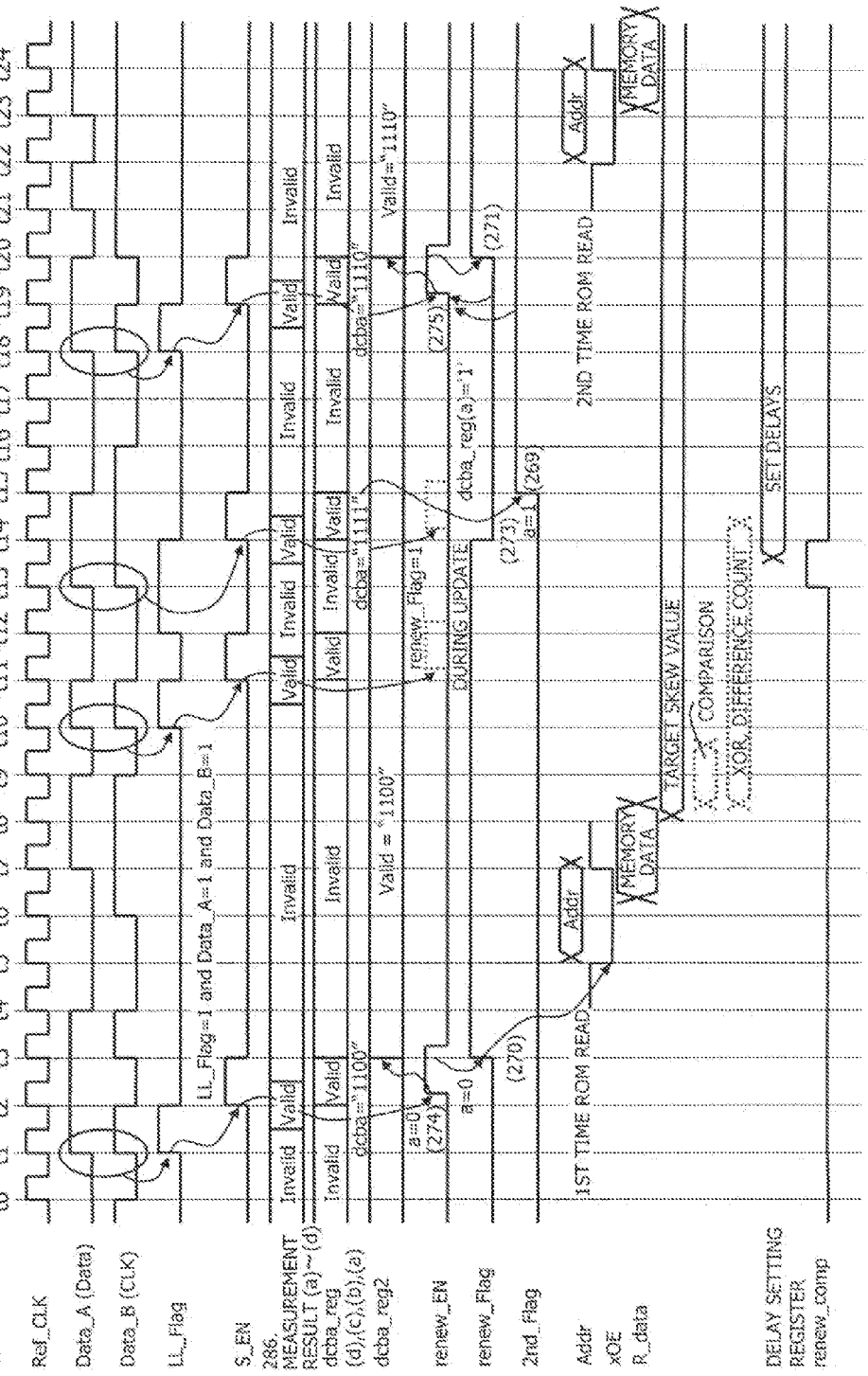
FIG. 33 is a timing chart depicting an example of operation of a skew adjustment circuit.

FIG. 33 is a timing chart depicting an example of operation of a skew adjustment circuit. In this operation example, in the initial skew adjustment the skew is measured in a first skew measurement and a delay amount for delay circuits is set, and in the next skew adjustment the skew cannot be measured in the first skew measurement (dcba=1111), and the skew is measured in a second skew measurement.

At time t0, initialization is already completed, and the control enable signal is cnt_EN=1. With completion of the previous delay amount setting, the update complete signal is renew_comp=1, and by this means the latch circuits 272, 273 within the selector circuit 26 are reset, and 2nd_flag=0 and renew_Flag=0.

At time t1 the data signals A, B both rise, and in the simultaneous rise detection circuit 267 the LL_Flag=1, and at time t2 the simultaneous enable signal becomes S_EN=1 in response to the rise of the reference clock Ref_CLK. The skew measurement circuit 28 always measures the skew difference between two signals, and at time t2 the data being held is measured skew data dcba_reg=1100, dcba_reg(a)=0, so that the renew enable signal becomes renew_EN=1 due to the AND gate 274. dcba_reg(a)=0 means that the signal B is earlier than signal A, and that the first measurement was performed appropriately.

And, at time t3, in response to this renew_EN=1, the measured skew holding register 352 latches dcba_reg=1100, and simultaneously through the output of 1 by the AND gate 270 in the flag generation circuit 268 the latch circuit 273 sets the renew flag to renew_Flag=1.

In the timing generation circuit 353 within the delay adjustment circuit 35 of FIG. 29, by setting the renew flag to renew_Flag=1, an output enable signal xOE=0 is generated for ROM 45 at time t5, an address indicating a combination of the signals A, B is output from the address management table 363, and at time t7 the target skew data R_data in ROM 45 is read out.

Thereafter, the skew comparison circuit 355 within the delay adjustment circuit 35 performs comparison and difference counting operations, and with the timing of the update complete signal renew_comp=1, a delay amount corresponding to the difference is set in the delay setting register 362 according to the judgment decision of the judgment unit. By this means, initial skew adjustment is completed.

Next, at time t10 the rising of signals A, B is detected, and at time t11 the simultaneous rising detection signal becomes S_EN=1. However, due to the renew flag indicating that initial skew adjustment is in progress being renew_Flag=1, the AND gates 274, 275 in the selector do not set the renew enable signal renew_EN to "1".

Next, at time t13 the rising of signals A, B is detected, at time t14 the simultaneous rising detection signal becomes S_EN=1, and the first skew measurement is performed, but because the measured skew data is dcba_reg(a)=1, the output of the AND gate 274 of the selector remains "0", and the renew enable signal renew_EN is not set to "1". And, at time t15, due to the measured skew data dcba_reg(a)=1 and in response to the reference clock Ref_CLK, the latch circuit 272 loads "1" by means of the AND gate 269 of the selector 26, and the second flag is set to 2nd_Flag=1. With this the second skew measurement begins.

At time t18 the rising of signals A, B is detected, at time t19 the simultaneous rise detection signal becomes S_EN=1, the renew enable signal becomes renew_EN=1 due to the AND gate 275 of the selector 26, and due to the AND gate 271 and the latch circuit 273, in response to the next reference clock Ref_CLK after time t20 the renew flag becomes renew_Flag=1. By this means, the delay adjustment circuit 35 sets delay amounts based on the second measurement skew data, and on the target skew data read out from ROM 45. This operation to set delay amounts is the same as that described above.

Figure 34:
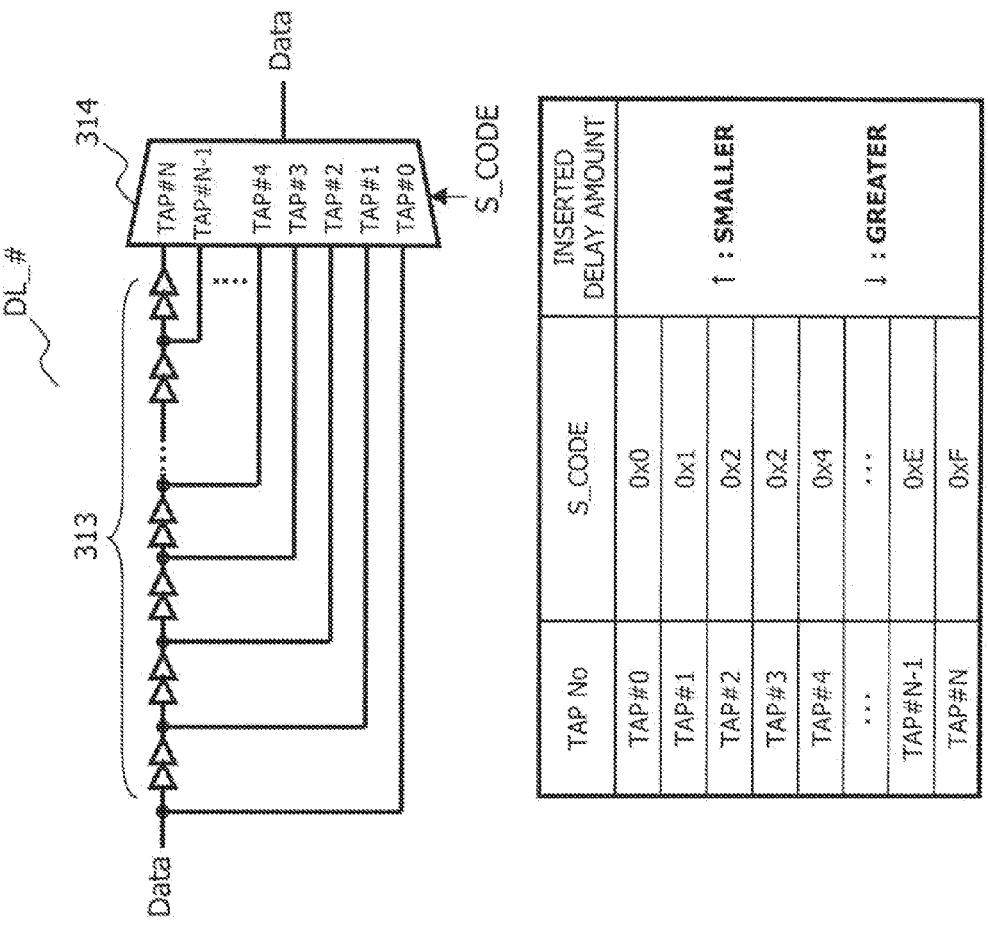
FIG. 34 depicts a delay circuit and depicts the relation between the tap value and the delay amount thereof.

FIG. 34 depicts a delay circuit and depicts the relation between the tap value and the delay amount thereof. The delay circuit DL_# has a buffer group 313 comprising a plurality of buffers which delay an input data signal Data, and a selector 314 which selects a plurality of nodes in the buffer group 313 based on a setting code S_CODE. In FIG. 34, a correspondence table of selector tap values and setting codes S_CODE is depicted; the smaller the setting code S_CODE, that is, the smaller the tap value, the smaller is the delay amount inserted by the delay circuit DL_#, and in the opposite case, the greater is the delay amount. 4-bit setting codes S_CODE for the 8 delay circuits DL_0 to DL_7 are set in the delay amount setting register 361 of FIG. 29.

In this embodiment, when simultaneous changes are detected in the signals of the signal lines SL_A and SL_B, the skew of the signals is measured, the delay amounts of delay circuits provided in each of the signal lines are adjusted to appropriately adjust the skew between the signals, and simultaneous switching by the output buffers is suppressed. However, this delay amount is not allowed to exceed an allowed delay amount conforming to the AC specifications of the other LSI or macro input circuit to which the output of the output buffers is supplied. Hence the delay amounts set in delay amount ROM are set to less than the allowed delay amount conforming to AC specifications.

Figure 35:
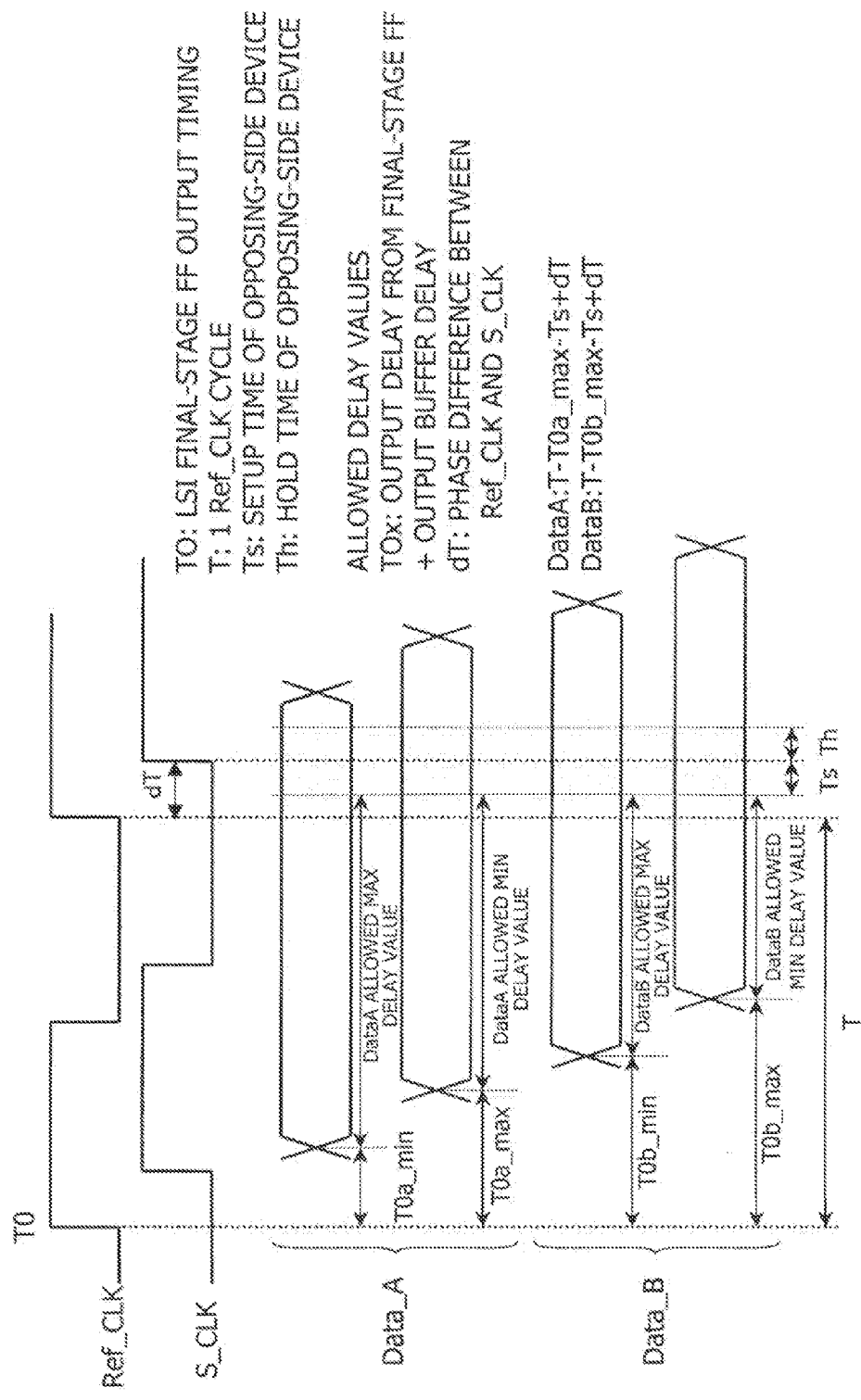
FIG. 35 explains allowed delay amounts.

FIG. 35 explains allowed delay amounts. In the figure, the reference clock Ref_CLK within the LSI, and the system clock S_CLK for a plurality of LSIs are depicted. These clocks are synchronized clocks and have the same period T, but as depicted in the figure, there may exist a prescribed phase difference dT between the two clocks.

In FIG. 26, in the LSI output stage, a final-stage flip-flop 1 latches a data signal in response to the reference clock Ref_CLK. And, after passing through the signal line SL and output buffer OB, the data signal is output to a later-stage other LSI or other macro. The input circuit of the later-stage other LSI or other macro captures the input signal on the rising edge of the system clock S_CLK, but a setup time Ts and a hold time Th are determined as AC specifications of the input circuit.

In FIG. 35, a sum TOx of the output delay from the final-stage flip-flop and the output buffer delay, and the allowed delay value satisfying the setup time Ts, are depicted for data A and data B. Variations in the delay value TOx on the output side occur due to process conditions, temperature conditions, power supply voltage, and similar, and so there exist maximum and minimum values. Hence cases in which these delay values TOx are maximum and minimum for data A and B are depicted.

Allowed delay times satisfying the setup time Ts are as follows for data A and B.

data $A = T - TOa\_max - Ts + dT$ data $B = T - TOb\_max - Ts + dT$

The delay amount TOx is larger for data B, so the allowed delay value for data B is smaller. Hence a delay amount less than the allowed delay amount for data B is set in the delay amount ROM 45. As a result, skew-adjusted output signals are guaranteed to be supplied to the input circuit of the later-stage LSI or macro with timing that satisfies the setup time Ts.

The above skew measurement circuit 28 selects one of the two signals SG_A, SG_B as the clock and the other as the data to perform skew measurement; but by providing two sets of skew measurement circuits, depicted in FIG. 28, within the skew measurement circuit 28, skew between the two signals can be measured simultaneously regardless of which of the two signals SG_A, SG_B is earlier. In this case, by referencing the measured results dcba of both skew measurement circuits, which of the two signals has earlier timing can also be detected. The skew measurement circuit of this embodiment may thus have two sets of skew measurement circuits.

Third Embodiment (2)

Figure 36:
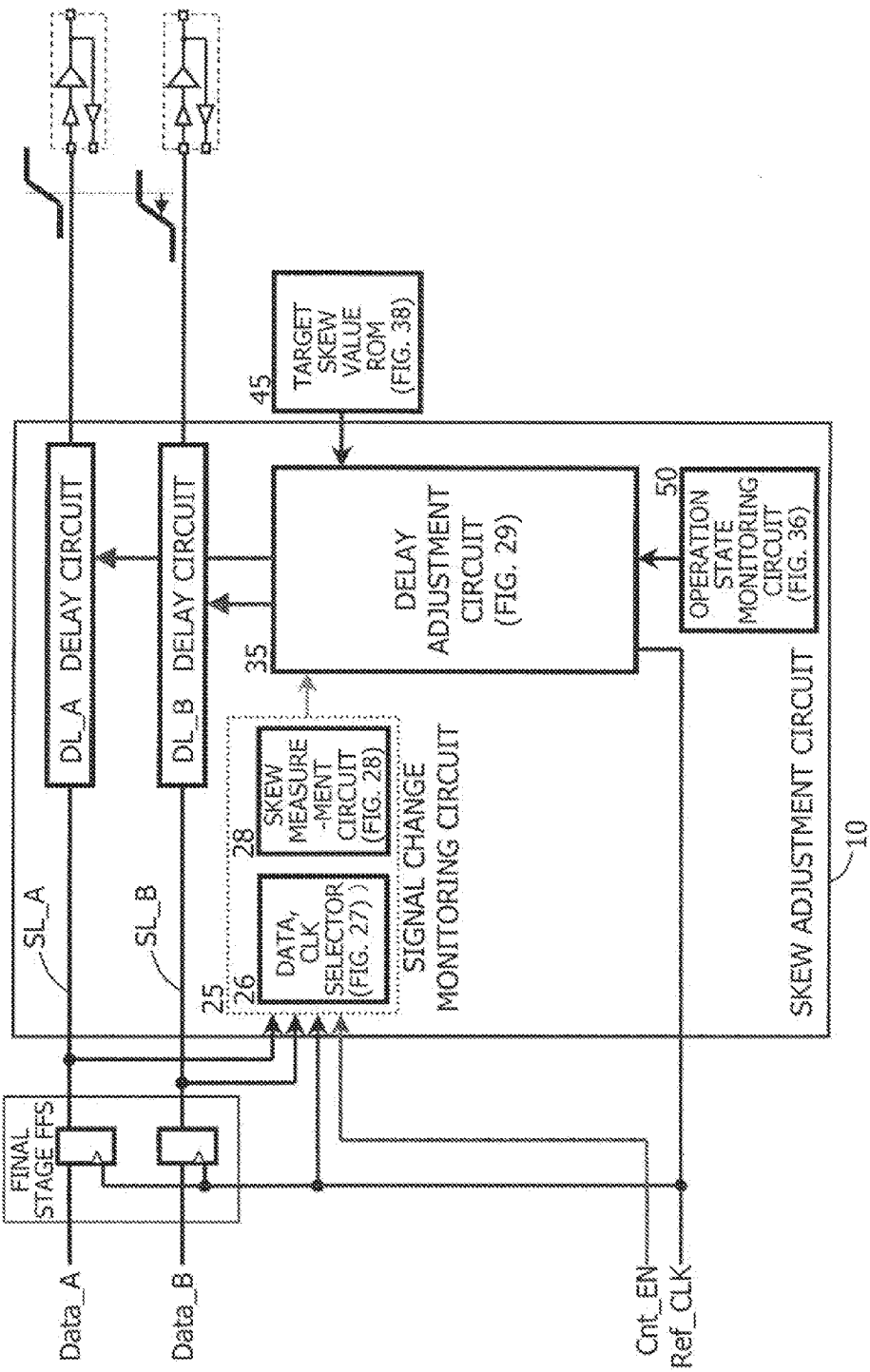
FIG. 36 depicts a first modified example of the skew adjustment circuit of the third embodiment.

FIG. 36 depicts a first modified example of the skew adjustment circuit of the third embodiment. Differences with the skew adjustment circuit 10 of FIG. 26 are the presence of an operation state monitoring circuit 50, and the fact that the target skew value ROM 45 stores, a target skew value corresponding to the operation speed detected by the operation state monitoring circuit 50, in addition to the skew adjustment signal group Gr and skew adjustment signal pairs. The delay circuits DL_A, DL_B are the same as in FIG. 34, the selector 26 is the same as in FIG. 27, the skew measurement circuit 28 is the same as in FIG. 28, and the delay adjustment circuit 35 is also the same as in FIG. 29. However, the address management table 363 within the delay adjustment circuit 35 adds the operation speed from the operation state monitoring circuit 50 to addresses.

In this modified example, the operation state monitoring circuit 50 monitors changes in gate speeds within the LSI occurring due to the operation state (variations in process conditions, temperature conditions and voltage conditions), and when the speed is fast outputs an operation state signal Fast, when typical outputs an operation state signal Typical, and when slow outputs an operation state signal Slow. And, the ROM 45 stores target skew values corresponding to these operation speeds, and so can set delay amounts in delay circuits suited to the operation state.

Specifically, compared with delay amounts for the case of a typical speed, when the speed is fast the delay amounts within the delay circuits DL are increased, that is, the number of delay buffers is increased, and the absolute delay time, that is, the absolute skew magnitude, is adjusted to be equal to the case of a typical speed. Conversely, when the speed is slow the delay amounts in the delay circuits DL are decreased, that is, the number of delay buffers is decreased, and the absolute delay time, that is, the absolute skew magnitude, is adjusted to be equal to the case of a typical speed.

Causes of variation causing operation speeds to be fast or slow include, first, process conditions such as manufacturing variations with respect to target values when manufacturing a device; second, higher or lower power supply voltages; and third, higher or lower temperatures. As explained above, the delay amount of a delay circuit is a value which provides appropriate skew to reduce simultaneous switching noise, and must be set to a value less than the allowed delay amount. Hence it is desirable that the number of delay buffers of delay circuits be modified according to variations in operation speed.

Figure 37:
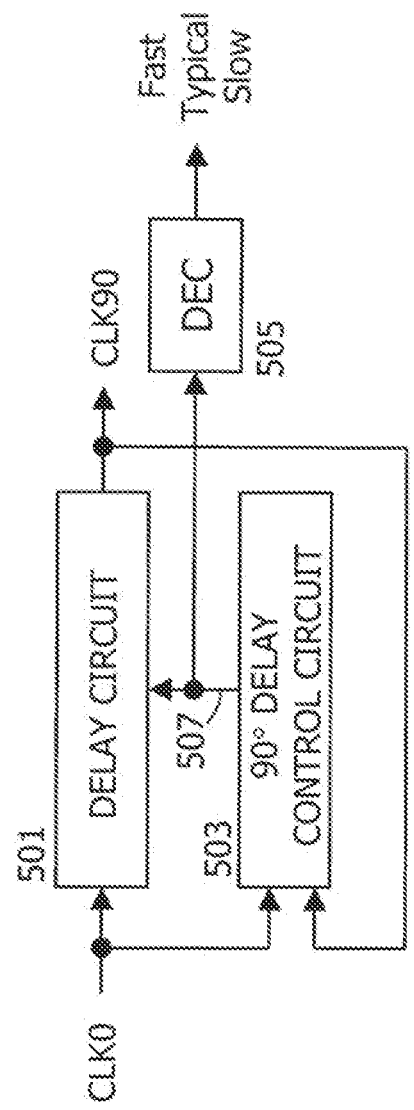
FIG. 37 depicts an example of the operation state monitoring circuit 50.

FIG. 37 depicts an example of the operation state monitoring circuit 50. The operation state monitoring circuit has a delay circuit 501 which delays a clock CLK0 with phase 0° and outputs a clock CLK90 with phase 90°, and a delay control circuit 503 which detects the phase difference between two clocks CLK0 and CLK90 and generates a delay control signal 507 for a delay circuit such that the phase difference becomes 90°. The delay circuit 501 is for example configured equivalently to the delay circuit depicted in FIG. 34. Hence the delay control signal 507 is a control signal which selects signals transmitted through numerous buffers when the LSI gate speed is fast, and which selects signals transmitted through few buffers when the speed is slow. In the example of FIG. 37, this delay control signal 507 is decoded by a decoder 505 and converted into the three operation state signals Fast, Typical and Slow.

As depicted in the delay adjustment circuit 35 of FIG. 29, in this embodiment the operation state signal output by the operation state monitoring circuit 50 is also output to the address management table 363. The delay adjustment circuit 35 uses as the address when referencing the ROM 45, in addition to the signal group Gr for skew adjustment and the signals for skew adjustment, the operation state signals Fast, Typical, Slow.

FIG. 38 depicts a specific example of target skew value ROM 45. In the case of the ROM 45, in addition to the signal group Gr for skew adjustment and the signal pair for skew adjustment, an operation state signal Fast, Typical or Slow is used as an address. And, the target skew data which is a target for the signal pair data is n-dcba. That is, the data of FIG. 30 is stored for each of the operation state signals Fast, Typical and Slow.

However, as depicted in FIG. 38, the target skew data when the operation state is Fast has more "0"'s set than in the case of operation speed Typical, and the target skew data when the operation state is Slow has fewer "0"'s set than in the case of operation speed Typical. That is, the absolute target skew is set so as to be substantially constant, regardless of operation speed. By referencing this delay amount ROM 45, appropriate target skew data corresponding to the operation state can be read out to delay adjustment circuits.

The ROM 45 may be rewritable memory. If rewritable memory is used, appropriate delay amounts can be rewritten corresponding to the LSI operating environment, such as for example the AC specifications of other LSIs to which output signals are input, and optimum skew adjustment is possible.

Third Embodiment (3)

Figure 39:
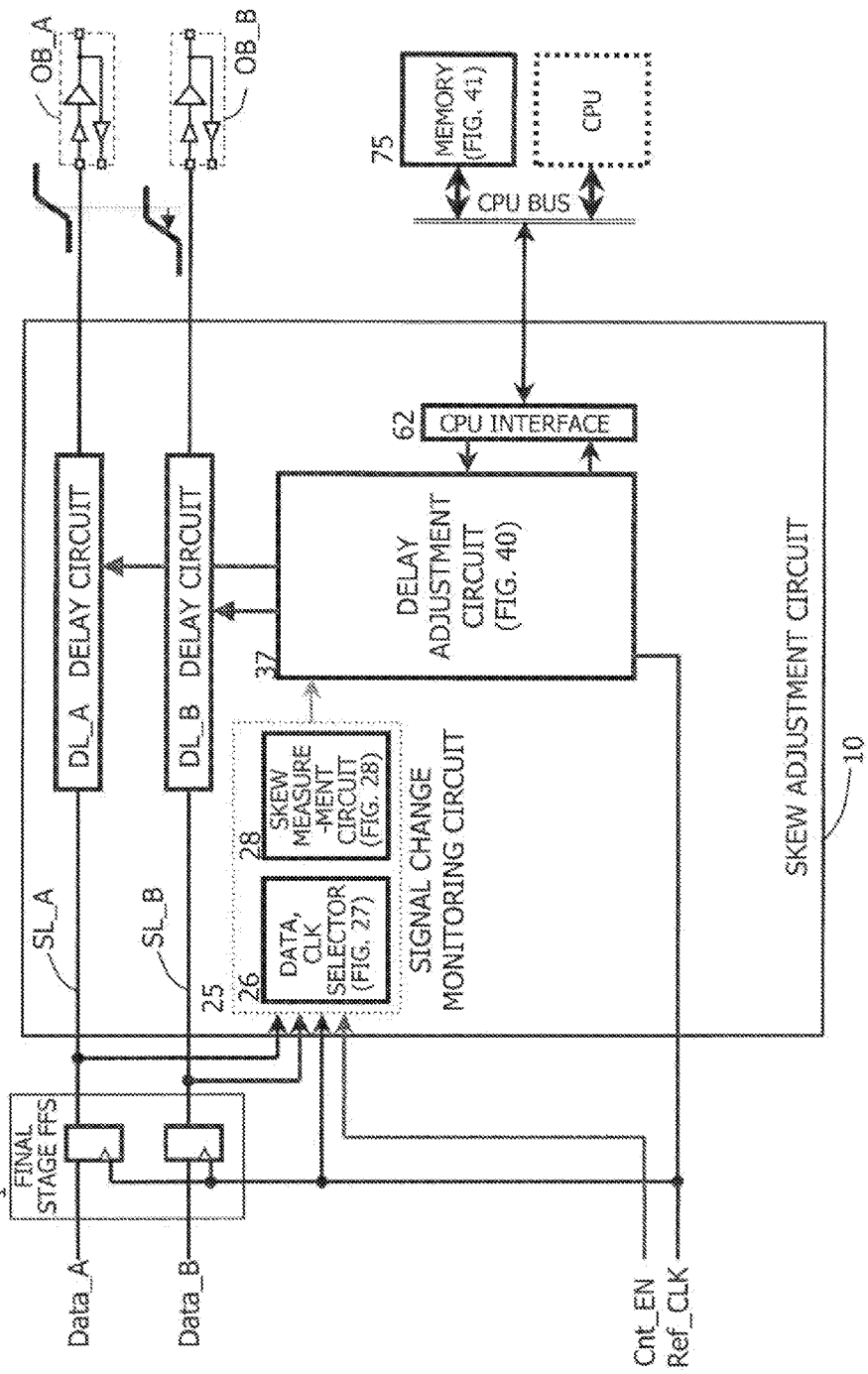
FIG. 39 depicts a second modified example of the skew adjustment circuit of the third embodiment.

FIG. 39 depicts a second modified example of the skew adjustment circuit of the third embodiment. The skew adjustment circuit 10, similarly to that of FIG. 26, has a signal change monitoring circuit 25 with a selector 26 and skew measurement circuit 28, a delay adjustment circuit 37, and delay circuits DL_A and DL_B. The selector 26 and skew measurement circuit 28 of the signal change monitoring circuit 25 have the same configurations as in FIG. 27 and FIG. 28, and the delay circuits are also the same as in FIG. 34.

However, a difference from FIG. 26 is that the delay amounts for adjustment according to the measured skew are stored in RAM 75 provided outside the LSI, and setting of delay amounts for adjustment in the RAM 75 is performed by an external CPU. Together with this, the delay adjustment circuit 37 of this second modified example has the configuration of FIG. 40, rather than that of FIG. 29. Further, a CPU interface 62 is provided as an interface with an external CPU bus, and interface operations between the delay adjustment circuit 37 and the CPU are performed.

The CPU downloads appropriate optimum delay amounts from RAM 75. By thus making delay amounts in RAM 75 rewritable, delay amounts can be set dynamically to for example conform to the AC specifications of other LSIs and other macros to which signals output from output buffers are to be input.

Further, the RAM 75 and CPU may be provided in common within the LSI. That is, when the LSI is a system LSI, a CPU and RAM are provided within the LSI, and these may be used.

Figure 40:
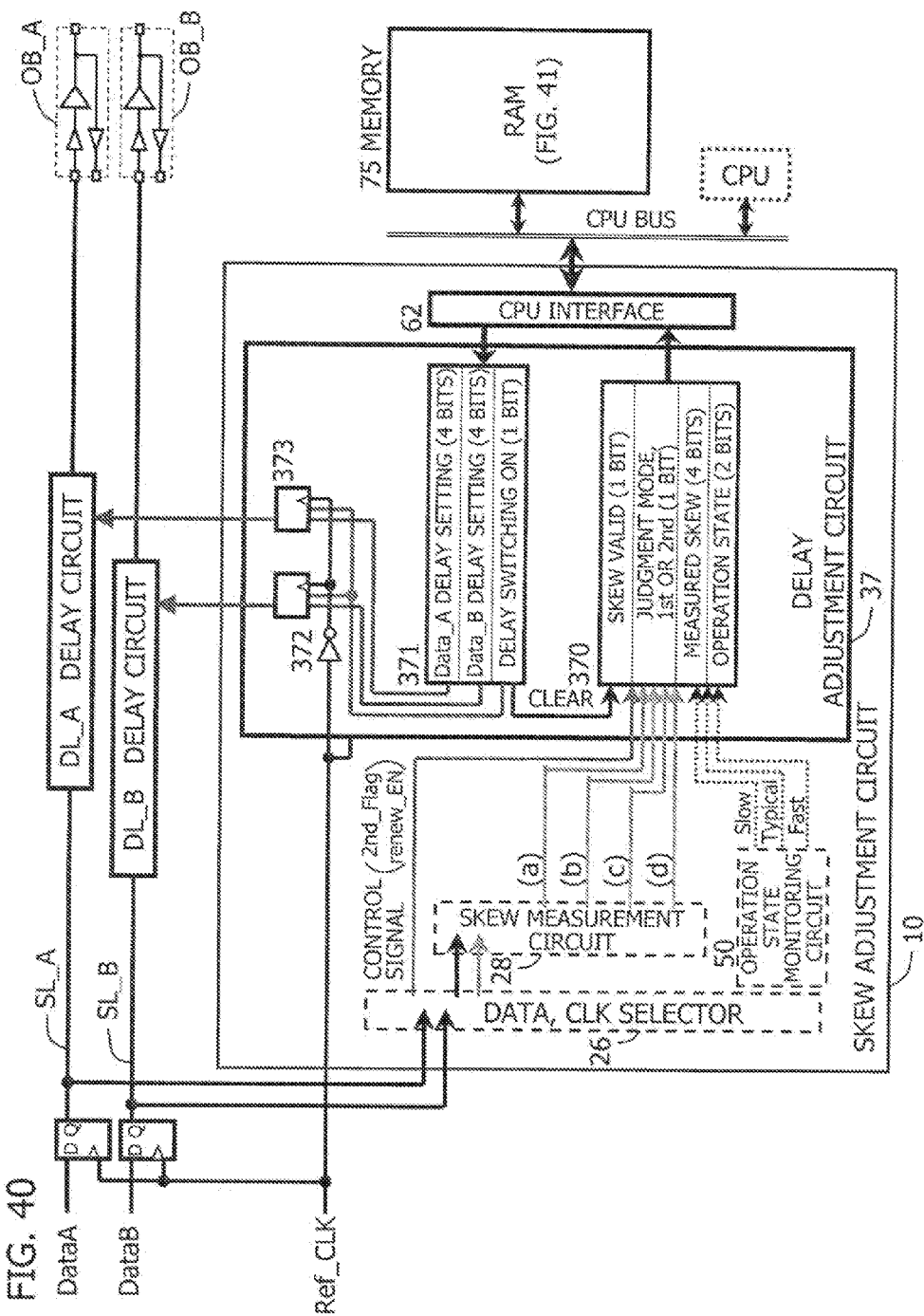
FIG. 40 depicts the delay adjustment circuit of the second modified example of the third embodiment.

FIG. 40 depicts the delay adjustment circuit of the second modified example of the third embodiment. The delay adjustment circuit 37 has a measured skew register 370, a delay setting value register 371, and a delay setting register 373. The measured skew register 370 holds a renew enable signal renew_EN=1 supplied by the selector 26 as a skew valid bit, holds a second flag 2nd_Flag as a decision mode bit, and holds measured skew data output from the skew measurement circuit 28. When these are held, the skew valid bit is set to valid "1".

The CPU monitors the skew valid bit in the measured skew register 370, and when the bit goes to valid "1", uses the decision mode signal and measured skew data as an address to read out adjusted delay data for the signals A, B from the RAM 75, stores the data in the delay setting value register 371, and sets a delay switching bit to "1". In response to this delay switching bit "1", the delay setting register 373 captures the delay setting value for signal A and the delay setting value for signal B in response to the inverted reference clock Ref_CLK. As a result, the delay setting values are set in the delay circuits DL_A and DL_B. Further, in response to the delay switching bit "1", the skew valid bit in the measured skew register 370 is cleared to "0".

Figure 41:
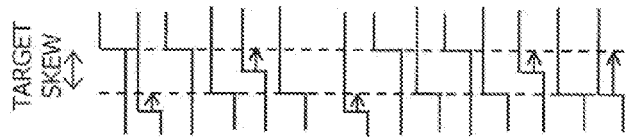
FIG. 41 depicts an example of the structure of RAM 75.

FIG. 41 depicts an example of the structure of RAM 75 storing delay amounts for adjustment. Addresses in RAM 75 are the group Gr, signal combination information, measured skew data, the decision mode (first time or second time), and the signal for setting (setting signal). At such an address is stored a delay setting value indicating the delay amount to be set for the setting signal. In the figure, waveforms for delay adjustment by delay setting values are depicted to the right of the table.

This delay setting value corresponds to the measured skew data, and corresponds to the delay amount to be adjusted for the delay circuits DL_A and DL_B to induce the target skew; the data in RAM 75 is a setting code S_CODE for the delay circuit of FIG. 34. As depicted in FIG. 34, the smaller the setting code S_CODE, the smaller is the delay amount to be inserted. Hence the delay setting value in RAM 75 corresponds to the difference between the above-described measured skew data and the target skew data. Further, the signal for insertion of a delay setting value, A or B, is opposite depending on whether the decision mode is the first time (1st) or the second time (2nd).

Figure 42:
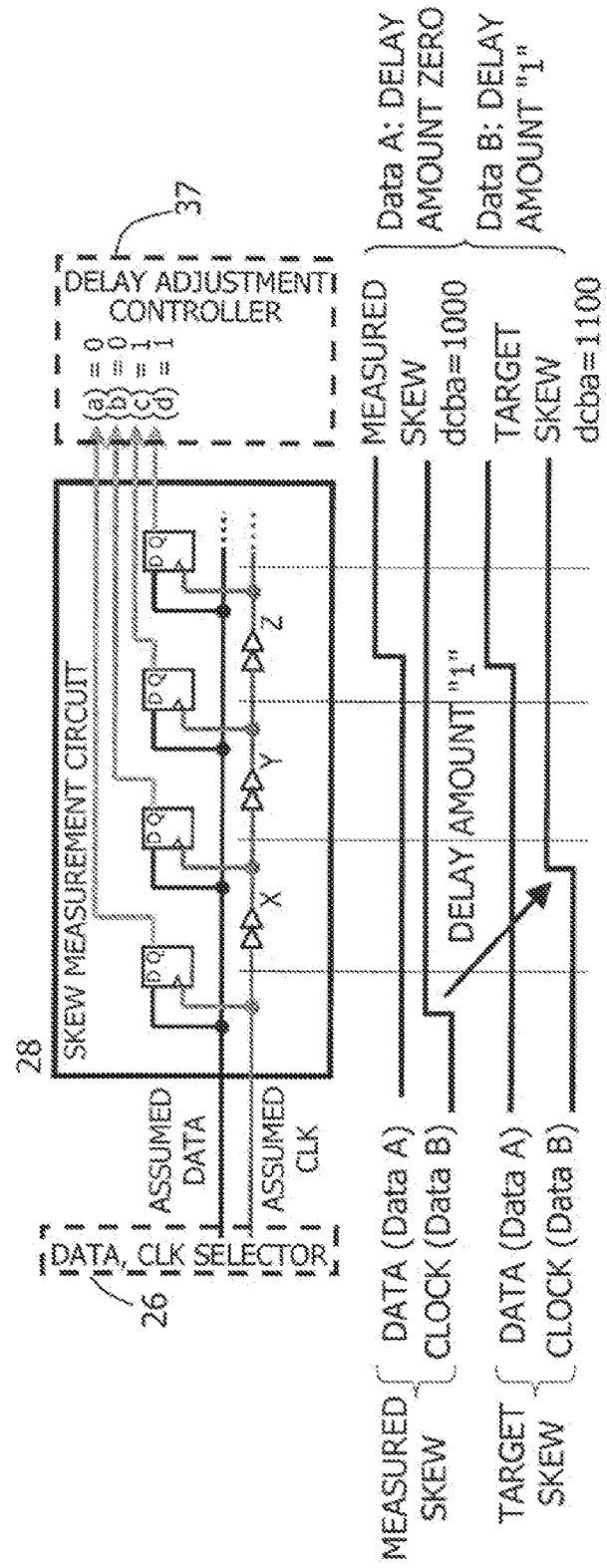
FIG. 42 explains delay setting values to be adjusted.
Figure 43:
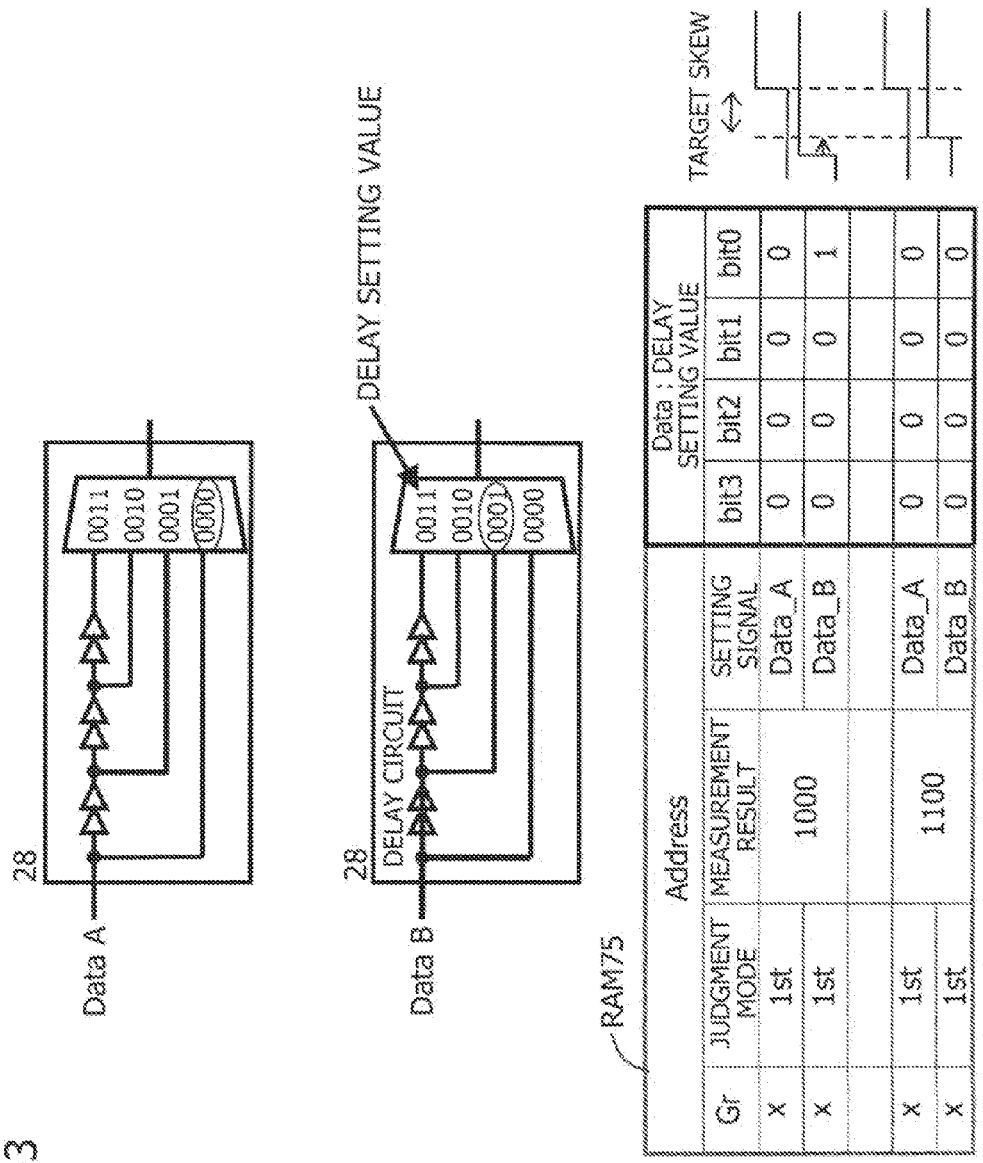
FIG. 43 explains delay setting values to be adjusted.

FIG. 42 and FIG. 43 explain delay setting values to be adjusted. FIG. 42 depicts waveforms of signals A, B indicating measured skew and target skew, corresponding to the skew measurement circuit 28. For measured skew data dcba=1000, the target skew data is dcba=1100. Hence it can be seen that in order to realize this target skew, the delay amount "1" is inserted on the signal B side, and a delay amount of zero is sufficient on the signal A side. The data of RAM 75 in FIG. 41 is setting codes S_CODE for delay circuits in which delay amounts necessary to realize this target skew are to be set for signals A and B.

FIG. 43 depicts a specific example of RAM 75 and delay setting values for the delay circuit 28. In the case of a measured skew and target skew such as depicted in FIG. 42, a delay amount of zero is to be inserted on the signal A side, and a delay amount of "1" is to be inserted on the signal B side. Hence a delay setting value of "0000" is stored for signal A, and a delay setting value of "0001" is stored for signal B, in the decision mode "1st" of RAM 75. As a result, a tap corresponding to delay setting value "0000" is selected for the delay circuit 28 on the signal A side, and a tap corresponding to a delay setting value "0001" is selected for the delay circuit 28 on the signal B side. By causing the signal B side to be delayed by a delay amount "1", the skew between the signals A and B becomes equal to the target skew.

Returning to FIG. 41, in addition to the case in which the measured skew data is dcba=1000, delay setting values for the cases of dcba=1100 and dcba=1110 on the judgment mode "1st" side are also depicted. In the case of measured skew data dcba=1100, the target skew between signals A and B occurs, and so the delay setting values to be set are both zero. Further in the case of measured skew data dcba=1110, the delay amount "1" to be inserted in signal A and the delay amount "0" to be inserted in signal B are stored as delay setting values. In the case of decision mode "2nd", the signals A and B have the relation opposite that of the above decision mode "1st".

Third Embodiment (4)

Figure 44:
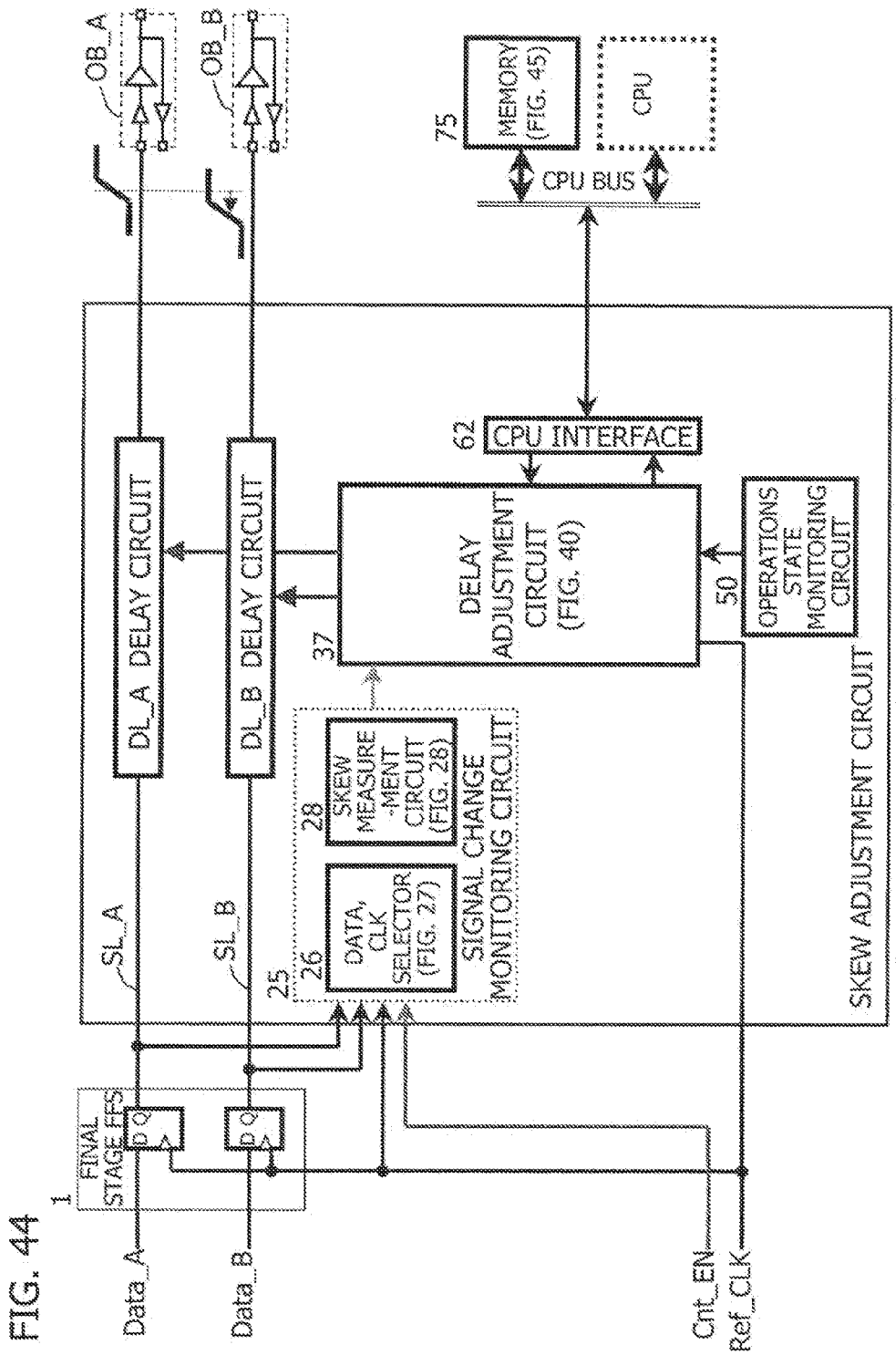
FIG. 44 depicts a third modified example of the skew adjustment circuit of the third embodiment.

FIG. 44 depicts a third modified example of the skew adjustment circuit of the third embodiment. Differences with the skew adjustment circuit 10 of FIG. 39 are the presence of an operation state monitoring circuit 50, and the fact that RAM 75 stores delay setting values for adjustment which, in addition to signal groups Gr for skew adjustment and signal pairs for skew adjustment, correspond to operation speeds detected by the operation state monitoring circuit 50. The delay circuits DL_A, DL_B are the same as in FIG. 34, the selector 26 is the same as in FIG. 27, the skew measurement circuit 28 is the same as in FIG. 28, and the delay adjustment circuit 37 is the same as in FIG. 40.

The delay adjustment circuit 37 depicted in FIG. 40 stores operation state signals from the operation state monitoring circuit 50 in the measured skew register 370. And, based on this operation state signal, the CPU reads out a delay setting value in RAM 75 and stores the value in the delay setting value register 371. Reading out of delay setting values by the CPU from RAM 75 according to the decision mode and skew data is as described above.

FIG. 45 depicts a specific example of RAM 75. In this specific example, delay setting values depicted in the example of the memory structure of FIG. 41 are stored corresponding to the operation state signals Fast, Typical, Slow. However, compared with the case of an operation state of Slow, the delay setting values are greater for the cases of Typical and Fast by a factor of 2, 3, and similar. By this means, target skew of the same length can be induced between signals A and B, regardless of the operation state.

Fourth Embodiment

Figure 46:
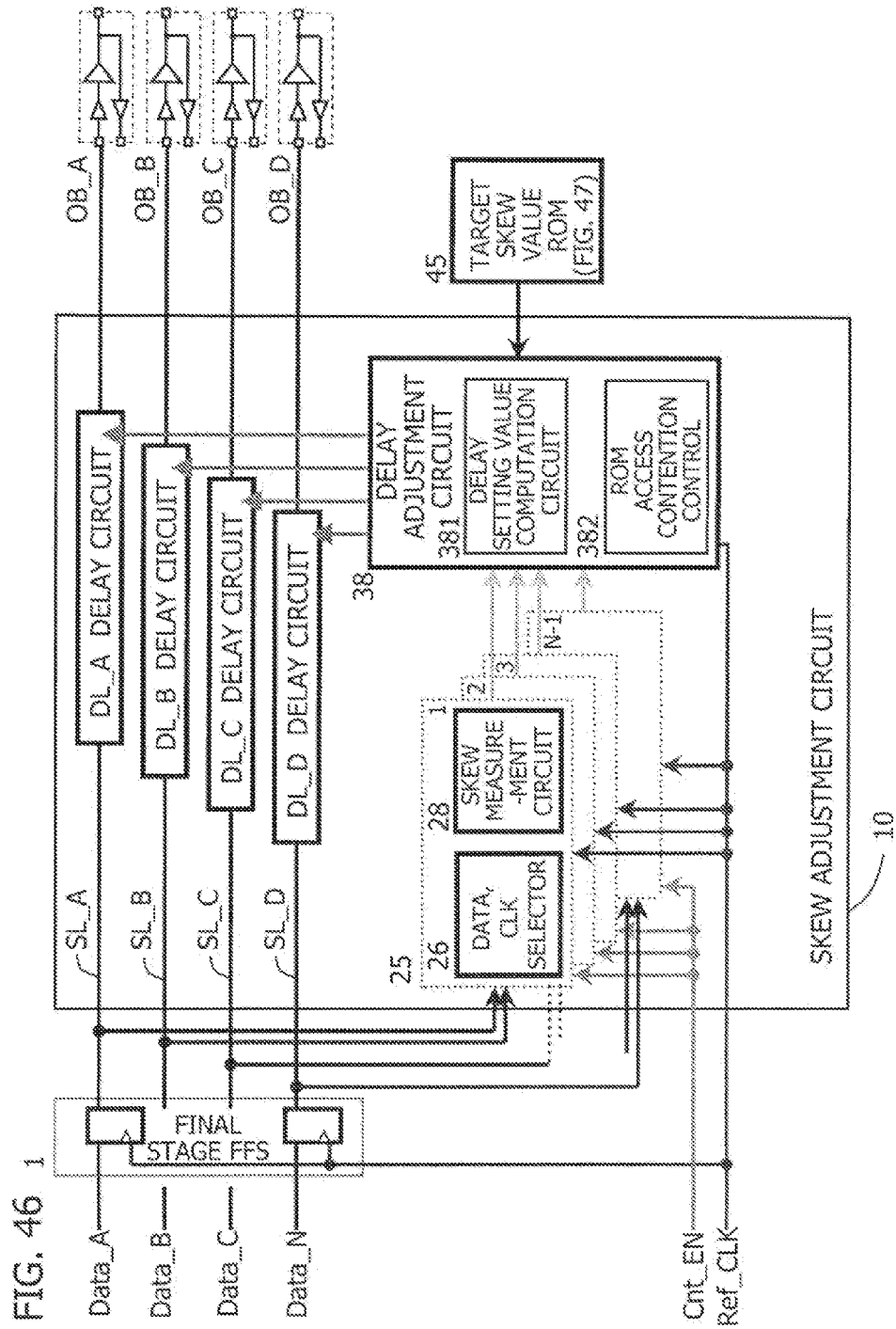
FIG. 46 depicts the skew adjustment circuit in a fourth embodiment.

FIG. 46 depicts the skew adjustment circuit in a fourth embodiment. The skew adjustment circuit in the fourth embodiment measures the skew of signals in N signal lines SL_A to SL_N, and adjusts the delay amounts of delay circuits DL_A to DL_N provided in each of the signal lines so as to obtain a target skew.

To this end, the skew adjustment circuit 10 has N−1 selectors 26 and skew measurement circuits 28 to measure the skew between signal lines SL_A and SL_B, between SL_A and SL_C, and between SL_A and other signal lines SL_K (K=D to N). And, the delay adjustment circuit 38 has a delay setting value computation circuit 381 which reads from ROM 45 the target skew corresponding to the signal combinations for adjustment, and computes the delay setting values from the measured skews and target skews. Further, in order to enable sequential readout from ROM 45 of target skews between N signals, the delay adjustment circuit 38 has a ROM access contention control circuit 382 which executes readout control by a round-robin method such that access contention does not occur.

An example is explained assuming provisionally a case of skew adjustment for four signal lines SL_A, B, C, D. Because there are four signal lines, three sets of a selector 26 and skew measurement circuit 28 are necessary. These selectors 26 and skew measurement circuits 28 measure the skew between signals A and B, signals A and C, and signals A and D. The delay setting value computation circuit 381 within the delay adjustment circuit 38 identifies the signal with the latest timing from these measured skews. The identification can be performed simply using the information of the measured skews between signals A and B, signals A and C, and signals A and D, and whether these are first-time or second-time judgments.

The ROM 45 stores target skew data for the four signals A, B, C, D. However, target skew data is data for each of the case in which signal A is earliest, the case in which signal B is earliest, the case in which signal C is earliest, and the case in which signal D is earliest. The delay setting value computation circuit 381 reads from ROM 45 the target skew data which makes earliest the signal with the latest timing detected from the measured skews. And, from the measured skews between signals A and B, signals A and C, and signals A and D, the delay setting value computation circuit 381 computes the delay amount for each signal necessary to adjust the timing relations between the signals A, B, C, D to the target skews read out from ROM 45, and sets the delay amounts for adjustment, as delay setting values, in the delay setting register (373 in FIG. 40) for each of the delay circuits.

FIG. 47 depicts a specific example of delay amount ROM 45. Addresses in this ROM 45 are the simultaneously operating signal group Gr, signal combination, and latest signal as detected from measured skews. On the other hand, data in the ROM 45 is the target skew between signals to impart the earliest timing to the latest signal. FIG. 47 depicts only data for the latest signal A, but actual data for target skews between signals for each of the four cases in which the latest signal is A, B, C and D is necessary.

FIG. 48 depicts a first computation 1 of the delay setting value computation circuit 381 in this embodiment. The first computation 1 detects the order of signals in the four signal lines from the decision modes and measured skews. Logically, there exist 24 possible orders of the four signals; FIG. 48 depicts 16 of these. For example, (a) is the case in which decision modes are 1st-1st-1st; in this case, signal A can be detected as the latest. Further, by comparing measured skews, the order of the other signals B, C, D can be detected. Similar remarks apply to (b), (c) and (d).

FIG. 49, FIG. 50 and FIG. 51 depict a second computation 2 of the delay setting value computation circuit 381 in this embodiment. The second computation 2 computes delay amounts for insertion for each signal in order to obtain target skews making the signal detected as the latest from measurement results the earliest. The timing relations of the four signals are known from the measured skews, and so the latest signal among the four signals is made the earliest signal in target skews. In this case, the adjusted delay amount for the latest signal is set to zero, and the adjusted delay amounts necessary for the remaining signals to obtain the target skews can be easily computed.

FIG. 49, FIG. 50 and FIG. 51 depict computation examples. In FIG. 49, (1) depicts computation formulae to determine delay setting values for each signal when signal A is the latest. On the right side of (1) are depicted signal waveforms based on measured skew results, and signal waveforms based on target skews. In this case the set delay value for signal A is zero. For signal B, the delay amount equal to the number of "0"s (delay amount) of the AB measured skew, added to the number of "0"s of the AB target skew, is used as the set delay value. For signal C, the delay amount equal to the number of "0"s (delay amount) of the AC measured skew, added to the number of "0"s of the AC target skew, is used as the set delay value. For signal D, the delay amount equal to the number of "0"s (delay amount) of the AD measured skew, added to the number of "0"s of the AD target skew, is used as the set delay value.

In FIG. 50, (2) is an example of computation of delay setting values when signal B is the latest. Signal B has a set delay value of zero. And, the delay values to be set for the remaining signals A, C and D can be determined from the formulae in the figure.

First for signal A, the delay amount obtained by adding the number of "0"s of the AB target skew to the number of "0"s of the AB measured skew is used as the set delay value. For signal C, depending on the skew relation between signals A and C, two computation formulae must be used selectively. When signal A is later than signal C, the number of "0"s in the AB measured skew is added to the number of "0"s in the AC measured skew, and to this is further added the number of "0"s in the BC target skew, to obtain the delay amount used as the set delay value. On the other hand when signal A is earlier than signal C, the number of "0"s in the AC measured skew is subtracted from the number of "0"s in the AB measured skew, and to this the number of "0"s in the BC target skew is added to obtain the delay amount used as the set delay value. Similarly for signal D, depending on the skew relation between signals A and D, two computation formulae must be used selectively. When signal A is later than signal D, the number of "0"s in the AB measured skew is added to the number of "0"s in the AD measured skew, and to this is further added the number of "0"s in the BD target skew to obtain the delay amount used as the set delay value. On the other hand when signal A is earlier than signal D, the number of "0"s in the AD measured skew is subtracted from the number of "0"s in the AB measured skew, and to this is added the number of "0"s in the BD target skew, to obtain the delay amount used as the set delay value.

In FIG. 51, in the case (3) in which C is the latest signal and in the case (4) in which D is the latest signal also, computation formulae similar to those of (2) in FIG. 50 can be used to determine delay values to be set.

Fourth Embodiment (2)

Figure 52:
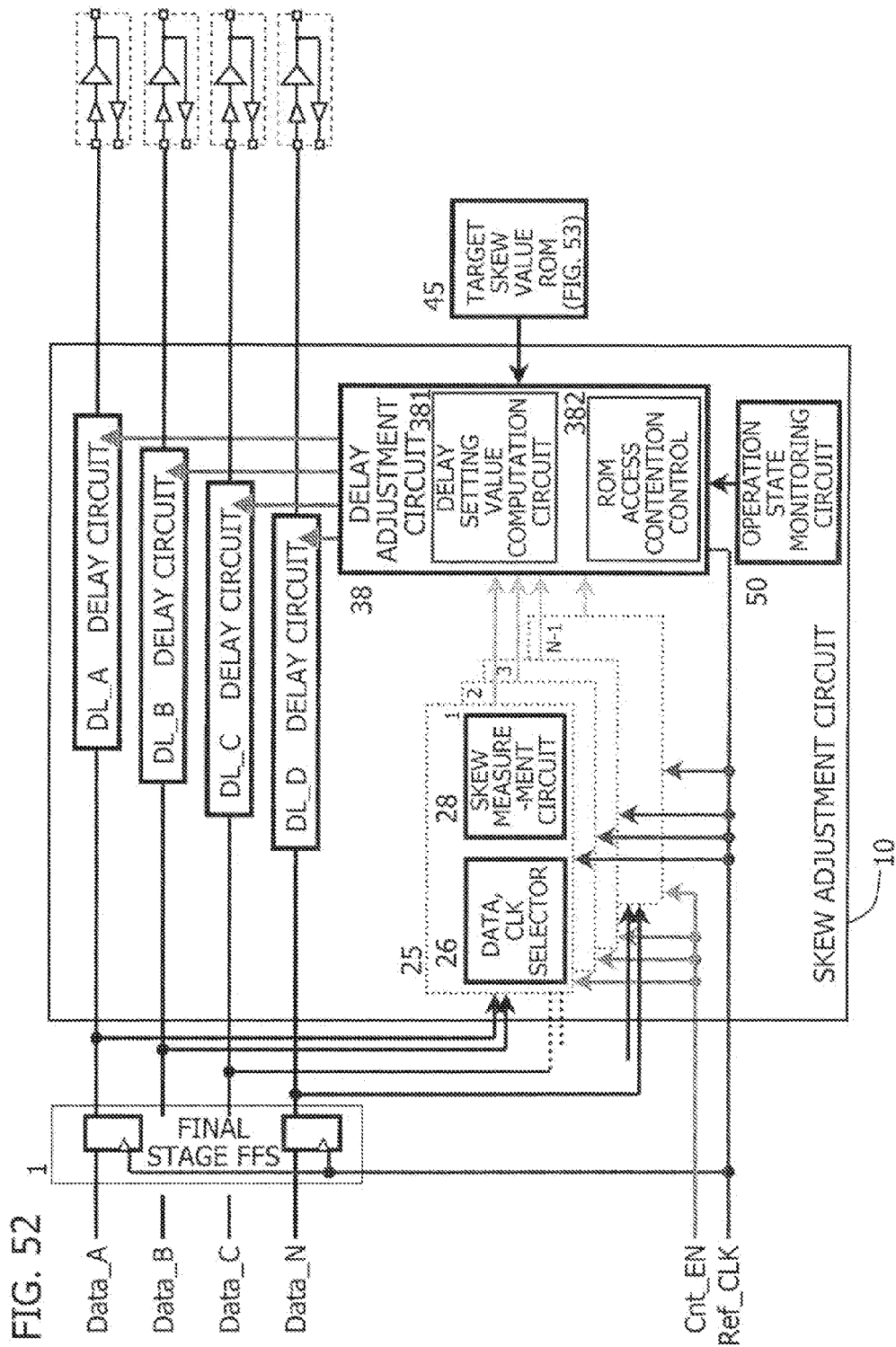
FIG. 52 depicts a first modified example of the skew adjustment circuit in the fourth embodiment.

FIG. 52 depicts a first modified example of the skew adjustment circuit in the fourth embodiment. Differences with the skew adjustment circuit 10 of FIG. 46 are the presence of an operation state monitoring circuit 50, and the fact that the target skew value ROM 45 stores target skew values corresponding to the operation speed detected by the operation state monitoring circuit 50, in addition to the signal group Gr for skew adjustment, the latest signal, and the signal combination. The delay circuits are the same as in FIG. 34, the selector 26 is the same as in FIG. 27, the skew measurement circuit 28 is the same as in FIG. 5, and the delay adjustment circuit 38 is the same as in FIG. 46, FIG. 48, and FIG. 49.

FIG. 53 depicts a specific example of delay amount ROM 45. This ROM 45 uses the operation state signals Fast, Typical, Slow in addition to the addresses of FIG. 47. Setting of target skews for operation states is similar to FIG. 38; the number of zeroes in the target skew is smallest for the Slow operation state, and the number of zeroes in the target skew is largest for the Fast operation state.

Fourth Embodiment (3)

Figure 54:
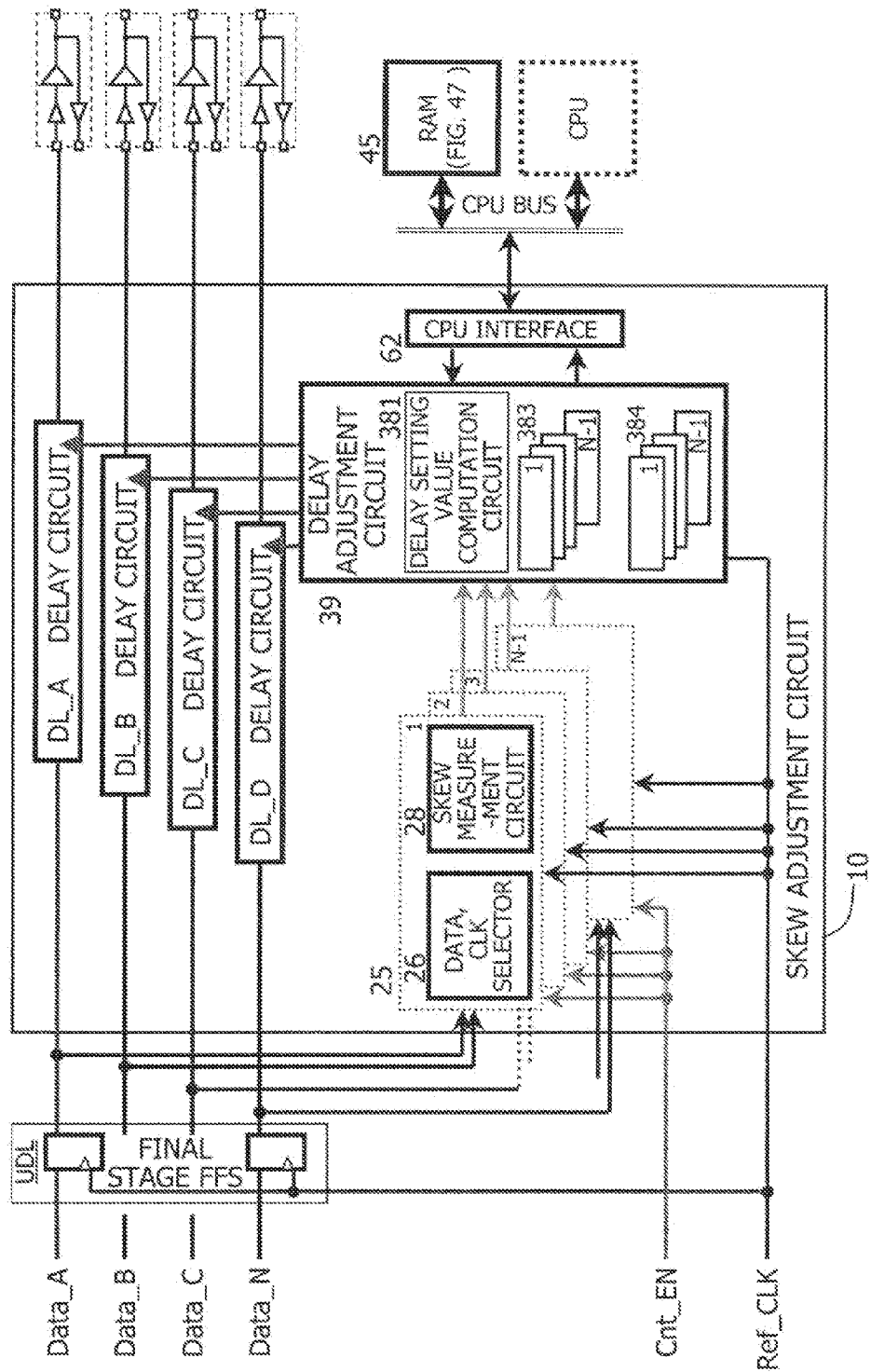
FIG. 54 depicts a second modified example of the skew adjustment circuit in the fourth embodiment.

FIG. 54 depicts a second modified example of the skew adjustment circuit in the fourth embodiment. In this skew adjustment circuit 10, data in RAM external or internal to the LSI is read by a CPU, and is stored via a CPU interface 62 in a target skew register 383 within the delay adjustment circuit 39. Further, skew and decision mode data measured by the skew measurement circuit 28 is stored in the measured skew register 384. These registers 383 and 384 are provided in the number N−1 of data combinations.

The N−1 decision modes and measured skews from the selector 26 and skew measurement circuit 28 are stored in the measured skew registers 384. Upon storage, the skew valid bit in the register is set to "1", as in FIG. 40. The CPU constantly monitors this skew valid bit, and when the skew valid bit goes to "1", reads out from RAM 45 the target skew data corresponding to the latest signal detected in computation 1 of the delay setting value computation circuit 381, stores this in the target skew register 383, and sets the delay switching on bit to "1" as in FIG. 40.

When this delay switching on bit is set to "1", the delay setting value computation circuit 381 computes set delay values for signals necessary to make the skew relations of current signals A, B, C, D, obtained from measured skews and decision modes, the skew relations of the signals A, B, C, D according to the target skews. And, the computed set delay values are set in the delay setting registers belonging to each of the delay circuits. When these settings are made, the skew valid bit is reset to "0".

Fourth Embodiment (4)

Figure 55:
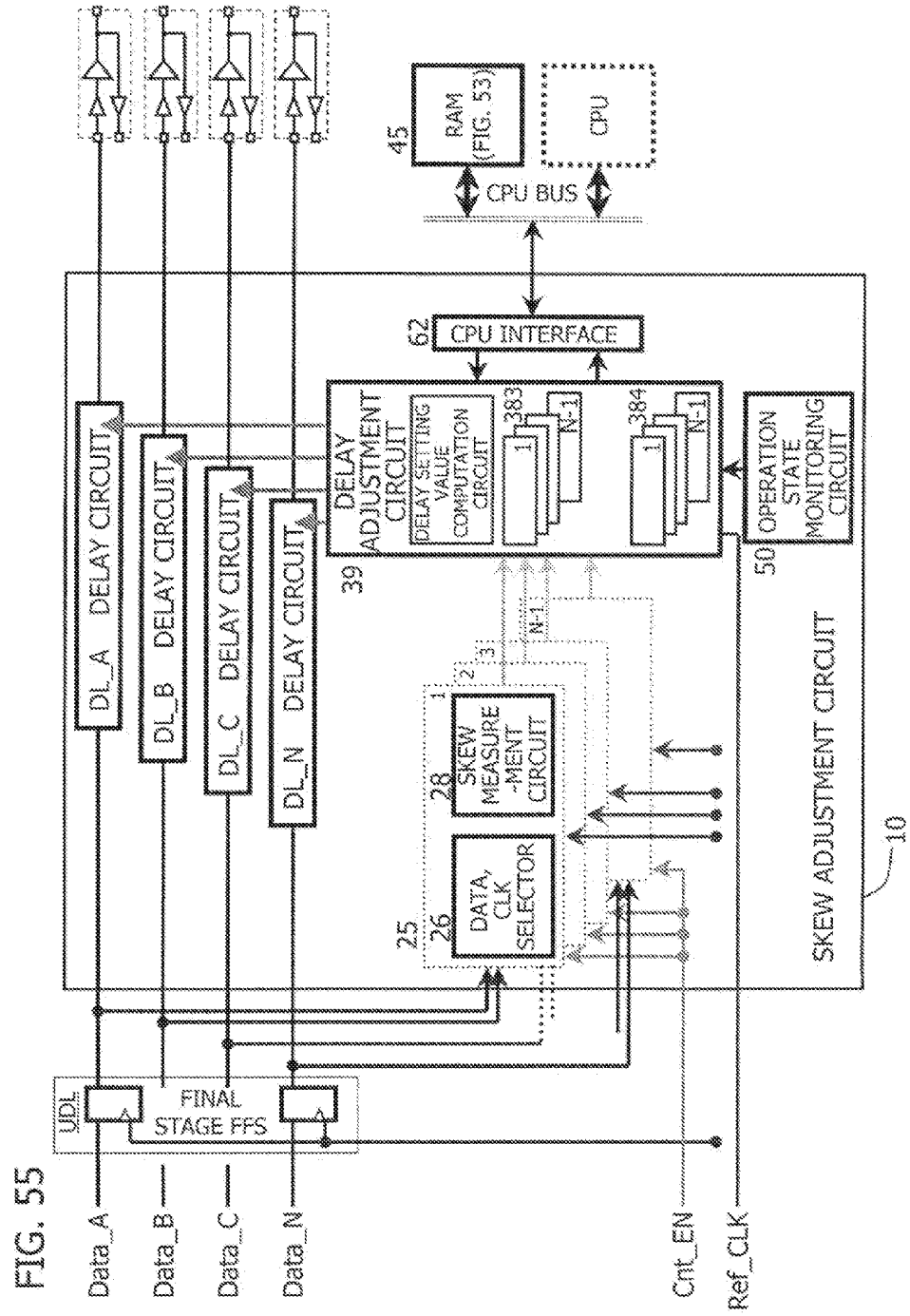
FIG. 55 depicts a third modified example of the skew adjustment circuit in the fourth embodiment.

FIG. 55 depicts a third modified example of the skew adjustment circuit in the fourth embodiment. This skew adjustment circuit 10 differs from that of FIG. 54 in having an operation state monitoring circuit 50, and in that accompanying this, target skews are stored in RAM 45 corresponding to operation states. Otherwise the configuration and operation are the same as the second modified example of FIG. 54.

In the above, by means of the fourth embodiment, for the signals of N signal lines for which skew is to be adjusted, the skews of N−1 combinations are measured, delay mounts to be inserted in each signal line so as to obtain the target skews in memory are determined by computation, and target skews for signal changes in N signal lines can be generated. By this means, simultaneous switching noise which occurs during simultaneous switching of output buffers is reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiment(s) of the present invention, has(have) been described in detail, it should be understood that the various changes, substitutions, and alterations could be made hereto without departing from the spirit and scope of the invention.

What is claimed is:

1. An integrated circuit device, comprising:
   a plurality of signal lines configured to transmit a plurality of signals respectively;
   a plurality of buffer circuits provided corresponding to the plurality of signal lines respectively and configured to receive the plurality of signals transmitted by the plurality of signal lines respectively;
   a plurality of delay circuits provided in respective stages preceding the plurality of buffer circuits and configured to delay the plurality of signals, respectively;
   a monitoring circuit configured to detect a number of signal changes, the number of signal changes corresponding to a number of the signal lines in which changes of the signals occur during a monitoring period; and
   a delay adjustment circuit configured to decide a first plural types of delay amounts as the delay amounts for the plurality of delay circuits when the number of signal changes detected by the monitoring circuit is a first plural number, and to decide a second plural types of delay amounts, where the second plural types is greater than the first plural types, as the delay amounts for the plurality of delay circuits when the number of signal changes is a second plural number greater than the first plural number, and to set the delay amounts in the plurality of delay circuits, respectively.

2. The integrated circuit device according to claim 1, wherein the monitoring circuit comprises a plurality of signal change detection circuits which detect signal changes in the plurality of signal lines respectively, and a counter which counts signal changes of the plurality of signal change detection circuits and outputs the number of signal changes.

3. The integrated circuit device according to claim 1, wherein the monitoring circuit periodically repeats detection of the number of signal changes in the monitoring period, and when the number of signal changes detected by the monitoring circuit changes between different periods, the delay adjustment circuit newly decides the delay amounts and sets the delay amounts in the plurality of delay circuits.

4. The integrated circuit device according to claim 1, wherein the monitoring circuit periodically repeats detection of the number of signal changes in the monitoring period, and the delay adjustment circuit, in response to detection of the number of signal changes by the monitoring circuit, newly decides the delay amounts and sets the delay amounts in the plurality of delay circuits.

5. The integrated circuit device according to claim 1, further comprising delay amount memory which stores delay amounts according to the number of signal changes, wherein the delay adjustment circuit references the delay amount memory to decide the delay amounts.

6. The integrated circuit device according to claim 5, wherein the delay amount memory is rewritable memory, and the delay amounts are rewritten.

7. The integrated circuit device according to claim 5, wherein the delay amounts in the delay amount memory are delay amounts conforming to specifications for setup time of another integrated circuit device to which outputs of a plurality of buffer circuits of the integrated circuit device are input.

8. The integrated circuit device according to claim 1, further comprising an operation state monitoring circuit which monitors a gate operation state in the integrated circuit device, wherein the delay adjustment circuit decides the delay amounts according to an operation state detected by the operation state monitoring circuit.

9. The integrated circuit device according to claim 1, wherein a control enable signal which controls operation enable and operation disable of the monitoring circuit and the delay adjustment circuit is generated, wherein the starting and stopping of operation of the monitoring circuit and the delay adjustment circuit are controlled according to the control enable signal.

10. An integrated circuit device, comprising:
a plurality of signal lines configured to transmit a plurality of signals respectively;
a plurality of buffer circuits provided corresponding to the plurality of signal lines respectively and configured to receive the plurality of signals transmitted by the plurality of signal lines respectively;
a plurality of delay circuits provided in respective stages preceding the plurality of buffer circuits and configured to delay the plurality of signals, respectively;
a monitoring circuit configured to detect a number of first signal changes from a first level to a second level during a monitoring period in the plurality of signal lines, and a number of second signal changes from the second level to the first level during the monitoring period in the plurality of signal lines, the number of signal changes corresponding to a number of the signal lines in which changes of the signals occur during a monitoring period; and
a delay adjustment circuit configured to decide delay amounts for the plurality of delay circuits on the bases of the greater number of signal changes among the number of first signal changes and the number of second signal changes, and to set the delay amounts in the plurality of delay circuits, respectively.

11. The integrated circuit device according to claim 6, wherein the delay adjustment circuit decides the delay amounts also based on changed data for the greater number of signal change among the number of first signal changes and the number of second signal changes, in addition to the greater number of signal changes.

12. The integrated circuit device according to claim 6, wherein the delay adjustment circuit decides a first plural types of delay amounts as the delay amounts for the plurality of delay circuits when the greater number of signal changes is a first plural number, and decides a second plural types of delay amounts, where the second plural types is greater than the first plural types, as the delay amounts for the plurality of delay circuits when the greater number of signal changes is a second plural number greater than the first plural number.

13. The integrated circuit device according to claim 6, wherein the monitoring circuit periodically repeats detection of the first and second numbers of signal changes in the monitoring period, and when the greater number of signal changes detected by the monitoring circuit changes between different periods, the delay adjustment circuit newly decides the delay amounts and sets the delay amounts in the plurality of delay circuits.

14. The integrated circuit device according to claim 6, wherein the monitoring circuit periodically repeats detection of the first and second numbers of signal changes in the monitoring period, and the delay adjustment circuit, in response to detection of the greater number of signal changes by the monitoring circuit, newly decides the delay amounts and sets the delay amounts in the plurality of delay circuits.

15. The integrated circuit device according to claim 6, further comprising delay amount memory which stores delay amounts according to the numbers of the first and second signal changes, wherein the delay adjustment circuit references the delay amount memory to decide the delay amounts.

16. A skew adjustment method in a plurality of signal lines which are provided in an integrated circuit device and configured to transmit signals to a plurality of buffer circuits provided corresponding to the plurality of signal lines respectively, the skew adjustment method comprising:
detecting a number of signal changes, the number of signal changes corresponding to a number of signal lines in which changes of the signals occur during a monitoring period among the plurality of signal lines; and
deciding a first plural types of delay amounts as delay amounts for a plurality of delay circuits provided in respective stages preceding the plurality of buffer circuits and configured to delay the plurality of signals when the number of signal changes detected by the monitoring circuit is a first plural number, and deciding a second plural types of delay amounts, where the second plural types is greater than the first plural types, as the delay amounts for the plurality of delay circuits when the number of signal changes is a second plural number greater than the first plural number, and setting the decided delay amounts in the plurality of delay circuits, respectively.

17. An integrated circuit device, comprising:
first and second signal lines configured to transmit first and second signals respectively;
first and second buffer circuits provided corresponding to the first and second signal lines respectively and configured to receive the first and second signals transmitted by the first and second signal lines respectively;
first and second delay circuits provided in respective stages preceding the first and second buffer circuits and configured to delay the first and second signals, respectively;
a skew measurement circuit configured to measure a skew between the first and second signals input to the first and second delay circuits respectively; and
a delay adjustment circuit configured to set delay amounts in the first and second delay circuits respectively, the delay amounts being a difference between a target skew between the first and second signals for reducing a simultaneous switching noise, and the skew measured by the skew measurement circuit, and the delay amounts being within delay amount for satisfying a setup time specification of circuits which receive outputs of the first and second output buffers, respectively.

18. The integrated circuit device according to claim 17, further comprising a memory which stores a target skew between the first and second signals, wherein the delay adjustment circuit references the memory to read out the target skew, and decides, as the delay amount for the first or second delay circuit, a difference between the measured skew and the target skew.

19. The integrated circuit device according to claim 17, wherein the delay adjustment circuit references a memory which stores a set delay amount for generating a target skew between the first and second signals corresponding to the measured skew and data as to which of the first and second signals is earlier, and sets the set delay amount read out from the memory in the first and second delay circuits.

20. The integrated circuit device according to claim 19, wherein the memory is rewritable, and the target skew or set delay amount is rewritten.

21. The integrated circuit device according to claim 19, wherein the skew measurement circuit has a plurality of latch circuits which take as data input one of the first and second signals, and a clock supply circuit which inputs the other of the first and second signals to the plurality of latch circuits as a clock while delaying the other of the first and second signals, and
the skew adjustment circuit further comprises a selector which selects the first and second signals as the data and clock and outputs the signals to the skew measurement circuit.

22. The integrated circuit device according to claim 21, wherein, when the selector selects the first and second signals as the data and clock respectively and outputs the first and second signals to the skew measurement circuit, if the skew measurement circuit detects that the data input is earlier than the clock input, the selector selects the first and second signals as the clock and data respectively and outputs the first and second signals to the skew measurement circuit for an additional skew measurement.

23. The integrated circuit device according to claim 17, further comprising an operation state monitoring circuit which monitors a gate operation state in the integrated circuit device, wherein the delay adjustment circuit decides the delay amounts according to the operation state detected by the operation state monitoring circuit.

24. The integrated circuit device according to claim 17, comprising a control enable signal which controls operation enable and operation disable of the monitoring circuit and the delay adjustment circuit, wherein the starting and stopping of operation of the monitoring circuit and the delay adjustment circuit are controlled according to the control enable signal.

25. An integrated circuit device, comprising:
first to Nth signal lines configured to transmit first to Nth signals respectively;
first to Nth buffer circuits provided corresponding to the first to Nth signal lines respectively and configured to receive the first to Nth signals transmitted by the first to Nth signal lines respectively;
first to Nth delay circuits provided in respective stages preceding the first to Nth buffer circuits and configured to delay the first to Nth signals, respectively;
a skew measurement circuit configured to measure skews from a skew between the first and second signals, being input to the first and second delay circuits respectively, to a skew between the first and Nth signals, being input to the first and Nth delay circuits respectively; and
a delay adjustment circuit configured to set delay amounts in the first to Nth delay circuits respectively, the delay amounts being a difference between target skews between the signals for reducing a simultaneous switching noise, and the skews measured by the skew measurement circuit, and the delay amounts being within delay amount for satisfying a setup time specification of circuits which receive outputs of the first to Nth output buffers, respectively.

26. The integrated circuit device according to claim 25, wherein the delay adjustment circuit detects a signal with a latest timing among the first to Nth signals from the measured skews, and decides delay amounts to be set in the first to Nth delay circuits to obtain a target skew for making the detected signal with the latest timing have an earliest timing.

27. The integrated circuit device according to claim 26, further comprising a memory which stores target skews, corresponding to the first to Nth signals, to make each of the first and Nth signals have the earliest timing, wherein the delay adjustment circuit references the memory to read out the target skew corresponding to the detected signal with the latest timing.

28. The integrated circuit device according to claim 27, wherein the memory is rewritable memory.

29. An integrated circuit device, comprising:
first and second signal lines configured to transmit first and second signals respectively;
first and second buffer circuits provided corresponding to the first and second lines respectively and configured to receive the first and second signals transmitted by the first and second signal lines respectively;
third and fourth buffer circuits, each of the third and fourth buffer circuits configured to receive a third signal;
third and fourth signal lines configured to transmit the third signal input to received by the third and fourth buffer circuits and having the same length as the first and second signal lines;
first and second delay circuits provided in respective stages preceding the first and second buffer circuits;
a skew measurement circuit configured to measure a skew between the third signal transmitted by the third signal line and the third signal transmitted by the fourth signal line; and
a delay adjustment circuit configured to decide delay amounts for the first and second delay circuits on the basis of the skew measured by the skew measurement circuit, and to set the decided delay amounts in the first and second delay circuits.

30. A skew adjustment method in first and second signal lines which are provided in an integrated circuit device and configured to transmit first and second signals to first and second buffer circuits provided corresponding to the first and second signal lines respectively, the skew adjustment method comprising:
measuring a skew between the first and second signals input to the first and second delay circuits respectively; and setting delay amounts in the first and second delay circuits respectively, the delay amounts being a difference between a target skew between the first and second signals for reducing a simultaneous switching noise, and the skew measured by the skew measurement circuit, and the delay amounts being within delay amount for satisfying a setup time specification of circuits which receive outputs of the first and second output buffers, respectively.

31. The skew adjustment method according to claim 30, wherein a difference between a target skew and the measured skew between the first and second signals is decided as the delay amount of the first or the second delay circuit.

32. A skew adjustment method in first to Nth signal lines which are provided in an integrated circuit device and configured to transmit first to Nth signals to first to Nth buffer circuits provided corresponding to the first to Nth signal lines respectively, the skew adjustment method comprising:

measuring skews from a skew between the first and second signals, being input to the first and second delay circuits respectively, to a skew between the first and Nth signals, being input to the first and Nth delay circuits respectively; and setting delay amounts in the first to Nth delay circuits respectively, the delay amounts being a difference between target skews between the signals for reducing a simultaneous switching noise, and the skews measured by the skew measurement circuit, and the delay amounts being within delay amount for satisfying a setup time specification of circuits which receive outputs of the first to Nth output buffers, respectively.

33. The skew adjustment method according to claim 32, wherein a signal with a latest timing among the first to Nth signals is detected from the measured skews, and delay amounts to be set in the first to Nth delay circuits are decided to obtain a target skew for making the detected signal with the latest timing have an earliest timing.

* * * * *